US009536828B2

(12) United States Patent
Uchida et al.

(10) Patent No.: US 9,536,828 B2
(45) Date of Patent: Jan. 3, 2017

(54) SEMICONDUCTOR DEVICE

(71) Applicant: Renesas Electronics Corporation, Kawasaki (JP)

(72) Inventors: Shinichi Uchida, Kawasaki (JP); Hirokazu Nagase, Kawasaki (JP); Takuo Funaya, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/651,643

(22) PCT Filed: Dec. 19, 2012

(86) PCT No.: PCT/JP2012/082932
§ 371 (c)(1),
(2) Date: Jun. 11, 2015

(87) PCT Pub. No.: WO2014/097425
PCT Pub. Date: Jun. 26, 2014

(65) Prior Publication Data
US 2015/0318245 A1    Nov. 5, 2015

(51) Int. Cl.
*H01L 23/66* (2006.01)
*H01L 23/522* (2006.01)
(Continued)

(52) U.S. Cl.
CPC ..... *H01L 23/5227* (2013.01); *H01L 23/49575* (2013.01); *H01L 23/528* (2013.01); *H01L 23/645* (2013.01); *H01L 23/66* (2013.01); *H01L 24/06* (2013.01); *H01L 24/49* (2013.01);
(Continued)

(58) Field of Classification Search
CPC ............ H01L 23/5227; H01L 23/528; H01L 23/49575; H01L 27/0688; H01L 21/0217; H01L 22/34; H01L 23/66; H01L 23/645; H01L 25/0655
See application file for complete search history.

(56) References Cited

U.S. PATENT DOCUMENTS 8,054,155 B2    11/2011   Raczkowski
2005/0184357 A1   8/2005   Chiba
(Continued)

FOREIGN PATENT DOCUMENTS

JP    H01-151211 A    6/1989
JP    H01-157507 A    6/1989
(Continued)

OTHER PUBLICATIONS

Japanese Office Action dated Oct. 6, 2015 with an English translation.
(Continued)

*Primary Examiner* — Fazli Erdem
(74) *Attorney, Agent, or Firm* — McGinn IP Law Group, PLLC

(57) ABSTRACT

On a semiconductor substrate, coils CL5 and CL6 and pads PD5, PD6, and PD7 are formed. The coil CL5 and the coil CL6 are electrically connected in series between the pad PD5 and the pad PD6, and the pad PD7 is electrically connected between the coil CL5 and the coil CL6. The coil magnetically coupled to the coil CL5 is formed just below the coil CL5, the coil magnetically coupled to the coil CL6 is formed just below the coil CL6, and they are connected in series. When a current is flowed in the coils connected in series formed just below the coils CL5 and CL6, directions of induction current flowing in the coils CL5 and CL6 are opposed to each other in the coils CL5 and CL6.

21 Claims, 39 Drawing Sheets

(51) Int. Cl.
*H01L 23/64* (2006.01)
*H01L 25/065* (2006.01)
*H01L 27/06* (2006.01)
*H01L 23/495* (2006.01)
*H01L 23/528* (2006.01)
*H01L 23/00* (2006.01)

(52) U.S. Cl.
CPC ....... *H01L25/0655* (2013.01); *H01L 27/0688* (2013.01); *H01L 24/45* (2013.01); *H01L 24/73* (2013.01); *H01L 2223/6611* (2013.01); *H01L 2224/04042* (2013.01); *H01L 2224/05554* (2013.01); *H01L 2224/32245* (2013.01); *H01L 2224/45144* (2013.01); *H01L 2224/45147* (2013.01); *H01L 2224/48091* (2013.01); *H01L 2224/48101* (2013.01); *H01L 2224/48106* (2013.01); *H01L 2224/48137* (2013.01); *H01L 2224/48247* (2013.01); *H01L 2224/48257* (2013.01); *H01L 2224/48464* (2013.01); *H01L 2224/48465* (2013.01); *H01L 2224/49113* (2013.01); *H01L 2224/49171* (2013.01); *H01L 2224/49175* (2013.01); *H01L 2224/73265* (2013.01); *H01L 2924/12041* (2013.01); *H01L 2924/1306* (2013.01); *H01L 2924/181* (2013.01); *H01L 2924/3011* (2013.01)

(56) References Cited

U.S. PATENT DOCUMENTS

| | | |
|---|---|---|
| 2007/0023862 A1 | 2/2007 | Takagi |
| 2007/0205748 A1 | 9/2007 | Abou |
| 2008/0012097 A1 | 1/2008 | Takahashi et al. |
| 2009/0227205 A1* | 9/2009 | Rofougaran ......... H04B 5/0025 455/41.1 |
| 2011/0032065 A1 | 2/2011 | Raczkowski |
| 2011/0040909 A1* | 2/2011 | Abdulla .................. G11C 5/02 710/71 |
| 2011/0090036 A1 | 4/2011 | Kuroda |
| 2012/0020419 A1 | 1/2012 | Kaeriyama |
| 2012/0062040 A1 | 3/2012 | Kaeriyama |
| 2014/0159220 A1* | 6/2014 | Willkofer ................ H01L 23/48 257/676 |

FOREIGN PATENT DOCUMENTS

| | | |
|---|---|---|
| JP | 2000-260939 A | 9/2000 |
| JP | 2005-005685 A | 1/2005 |
| JP | 2005-236119 A | 9/2005 |
| JP | 2007-059878 A | 3/2007 |
| JP | 2007-234896 A | 9/2007 |
| JP | 2008-021789 A | 1/2008 |
| JP | 2008-300851 A | 12/2008 |
| JP | 2009-277842 A | 11/2009 |
| JP | 2009-302268 A | 12/2009 |
| JP | 2010-232765 A | 10/2010 |
| JP | 2010-239068 A | 10/2010 |
| JP | 2011-040509 A | 2/2011 |
| WO | WO 2010/113383 A1 | 10/2010 |
| WO | WO 2010/140297 A1 | 12/2010 |

OTHER PUBLICATIONS

International Search Report (ISR) (PCT Form PCT/ISA/210), in PCT/JP2012/082932, dated Mar. 12, 2013.
Japanese Office Action dated Mar. 8, 2016 with an English translation.

* cited by examiner

SEMICONDUCTOR DEVICE

TECHNICAL FIELD

The present invention relates to a semiconductor device, and can be suitably used for, for example, a semiconductor device provided with a coil.

BACKGROUND ART

As a technique of transmitting an electric signal between two circuits different from each other in potential of an electric signal to be inputted, there is a technique using a photocoupler. The photocoupler has a light emitting element such as a light emitting diode and a light receiving element such as a phototransistor, and it converts an inputted electric signal to light by the light emitting element and restores this light to an electric signal by the light-receiving element, so that the electric signal is transmitted.

Further, a technique of transmitting an electric signal by magnetically coupling (induction-coupling) two inductors has been developed.

Japanese Patent Application Laid-Open Publication No. 2008-300851 (Patent Document 1) discloses a technique regarding a magnetic coupler element and a magnetic coupling type isolator.

PRIOR ART DOCUMENT

Patent Document

Patent Document 1: Japanese Patent Application Laid-Open Publication No. 2008-300851

SUMMARY OF THE INVENTION

Problems to be Solved by the Invention

As a technique of transmitting an electric signal between two circuits different from each other in potential of an electric signal to be inputted, there is a technique using a photocoupler. However, since the photocoupler has the light emitting element and the light receiving element, it is difficult to achieve size reduction. Further, there is a limit in adoption of the photocoupler due to such a fact that the electric signal cannot be followed when a frequency of an electric signal is high.

Meanwhile, in the semiconductor device in which an electric signal is transmitted by magnetically-coupled inductors, the inductors can be formed by using a miniaturization technique of a semiconductor device, and therefore, the device can be downsized, and electrical characteristics are also excellent. Therefore, it is desired to develop the semiconductor device.

Therefore, it is desired to improve the performance as high as possible even in a semiconductor device provided with such an inductor.

The above and other object and novel characteristics of the present invention will be apparent from the description of the present specification and the accompanying drawings.

Means for Solving the Problems

According to one embodiment, a semiconductor device has a first coil, a second coil, a third coil, a fourth coil, a first pad, a second pad, and a third pad formed on a semiconductor substrate. The first coil and the third coil are electrically connected in series between the first pad and the second pad, the third pad is electrically connected between the first coil and the third coil, and the second coil and the fourth coil are electrically connected in series. The first coil and the second coil are magnetically coupled to each other, the third coil and the fourth coil are magnetically coupled to each other, and the directions of the induction currents flowing in the first coil and the third coil are opposed to each other in the first coil and the third coil when a current is flowed in the second coil and the fourth coil connected in series.

Further, according to one embodiment, a semiconductor device includes a first semiconductor chip having a first coil, a second coil, a third coil, a fourth coil, a first pad, a second pad and a third pad, and a second semiconductor chip having a plurality of fourth pads. The first coil and the third coil are electrically connected in series between the first pad and the second pad, the third pad is electrically connected between the first coil and the third coil, and the second coil and the fourth coil are electrically connected in series. The first pad, the second pad, and the third pad of the first semiconductor chip are electrically connected to the plurality of fourth pads of the second semiconductor chip via conductive connection members, respectively. The first coil and the second coil are magnetically coupled to each other, the third coil and the fourth coil are magnetically coupled to each other, and the directions of the induction currents flowing in the first coil and the third coil are opposed to each other in the first coil and the third coil when a current is flowed in the second coil and the fourth coil connected in series.

Further, according to one embodiment, a semiconductor device has a first coil and a second coil formed on a semiconductor substrate, the first coil and the second coil is magnetically coupled to each other, and a first wiring is formed on a layer different from those of the first coil and the second coil so as to overlap with the first coil in a plan view. The first wiring has a slit at a position overlapping with the first coil in a plan view.

Effects of the Invention

According to one embodiment, performance of a semiconductor device can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case that the number is apparently limited to a specific number in principle. The number larger or smaller than the specified number is also applicable. Further, in the embodiments described below, it goes without saying that the components (including element steps) are not always indispensable unless otherwise stated or except the case that the components are apparently indispensable in principle. Similarly, in the embodiments described below, when the shape of the components, positional relation thereof, and others are mentioned, the substantially approximate and similar shapes and others are included therein unless otherwise stated or except the case that it is conceivable that they are apparently excluded in principle. The same goes for the numerical value and the range described above.

Hereinafter, embodiments of the present invention will be described in detail based on the accompanying drawings. Note that components having the same function are denoted by the same reference symbols throughout all the drawings for describing the embodiment, and the repetitive description thereof will be omitted. Also, in the embodiments described below, the description of the same or similar parts is not repeated in principle unless otherwise required.

Also, in some drawings used in the embodiments, hatching is omitted even in a cross-sectional view so as to make the drawings easy to see. Further, hatching is used even in a plan view so as to make the drawings easy to see.

First Embodiment

Regarding Circuit Configuration

Figure 1:
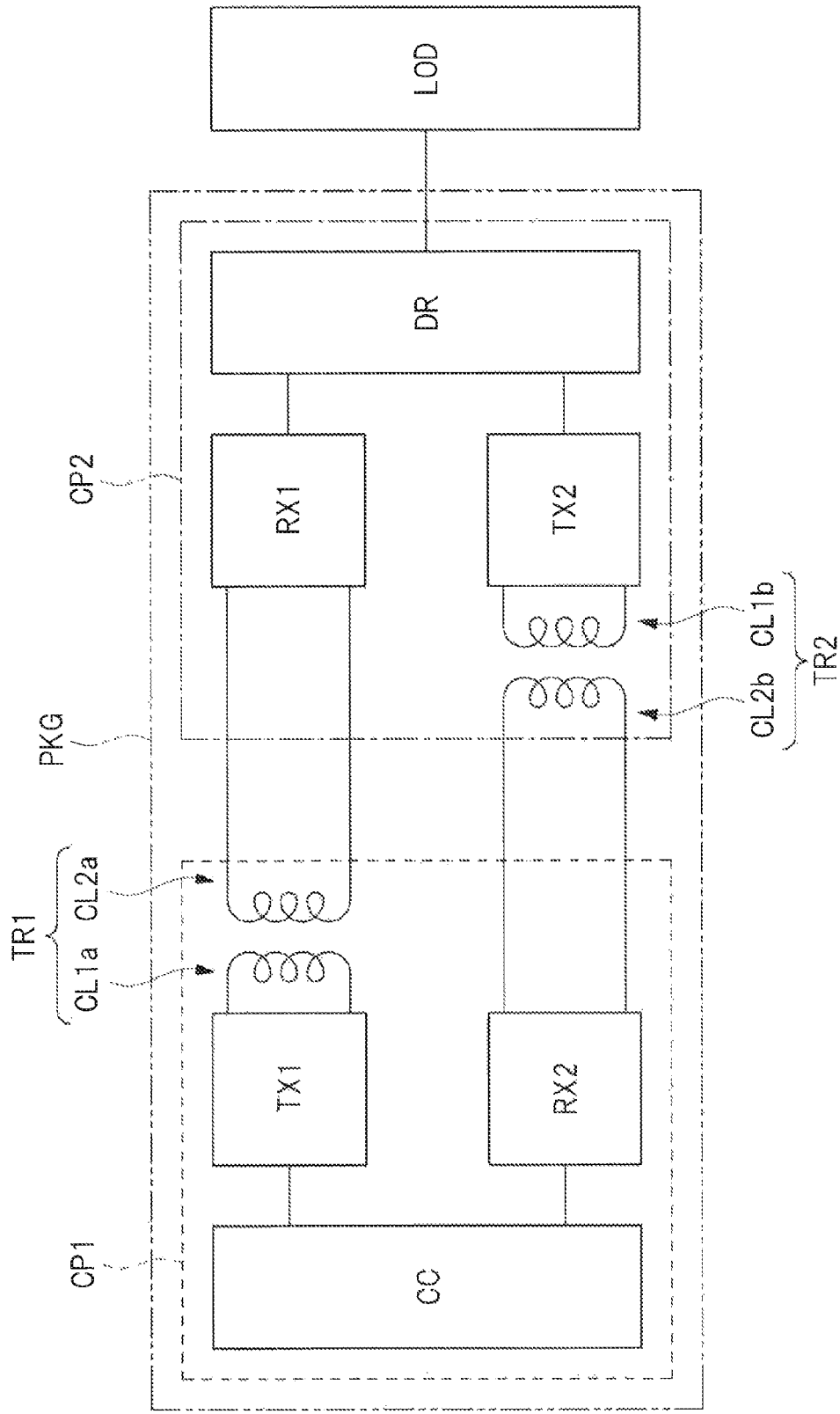
FIG. 1 is a circuit diagram showing an example of an electronic device using a semiconductor device of a first embodiment.

FIG. 1 is a circuit diagram showing one example of an electronic device (a semiconductor device) using a semiconductor device (a semiconductor chip) of an embodiment. In FIG. 1, note that a section surrounded by a dotted line is formed within a semiconductor chip CP1, a section surrounded by a dotted chain line is formed within a semiconductor chip CP2, and a section surrounded by a two-dot chain line is formed within a semiconductor package PKG.

The electronic device shown in FIG. 1 is provided with the semiconductor package PKG in which the semiconductor chips CP1 and CP2 are embedded. A transmission circuit TX1, a reception circuit RX2, and a control circuit CC are formed within the semiconductor chip CP1, and a reception circuit RX1, a transmission circuit TX2 and a drive circuit DR are formed within the semiconductor chip CP2.

The transmission circuit TX1 and the reception circuit RX1 are circuits for transmitting a control signal from the control circuit CC to the drive circuit DR. Further, the transmission circuit TX2 and the reception circuit RX2 are circuits for transmitting a signal from the drive circuit DR to the control circuit CC. The control circuit CC controls or drives the drive circuit DR and the drive circuit DR drives a load LOD. The semiconductor chips CP1 and CP2 are embedded in the semiconductor package PKG, and the load LOD is provided outside the semiconductor package PKG.

A transformer (a transformer, a converter, a magnetic coupling element, an electromagnetic coupling element) TR1 composed of coils (inductors) CL1a and CL2a magnetically coupled (inductively coupled) is interposed between the transmission circuit TX1 and the reception circuit RX1, so that a signal can be transmitted from the transmission circuit TX1 to the reception circuit RX1 via this transformer TR1 (that is, via the coils CL1a and CL2a magnetically coupled). In this manner, the reception circuit RX1 within the semiconductor chip CP2 can receive a signal transmitted by the transmission circuit TX1 within the semiconductor chip CP1. Therefore, the control circuit CC can transmit a signal (a control signal) to the drive circuit DR via the transmission circuit TX1, the transformer TR1 and the reception circuit RX1. The transformer TR1 (the coils CL1a and CL2a) is formed within the semiconductor chip CP1. Each of the coil CL1a and the coil CL2a can also be regarded as an inductor. Further, the transformer TR1 can also be regarded as a magnetic coupling element.

Also, a transformer (a transformer, a converter, a magnetic coupling element, an electromagnetic coupling element) TR2 composed of coils (inductors) CL1b and CL2b magnetically coupled (inductively coupled) is interposed between the transmission circuit TX2 and the reception circuit RX2, so that a signal can be transmitted from the transmission circuit TX2 to the reception circuit RX2 via this transformer TR2 (that is, via the coils CL1b and CL2b magnetically coupled). In this manner, the reception circuit RX2 within the semiconductor chip CP1 can receive a signal transmitted by the transmission circuit TX2 within the semiconductor chip CP2. Therefore, the drive circuit DR can transmit a signal to the control circuit CC via the transmission circuit TX2, the transformer TR2 and the reception circuit RX2. The transformer TR2 (the coils CL1b and CL2b) is formed within the semiconductor chip CP2. Each of the coil CL1b and the coil CL2b can also be regarded as an inductor. Further, the transformer TR2 can also be regarded as a magnetic coupling element.

The transformer TR1 is formed of the coils CL1a and CL2a formed within the semiconductor chip CP1. However, the coil CL1a and the coil CL2a are not conductively connected but magnetically coupled to each other via a conductor. Therefore, when a current flows in the coil CL1a, an induced electromotive force is generated in the coil CL2a in accordance with change of the current so that an induction current flows. The coil CL1a is a primary coil, while the coil CL2a is a secondary coil. By utilizing this and transmitting a signal from the transmission circuit TX1 to the coil CL1a (the primary coil) of the transformer TR1 to cause a current to flow and detecting (receiving) the induction current (or induced electromotive force) generated in the coil CL2a (the secondary coil) of the transformer TR1 in accordance therewith by the reception circuit RX1, a signal corresponding to the signal transmitted by the transmission circuit TX1 can be received by the reception circuit RX1.

Further, the transformer TR2 is formed of the coils CL1b and CL2b formed within the semiconductor chip CP2. However, the coil CL1b and the coil CL2b are not conductively connected but magnetically coupled to each other via a conductor. Therefore, when a current flows in the coil CL1b, an induced electromotive force is generated in the coil CL2b in accordance with change of the current so that an induction current flows. The coil CL1b is a primary coil, while the coil CL2b is a secondary coil. By utilizing this and transmitting a signal from the transmission circuit TX2 to the coil CL1b (the primary coil) of the transformer TR2 to cause a current to flow and detecting (receiving) the induction current (or induced electromotive force) generated in the coil CL2b (the secondary coil) of the transformer TR2 in accordance therewith by the reception circuit RX2, a signal corresponding to the signal transmitted by the transmission circuit TX2 can be received by the reception circuit RX2.

The signal is transmitted and received between the semiconductor chip CP1 and the semiconductor chip CP2 through a route from the control circuit CC to the drive circuit DR through the transmission circuit TX1, the transformer TR1 and the reception circuit RX1 and a route from the drive circuit DR to the control circuit CC through the transmission circuit TX2, the transformer TR2 and the reception circuit RX2. That is, the signal can be transmitted and received between the semiconductor chip CP1 and the semiconductor chip CP2 by reception of a signal transmitted by the transmission circuit TX1 which is received by the reception circuit RX1 and reception of a signal transmitted by the transmission circuit TX2 which is received by the reception circuit RX2. As described above, the transformer TR1 (namely, the coils CL1a and CL2a magnetically coupled) is interposed for transmission of a signal from the transmission circuit TX1 to the reception circuit RX1, while the transformer TR2 (namely the coils CL1b and CL2b magnetically coupled) is interposed for transmission of a signal from the transmission circuit TX2 to the reception circuit RX2. The drive circuit DR can drive the load LOD in accordance with a signal transmitted from the semiconductor chip CP1 to the semiconductor chip CP2 (namely, a signal transmitted from the transmission circuit TX1 to the reception circuit RX1 through the transformer TR1). As the load LOD, while there are various loads in accordance with applications, for example, a motor or others can be exemplified.

The semiconductor chip CP1 and the semiconductor chip CP2 are different from each other in a voltage level (reference potential) from each other. For example, the semiconductor chip CP1 is connected to a low-voltage region having a circuit operated or driven at a low voltage (for example, several volts to several tens volts) through a wire BW, a lead LD and others described later. Further, the semiconductor chip CP2 is connected to a high-voltage region having a circuit (for example, the load LOD, a switch for the load LOD, or others) operated or driven at a higher voltage (for example, 100 V or higher) than the low voltage via a wire BW, a lead LD and others described later. However, since the signal between the semiconductor chips CP1 and CP2 is transmitted so as to interpose the transformers TR1 and TR2, a signal can be transmitted between different voltage circuits.

Note that FIG. 1 shows a case that the control circuit CC is embedded in the semiconductor chip CP1. However, as another aspect, the control circuit CC can be embedded in a semiconductor chip other than the semiconductor chips CP1 and CP2. Further, FIG. 1 shows a case that the drive circuit DR is embedded in the semiconductor chip CP2. However, as another aspect, the drive circuit DR can be embedded in a semiconductor chip other than the semiconductor chips CP1 and CP2.

<Regarding Signal Transmission Example>

Figure 2:
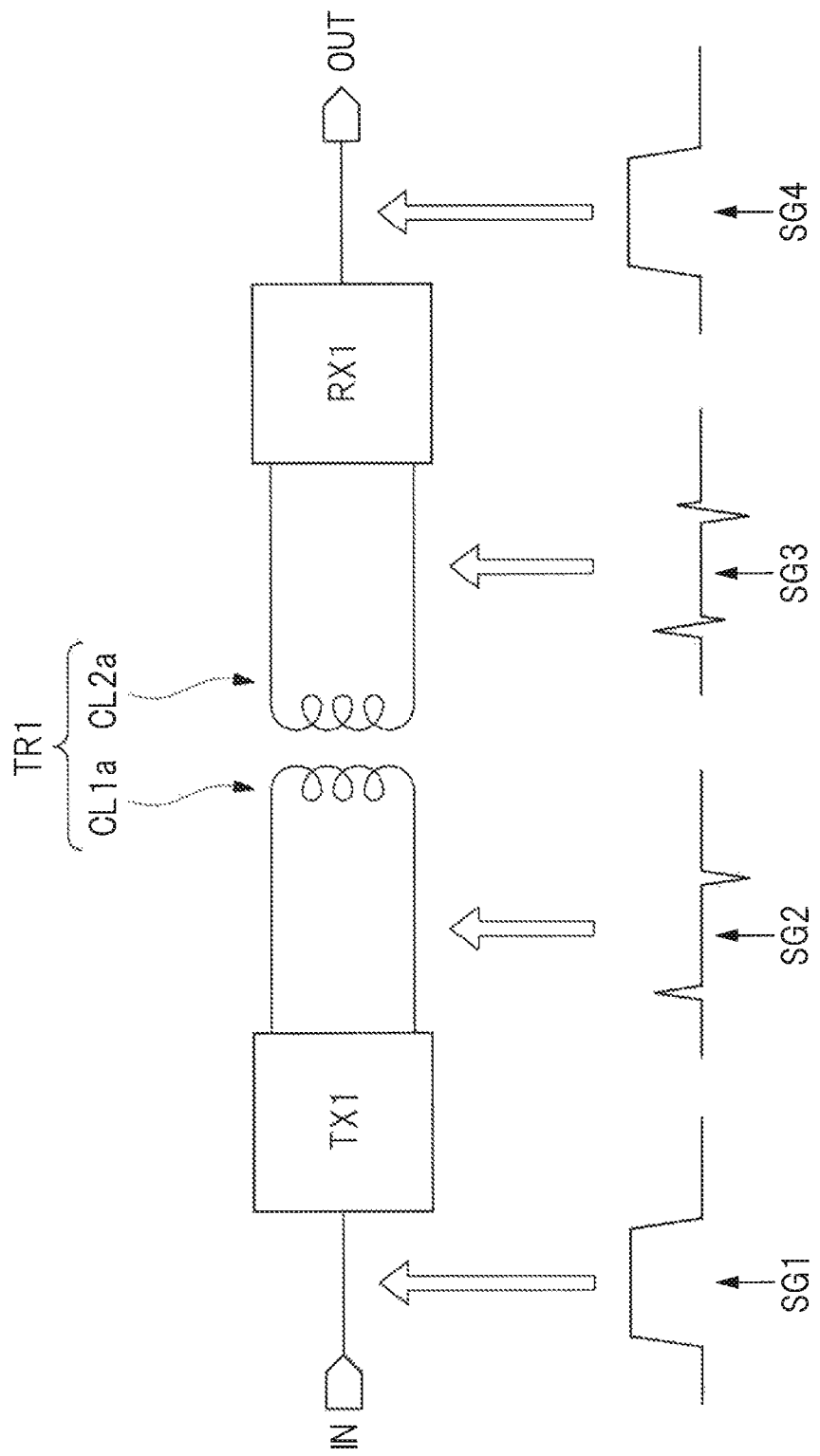
FIG. 2 is an explanatory diagram showing a signal transmission example.

FIG. 2 is an explanatory diagram showing a transmission example of a signal.

The transmission circuit TX1 modulates a square-waveform signal SG1 inputted into the transmission circuit TX1 to a differential-waveform signal SG2 to send the signal to the coil CL1a (a primary coil) of the transformer TR1. When a current based on the differential-waveform signal SG2 flows in the coil CL1a (the primary coil) of the transformer TR1, a signal SG3 corresponding thereto is flowed in the coil CL2a (a secondary coil) of the transformer TR1 by an induced electromotive force. By amplifying this signal SG3 in the reception circuit RX2 and further modulating the signal into a square waveform, a square-waveform signal SG4 is outputted from the reception circuit RX2. In this manner, the signal SG4 corresponding to the signal SG1 inputted into the transmission circuit TX1 can be outputted from the reception circuit RX2. Thus, a signal is transmitted from the transmission circuit TX1 to the reception circuit RX1. Transmission of the signal from the transmission circuit TX2 to the reception circuit RX2 can be performed similarly.

Further, FIG. 2 shows one example of transmission of a signal from the transmission circuit to the reception circuit. However, this invention is not limited to this and can be variously changed as long as this is a method of transmitting a signal through magnetically-coupled coils (a primary coil and a secondary coil).

<Regarding Structure of Semiconductor Chip>

Figure 3:
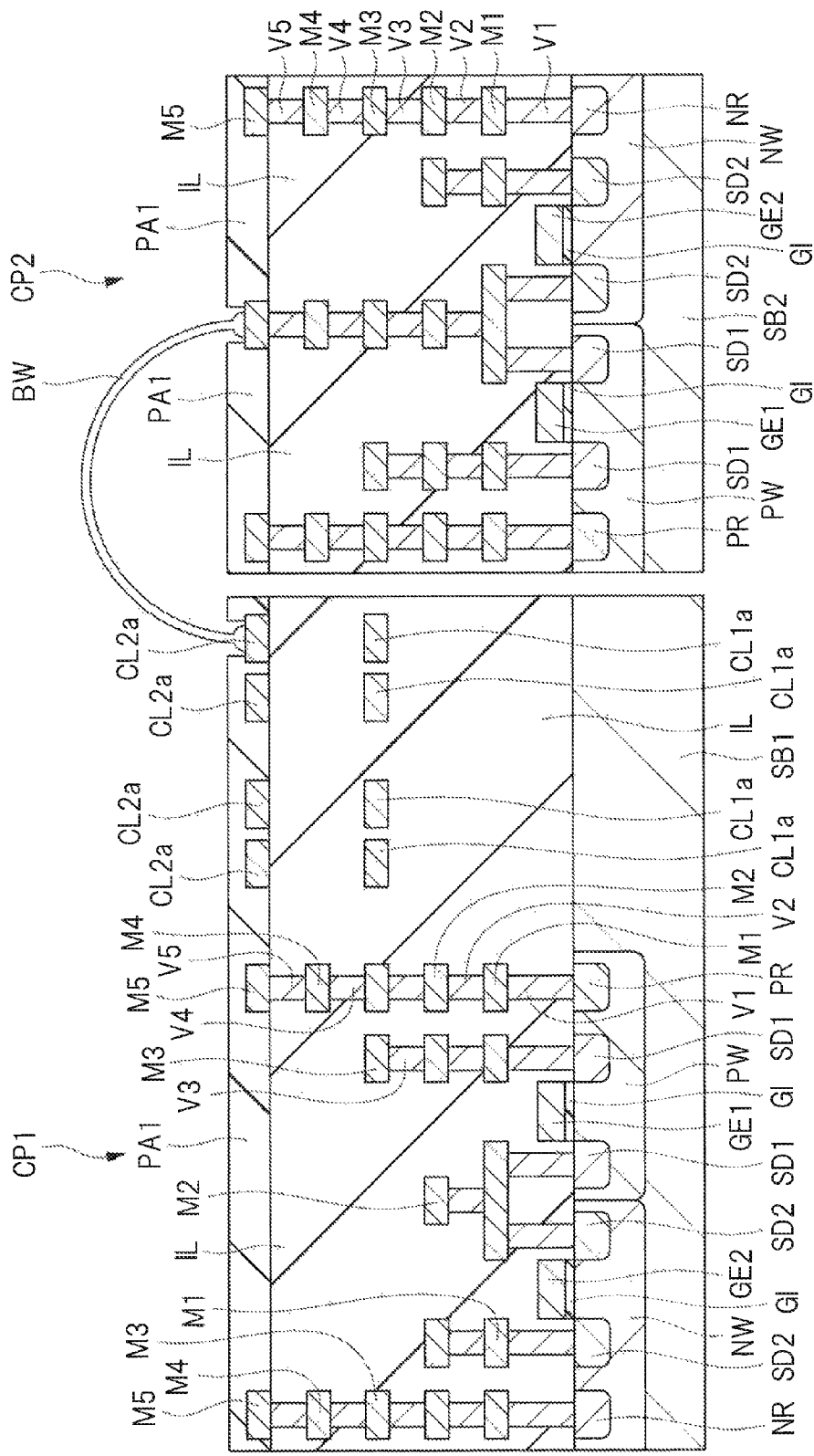
FIG. 3 is a cross-sectional view schematically showing a cross-sectional structure of a semiconductor chip of the first embodiment.

FIG. 3 is a cross-sectional view schematically showing a cross-sectional structure of the semiconductor chips CP1 and CP2 of this embodiment.

With reference to FIG. 3, the structure of the semiconductor chip CP1 will be described. Note that the semiconductor chip can also be regarded as a semiconductor device.

As shown in FIG. 3, a semiconductor element such as MISFET (Metal Insulator Semiconductor Field Effect Transistor) is formed on a semiconductor substrate SB1 composed of a single crystal silicon configuring the semiconductor chip CP1, or others. Note that an SOI (Silicon On Insulator) substrate or others can be used as the semiconductor substrate SB1 as another aspect.

For example, a p-type well PW and a n-type well NW are formed on the semiconductor substrate SB1, a gate electrode GE1 for an n-channel type MISFET is formed on the p-type well PW through a gate insulation film GI, and a gate electrode GE2 for a p-channel type MISFET is formed on the n-type well NW through a gate insulation film GI. The gate insulation film GI is composed of, for example, a silicon oxide film or others, and each of the gate electrodes GE1 and GE2 is composed of, for example, a polycrystalline silicon film (a doped polysilicon film) to which an impurity or others is introduced.

An n-type semiconductor region SD1 of the n-channel type MISFET for a source/drain is formed within the p-type well PW, and a p-type semiconductor region SD2 of the p-channel type MISFET for a source/drain is formed within the n-type well NW. The n-channel type MISFET is formed of the gate electrode GE1, the gate insulation film GI positioned below the gate electrode GE1, and the n-type semiconductor regions SD1 (the source/drain region) positioned on both sides of the gate electrode GE1. Further, the p-channel type MISFET is formed of the gate electrode GE2, the gate insulation film GI positioned below the gate electrode GE2, and the p-type semiconductor regions SD2 (the source/drain region) positioned on both sides of the gate electrode GE2.

Further, a p-type semiconductor region PR with an impurity concentration higher than that of the p-type well PW is formed on a portion of an upper layer portion (a surface layer portion) of the p-type well PW so as to contact with the p-type well PW. A predetermined potential (for example, a ground potential or a power source potential) can be supplied to the p-type well PW from wirings (M1 to M5) or a plug V1 through the p-type semiconductor region PR. Further, an n-type semiconductor region NR with an impurity concentration higher than that of the n-type well NW is formed on a portion of an upper layer portion (a surface layer portion) of the n-type well NW so as to contact with the n-type well NW. A predetermined potential (for example, the ground potential or the power source potential) can be supplied to the n-type well NW from the wirings (M1 to M5) or the plug V1 through the n-type semiconductor region NR.

Further, a resistor element (not shown) or a capacitor element (not shown) may be further formed on the semiconductor substrate SB1 if necessary.

A multi-layered wiring structure composed of a plurality of interlayer insulation films and a plurality of wiring layers is formed on the semiconductor substrate SB1.

Specifically, the plurality of interlayer insulation films are formed on the semiconductor substrate SB1, and the plug V1, the wirings M1, M2, M3, M4 and M5, and via portions V2, V3, V4 and V5 are formed in the plurality of interlayer insulation layers, respectively.

Note that FIG. 3 shows that the plurality of interlayer insulation films formed on the semiconductor substrate SB1 are not separated from each other for each layer but collectively as an interlayer insulation film IL for simplification of the drawing.

The wiring M1 is a wiring of a first wiring layer (the lowermost wiring layer). The wiring M2 is a wiring of a second wiring layer which is a one-level higher wiring layer than the first wiring layer. The wiring M3 is a wiring of a third wiring layer which is a one-level higher wiring layer than the second wiring layer. The wiring M4 is a wiring of a fourth wiring layer which is a one-level higher wiring layer than the third wiring layer. The wiring M5 is a wiring of a fifth wiring layer which is a one-level higher wiring layer than the fourth wiring layer.

The plug V1 is made of a conductor, it is formed in a layer lower than the wiring M1, and an upper surface of the plug V1 contacts with a lower surface of the wiring M1, so that the plug V1 is electrically connected to the wiring M1. Further, a bottom portion of the plug V1 is connected to various semiconductor regions (for example, the n-type semiconductor region SD1, the p-type semiconductor region SD2, the n-type semiconductor region NR, the p-type semiconductor region PR, and others) formed in the semiconductor substrate SB1, the gate electrodes GE1 and GE2, and others. In this manner, the wiring M1 is electrically connected to the various semiconductor regions, the gate electrodes GE1 and GE2, and others formed in the semiconductor substrate SB1.

The via portion V2 is composed of a conductor, and it is formed between the wiring M2 and the wiring M1 to connect the wiring M2 and the wiring M1 to each other. The via portion V2 can also be formed integrally with the wiring M2. Further, the via portion V3 is composed of a conductor, and it is formed between the wiring M3 and the wiring M2 to connect the wiring M3 and wiring M2 to each other. The via portion V3 can also be formed integrally with the wiring M3. Further, the via portion V4 is composed of a conductor, and it is formed between the wiring M4 and the wiring M3 to connect the wiring M4 and the wiring M3 to each other. The via portion V4 can also be formed integrally with the wiring M4. Further, the via portion V5 is composed of a conductor, and it is formed between the wiring M5 and the wiring M4 to connect the wiring M5 and the wiring M4 to each other. The via portion V5 can also be formed integrally with the wiring M5.

Each wiring M1, M2, M3, M4 and M5 can be formed by a technique of patterning a conductive film formed on the interlayer insulation film, a technique of embedding a conductive film in a trench formed in the interlayer insulation film (the so-called "damascene method"), or others.

Further, FIG. 3 shows the case that the number of wiring layers formed on the semiconductor substrate SB1 is five (the case of the total five layers of the wirings M1, M2, M3, M4 and M5). However, the number of wiring layers is not limited to five, and various modifications can be adopted.

The first coil (the coil CL1a) and the secondary coil (the coil CL2a) of the transformer TR1 are formed on the semiconductor substrate SB1. The coil CL1a and the coil CL2a are not formed in the same layer but are formed in different layers from each other, and an insulation layer is interposed between the coil CL1a and the coil CL2a. Further, the coil CL1a on the lower layer side is not formed so as to contact with the semiconductor substrate SB1, and the coil CL1a is formed on an interlayer insulation layer formed on the semiconductor substrate SB1.

The coils CL1a and CL2a will be specifically described below with reference to FIG. 3.

Each of the coil CL1a and the coil CL2a is formed by any wiring layer of a plurality of wiring layers formed on the semiconductor substrate SB1. That is, each of the coil CL1a and the coil CL2a is formed in the same layer as any one of the wirings M1, M2, M3, M4 and M5. However, the wiring layer in which the coil CL1a is formed and the wiring layer in which the coil CL2a is formed are different wiring layers from each other. Since the coil CL2a is formed above the coil CL1a, the coil CL2a is formed by the upper wiring layer than the wiring layer in which the coil CL1a is formed.

In the case shown in FIG. 3, the coil CL2a is formed by the fifth wiring layer (that is, the coil CL2a is formed in the same layer as the wiring M5), and the coil CL1a is formed by the third wiring layer (that is, the coil CL1a is formed in the same layer as the wiring M3). However, the present invention is not limited to this configuration. For example, it is only required to form the coil CL1a in a lower layer than the coil CL2a, and the coil CL1a can be formed by the upper or lower wiring layer than the third wiring layer. On the other hand, it is preferable to form the coil CL2a by the uppermost wiring layer (here, the fifth wiring layer), so that the coil CL2a is easy to connect to a pad (a pad electrode, a bonding pad).

When the coil CL1a is formed by the third wiring layer, the coil CL1a can be formed by the same conductive layer in the same step as those for the wiring M3. For example, when the wiring M3 is formed by using a damascene method, the coil CL1a can also be formed by a damascene method in the same step as that for the wiring M2. In this case, the wiring M3 and the coil CL1a are formed by a conductive film (for example, a conductive film mainly made of copper) embedded in a trench of the interlayer insulation film. Further, for example, when the wiring M3 is formed by patterning a conductive film formed on the interlayer insulation film, the wiring M3 and the coil CL1a can be formed by patterning the conductive film.

When the coil CL2a is formed by the fifth wiring layer, the coil CL2a can be formed by the same conductive layer in the same step as those for the wiring M5. For example, when the wiring M5 is formed by patterning a conductive film formed on the interlayer insulation film, the wiring M5 and the coil CL2a can be formed by patterning the conductive film. Further, pads (a pad electrode, a bonding pad) can be formed by the uppermost wiring layer (here, the wiring M5).

An insulation layer (corresponding to one or more interlayer insulation film(s) of a plurality of interlayer insulation films forming the interlayer insulation film IL) is interposed between the coil CL2a and the coil CL1a. For example, when the coil CL2a is formed by the fifth wiring layer and the coil CL1a is formed by the third wiring layer, the interlayer insulation film which is an upper layer than the third wiring layer and a lower layer than the fifth wiring layer (namely, the interlayer insulation film between the third wiring layer and the fifth wiring layer) is interposed between the coil CL2a and the coil CL1a. Therefore, the coil CL2a and the coil CL1a are not connected to each other by a conductor so as to be electrically insulated from each other. However, as described above, the coil CL2a and the coil CL1a are magnetically coupled to each other.

An insulating protection film (a surface protection film) PA1 is formed on the uppermost layer of the semiconductor chip CP1, and the wiring M5 and the coil CL2a are covered with the protection film PA1 to be protected. The protection film PA1 can be formed of a resin film such as polyimide resin.

However, the pads are exposed from opening portions of the protection film PA1, respectively. In the semiconductor chip CP1, the pads are formed by the same conductive layer as those for the wiring M5 and the coil CL2a, and they are formed integrally with the coil CL2a or the wiring M5. The pad connected to the coil CL2 is electrically connected to a pad of the semiconductor chip CP2 through a conductive connection member such as a bonding wire BW.

Further, the semiconductor chip CP2 can have a similar configuration to that of the semiconductor chip CP1.

That is, as shown in FIG. 3, semiconductor elements such as a MISFET are formed on the semiconductor substrate SB2 made of a monocrystalline silicon forming the semiconductor chip CP2. Note that an SOI substrate or others can also be used as the semiconductor substrate SB1 as another aspect.

For example, a p-type well PW and an n-type well NW are formed in the semiconductor substrate SB2, a gate electrode GE1 for the n-channel type MISFET is formed on the p-type well PW via a gate insulation film GI, and a gate electrode GE2 for the p-channel type MISFET is formed on the n-type well NW via a gate insulation film GI. An n-type semiconductor region SD1 for a source/drain of the n-channel type MISFET is formed within the p-type well PW, and a p-type semiconductor region SD2 for a source/drain of the p-channel type MISFET is formed within the n-type well NW. Further, a p-type semiconductor region PR is formed in a portion of an upper layer portion of the p-type well PW so as to contact with the p-type well PW, and an n-type semiconductor region NR is formed in a portion of an upper layer portion of the n-type well NW so as to contact with the n-type well NW. Moreover, a resistance element (not shown), a capacity element (not shown) and others can be further formed in the semiconductor substrate SB2.

On the semiconductor substrate SB2, a multi-layered wiring structure composed of a plurality of interlayer insulation films and a plurality of wiring layers is formed.

Specifically, the plurality of interlayer insulation films (the plurality of interlayer insulation films are collectively shown as the interlayer insulation film IL in FIG. 3) are formed on the semiconductor substrate SB2, and a plug V1, wirings M1, M2, M3, M4 and M5, and via portions V2, V3, V4 and B5 are formed in the plurality of interlayer insulation films, respectively. Note that FIG. 3 shows the case that the number of wiring layers formed on the semiconductor substrate SB2 is five (the case of total five layers of the wirings M1 to M5). However, the number of wiring layers is not limited to five.

Further, though not illustrated in the cross-sectional surface in FIG. 3, the above-described coil CL1b and the above-described coil CL2b are formed on the semiconductor substrate SB2. The configurations of the coil CL1b and the coil CL2b in the semiconductor chip CP2 are formed almost similar to those of the coil CL1a and the coil CL2a in the semiconductor chip CP1, respectively. Therefore, illustration and explanation about the coils CL1b and CL2b are omitted here.

An insulating protection layer PA1 is formed on the uppermost layer of the semiconductor chip CP2, and the wiring M5 and the above-described coil CL2b (not shown in FIG. 3) are covered with the protection film PA1 to be protected. In the semiconductor chip CP2, the pads connected to the wiring M5 or the above-described coil CL2a are exposed from opening portions of the protection film PA1.

The above-described transmission circuit TX1 and coils CL1a and CL2a are formed within the semiconductor chip CP1, and the transmission circuit TX1 formed within the semiconductor chip CP1 is electrically connected to the coil CL1a via internal wirings (the wiring M1 to M5) within the semiconductor chip CP1. In this manner, a signal for transmission can be transmitted from the transmission circuit TX1 to the coil CL1a through the internal wirings (the wirings M1 to M5) within the semiconductor chip CP1. The pad connected to the coil CL2a in the semiconductor chip CP1 is electrically connected to a pad of the semiconductor chip CP2 through a conductive connection member such as the bonding wire BW, and is further electrically connected to the reception circuit RX1 formed within the semiconductor chip CP2 via the internal wirings (M1 to M5) of the semiconductor chip CP2. In this manner, a signal (a reception signal) received by the coil CL2a from the coil CL1a through electromagnetic conduction can be transmitted to the reception circuit RX1 within the semiconductor chip CP2 through the bonding wire BW (the connection member) and the internal wirings (M1 to M5) of the semiconductor chip CP2.

Similarly, the above-described transmission circuit TX2 and the above-described coils CL1b and CL2b are formed within the semiconductor chip CP1, and the transmission circuit TX2 formed within the semiconductor chip CP2 is electrically connected to the above-described coil CL1b within the semiconductor chip CP2 through the internal wirings (wirings M1 to M5) within the semiconductor chip CP2. In this manner, a signal for transmission can be transmitted from the transmission circuit TX2 to the coil CL1b via the internal wirings (the wirings M1 to M5) within the semiconductor chip CP2. A pad connected to the above-described coil CL2b in the semiconductor chip CP2 is electrically connected to a pad of the semiconductor chip CP1 through a conductive connection member such as a bonding wire BW, and is further electrically connected to the reception circuit RX2 formed within the semiconductor chip CP1 through the internal wirings (M1 to M5) of the semiconductor chip CP1. In this manner, a signal (a reception signal) received by the coil CL2a from the above-described coil CL1a through electromagnetic induction can be transmitted to the reception circuit RX1 within the semiconductor chip CP1 through a bonding wire BW (the connection member) and the internal wirings (M1 to M5) of the semiconductor chip CP1.

Figure 4:
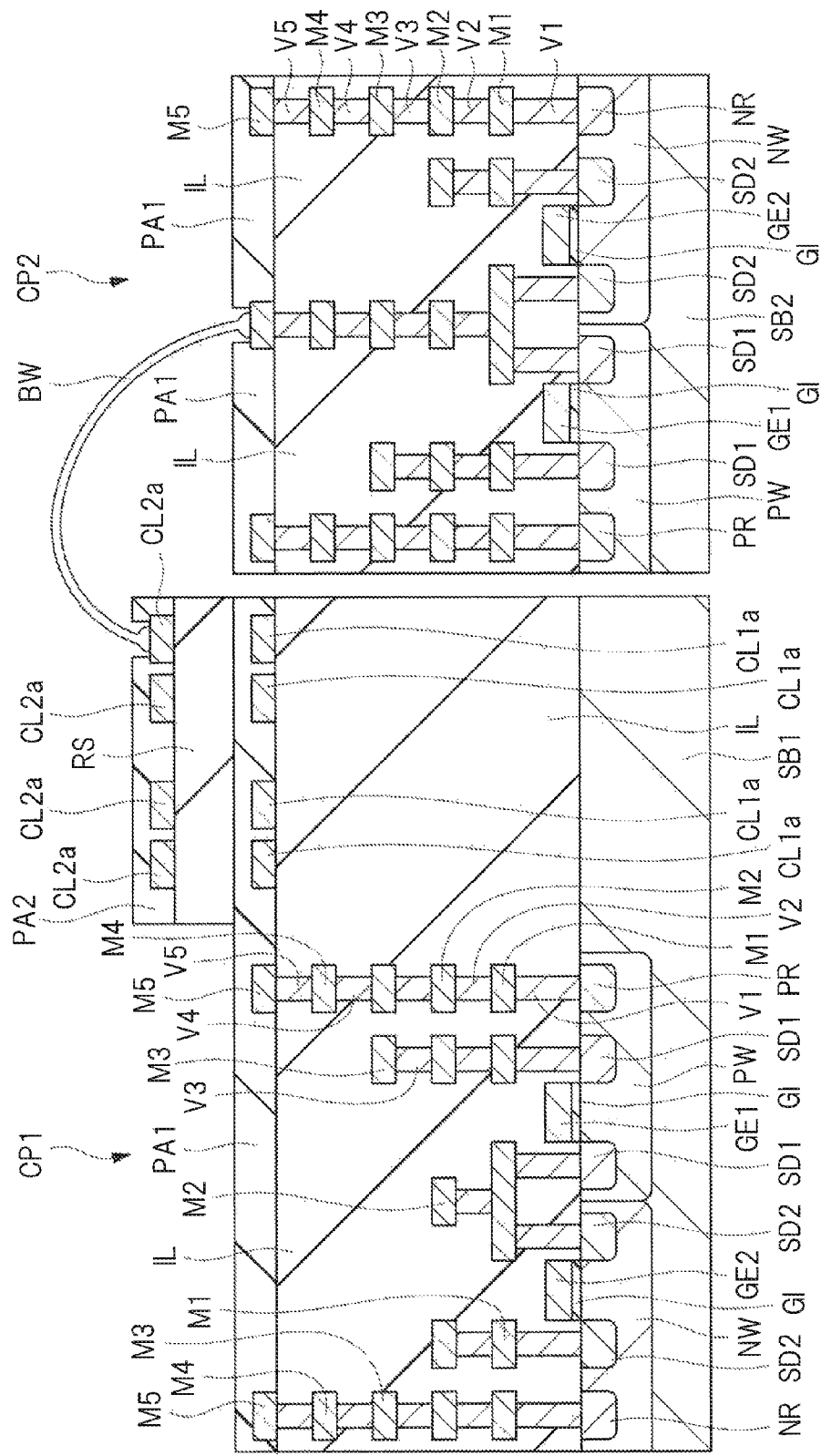
FIG. 4 is a cross-sectional view schematically showing a cross-sectional structure of the semiconductor chip of the first embodiment.

FIG. 4 is a cross-sectional view schematically showing another example of the cross-sectional structure of the semiconductor chips CP1 and CP2 of the present embodiment.

A main different point of the case shown in FIG. 4 from the case shown in FIG. 3 is that, in the case shown in FIG. 4, a resin film RS is further formed on one portion of the protection film PA1 as an insulation layer in the semiconductor chip CP1 and the coil CL2a is formed on the resin film RS. A protection film (a resin film for protection) PA2 is formed on the resin film RS so as to cover the coil CL2a. The resin film RS can be, for example, a polyimide film or others. Further, the protection film PA2 can be, for example, a polyimide film or others. In the case shown in FIG. 4, the coil CL2a is formed in an upper layer than the fifth layer wiring (the wiring M5) which is the internal wiring layer of the uppermost layer. In this case, the coil CL2a can be formed by, for example, forming a conductive film on the resin film RS, and then, patterning the conductive film.

While the coil CL2a is covered by the protection film PA2 and protected, a pad connected to the coil CL2a is exposed from an opening portion of the protection film PA2. The pad connected to the coil CL2a is formed by the same conductive layer as that of the coil CL2a, and is formed integrally with the coil CL2a. The pad connected to the coil CL2a is electrically connected to a pad of the semiconductor chip CP2 through a conductive connection member such as a bonding wire BW.

The coil CL1a is formed below the coil CL2a. However, when the resin film RS is provided, and then, the coil CL2a is formed on the resin film RS, the coil CL1a is formed below the resin film RS. In the case shown in FIG. 4, the coil CL1a is formed by the fifth layer wiring (namely, the coil CL1a is formed in the same layer as that of the wiring M5). However, the present invention is not limited to this configuration. That is, it is only required to form the coil CL1a in a lower layer than the coil CL2a and the resin film RS, and the coil CL1a can be formed by the fifth wiring layer or a lower wiring layer than the fifth wiring layer.

Further, the resin film RS can be formed locally in a region where the coil (CL2a) is formed on the interlayer insulation film IL (or on the protection film PA1).

In the case shown in FIG. 4, it is required to form the resin film RS. However, a processing time is short because the resin film RS can be formed by an applying method.

On the other hand, in the case shown in FIG. 3, a breakdown voltage (insulation voltage) between the coil CL2a and the coil CL1a is secured by the interlayer insulation film (IL), so that the number of manufacturing steps and a manufacturing cost can be reduced by members corresponding to the resin film RS and the protection film PA2 which are not formed.

Further, in the case shown in FIG. 4, the members corresponding to the resin film RS and the protection film PA2 can be also formed in the semiconductor chip CP2, and the above-described coil CL2b is formed on the resin film RS.

<Regarding Coil Configuration>

Next, a detail configuration of (the coil configuring) the transformer TR1 formed within the semiconductor chip CP1 will be described.

Figure 5:
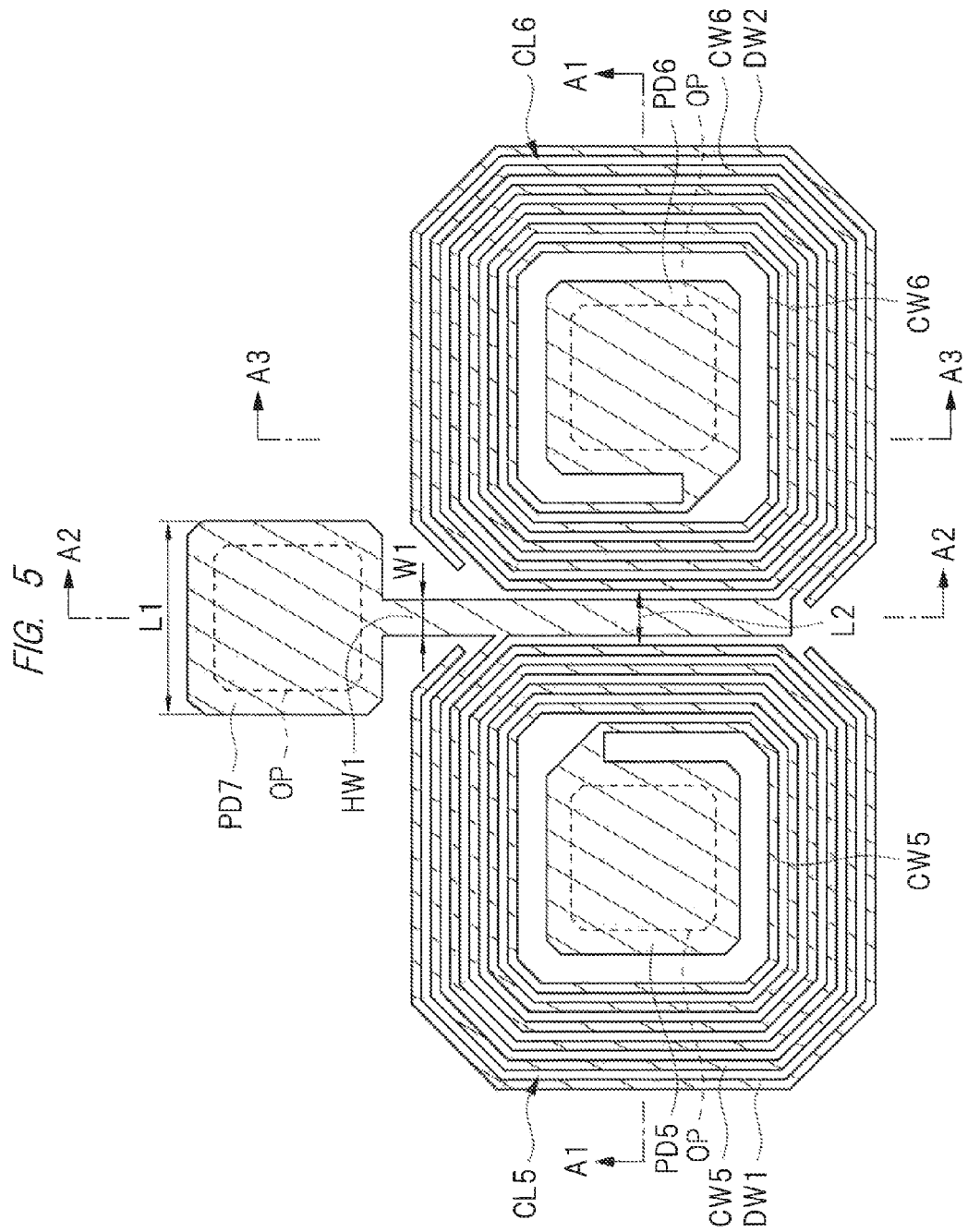
FIG. 5 is a plan view of a principal part of the semiconductor chip of the first embodiment.
Figure 6:
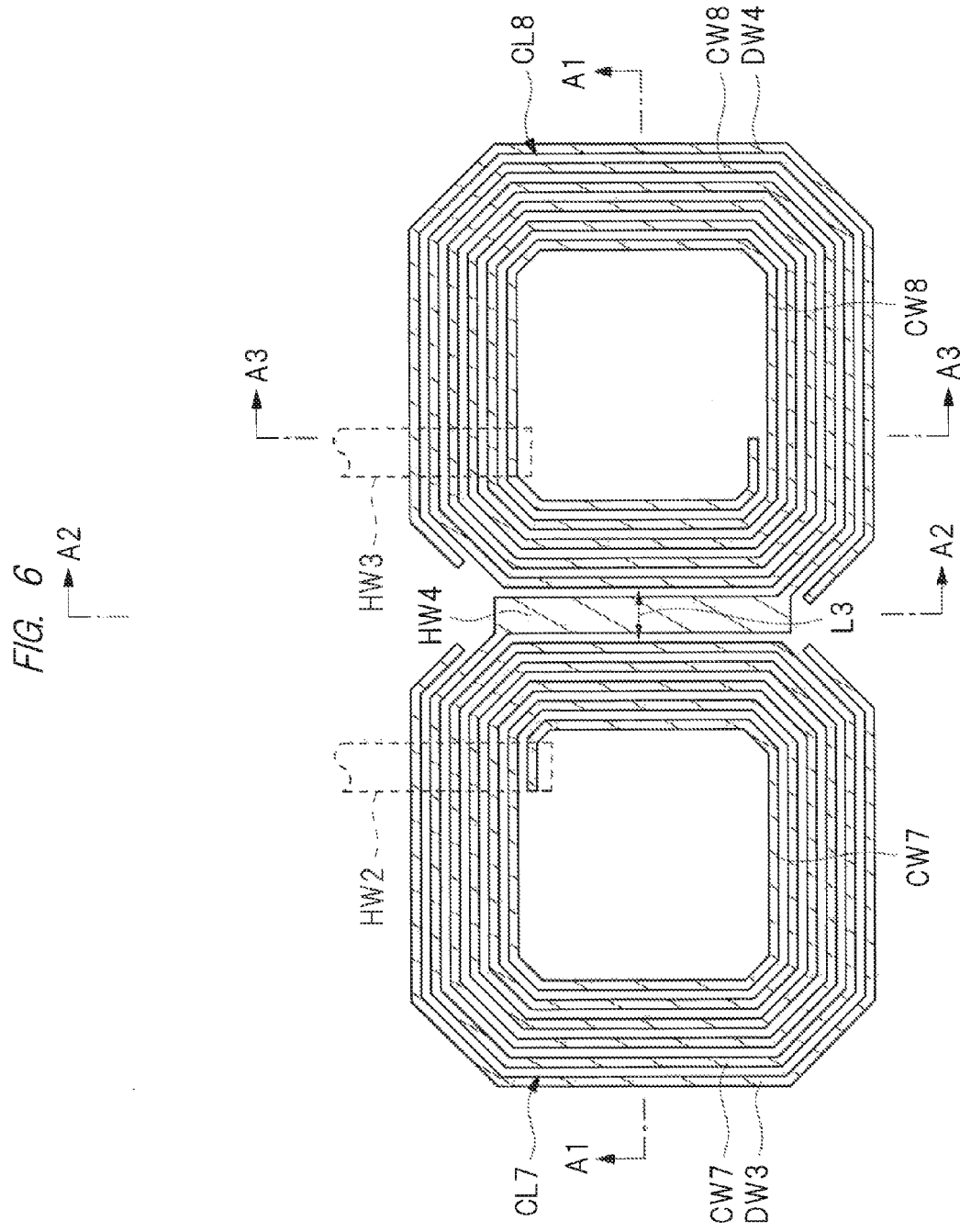
FIG. 6 is a plan view of a principal part of the semiconductor chip of the first embodiment.
Figure 7:
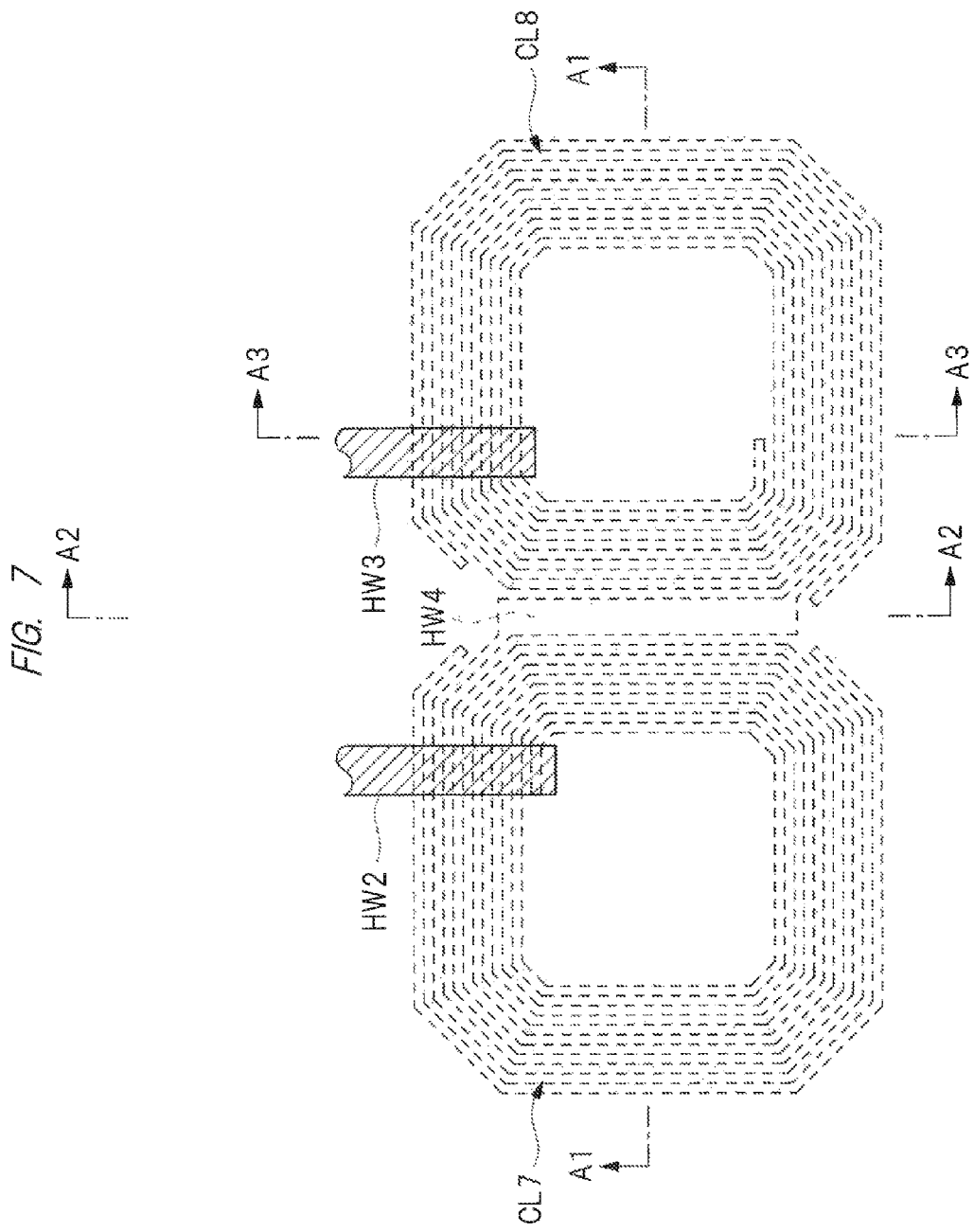
FIG. 7 is a plan view of a principal part of the semiconductor chip of the first embodiment.
Figure 8:
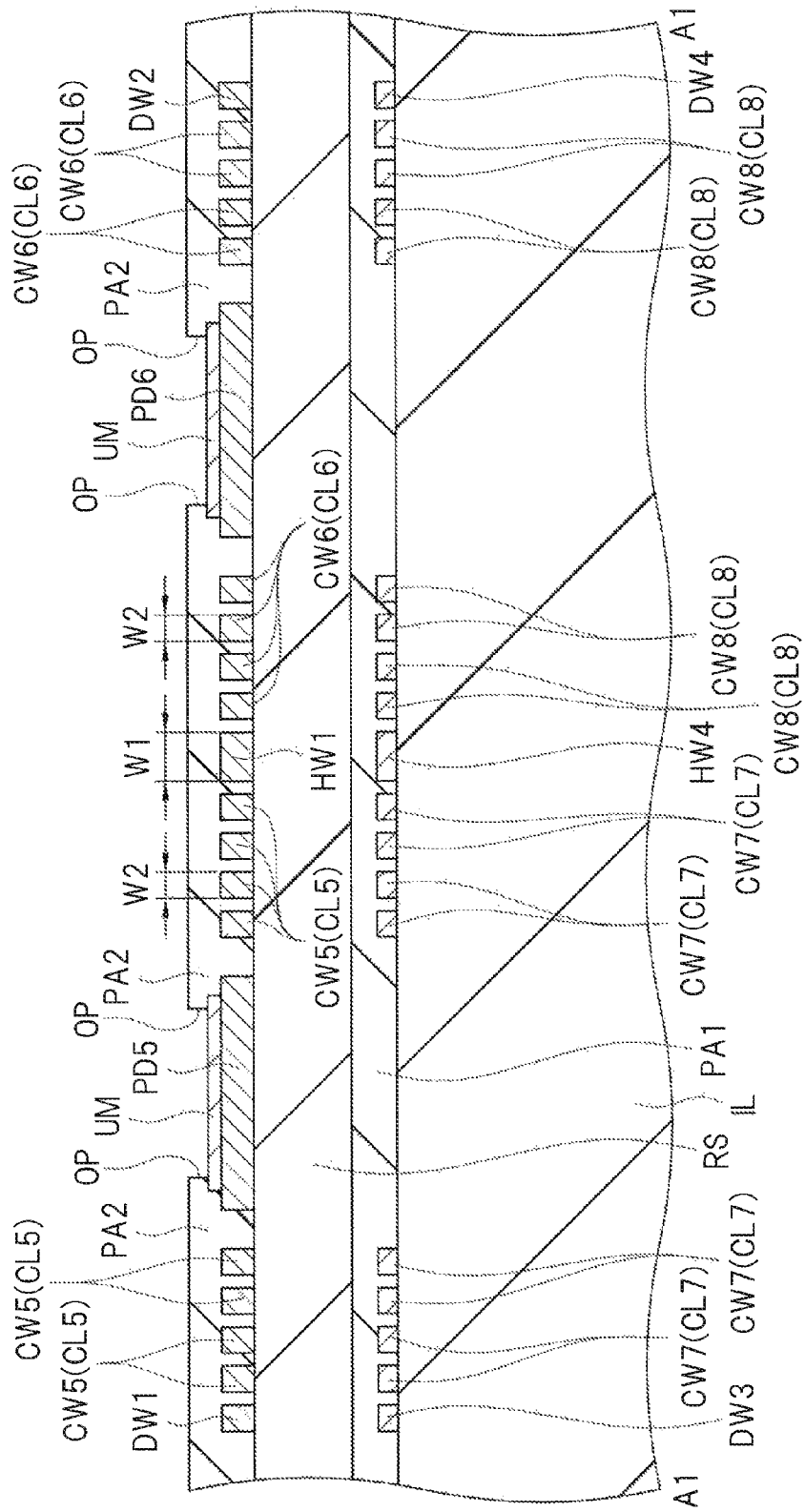
FIG. 8 is a cross-sectional view of a principal part of the semiconductor chip of the first embodiment.

FIG. 5 to FIG. 7 are plan views of a principal part of the semiconductor chip CP1 of this embodiment. FIG. 8 to FIG.

Figure 11:
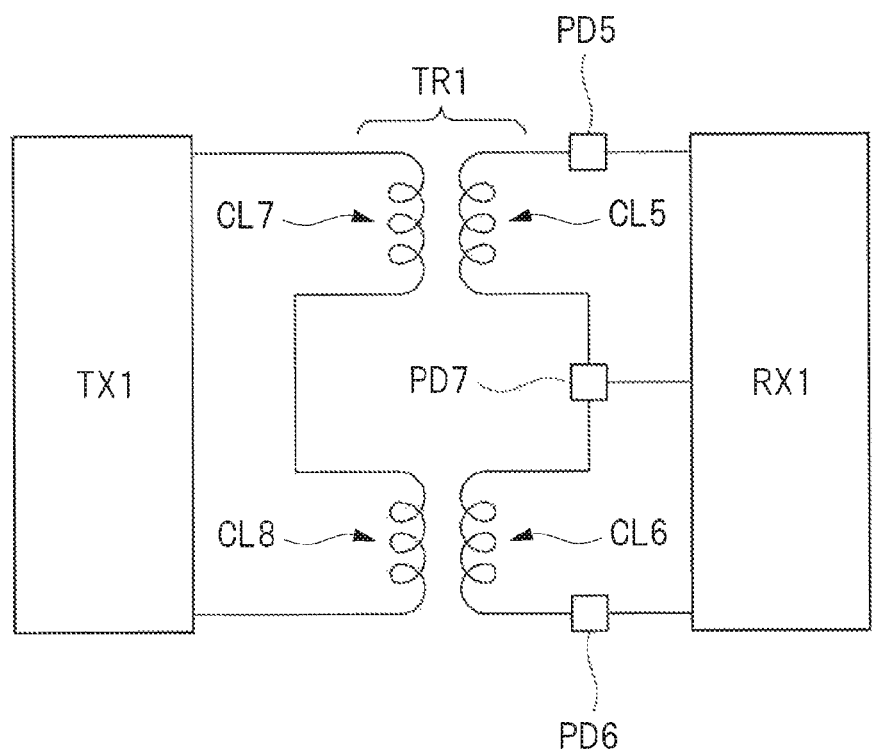
FIG. 11 is a circuit diagram showing a circuit configuration of a transformer formed inside the semiconductor chip of the first embodiment.

10 are cross-sectional views of a principal part of the semiconductor chip CP1 of this embodiment. FIG. 11 is a circuit diagram showing a circuit configuration of the transformer TR1 formed within the semiconductor chip CP1.

Note that FIG. 5, FIG. 6, and FIG. 7 show the same flat region in the semiconductor chip CP1 as each other. However, layers shown in these drawings are different from each other so that FIG. 6 shows a lower layer than that shown in FIG. 5 and so that FIG. 7 shows a lower layer than that shown in FIG. 6. Specifically, FIG. 5 shows the secondary coil (coils CL5 and CL6) of the transformer TR1 formed in the semiconductor chip CP1, FIG. 6 shows the primary coil (coils CL7 and CL8) of the transformer TR1 formed in the semiconductor chip CP1, and FIG. 7 shows leading wirings (lead wirings HW2 and HW3) on the primary coil side of the transformer TR1 formed in the semiconductor chip CP1. Further, in order to easily understand a relative positional relationship between the primary coil (CL7 and CL8) and the leading wirings (the lead wirings HW2 and HW3), the lead wirings HW2 and HW3 are shown by a dotted line in FIG. 6, and a pattern (namely, coil wirings CW7 and CW8, a connection wiring HW4, and dummy wirings DW3 and DW4) shown by a solid line in FIG. 6 is shown by a dotted line in FIG. 7. Also, cross-sectional views taken along a line A1-A1 in FIG. 5 to FIG. 7 correspond to FIG. 8, cross-sectional views taken along a line A2-A2 in FIG. 5 to FIG. 7 correspond to FIG. 9, and cross-sectional views taken along a line A3-A3 in FIG. 5 to FIG. 7 correspond to FIG. 10.

As described above, the primary coil and the secondary coil for the transformer TR1 are formed within the semiconductor chip CP1, and the primary coil of the primary coil and the secondary coil is formed on a lower side, and the secondary coil thereof is formed on an upper side. That is, the secondary coil is arranged above the primary coil, and the primary coil is arranged below the secondary coil.

Here, the primary coil and the secondary coil are composed of two coils, respectively. That is, the transformer TR1 is composed of two transformers, and these two transformers are operated differentially, so that noise resistance becomes high.

Therefore, as shown in FIG. 11, the present embodiment adopts a configuration that the primary coil (corresponding to the above-described coil CL1a) of the transformer TR1 is formed of a coil CL7 and a coil CL8 connected in series, while the secondary coil (corresponding to the above-described coil CL2a) of the transformer TR1 is formed of a coil CL5 and a coil CL6 connected in series between a pad PD5 and a pad PD6. In this case, the coil CL7 and the coil CL5 are magnetically coupled (inductively coupled) to each other, while the coil CL8 and coil CL6 are magnetically coupled (inductively coupled) to each other. The coils CL7 and CL8 connected in series are connected to the transmission circuit TX1. Further, a pad PD7 is electrically connected between the coil CL5 and the coil CL6. These coils CL5, CL6, CL7 and CL8 and pads PD5, PD6 and PD7 and transmission circuit TX1 are formed within the semiconductor chip CP1. The pads PD5, PD6 and PD7 of the semiconductor chip CP1 are connected to the reception circuit RX1 within the semiconductor chip CP2 through conductive connection members such as the above-described bonding wires BW and the internal wirings (wirings M1 to M5) of the semiconductor chip CP2.

Therefore, in the semiconductor chip CP1, when a current is flowed by feeding a transmission signal from the transmission circuit TX1 to the coil CL7 and the coil CL8 which are the primary coil, induced electromotive force is generated in the coil CL5 and the coil CL6 which are the secondary coil in accordance with change of a current flowing in the coil CL7 and coil CL8 so that an induction current flows. The induced electromotive force or the induction current generated in the coil CL5 and coil CL6 can be detected by the reception circuit RX1 within the semiconductor chip CP2 from the pads PD5, PD6 and PD7 through conductive connection members such as the bonding wire BW and the internal wirings (wiring M1 to M5) of the semiconductor chip CP2. In this manner, a signal from the transmission circuit TX1 of the semiconductor chip CP1 can be transmitted to the reception circuit RX1 of the semiconductor chip CP2 through the coils CL7, CL8, CL5 and CL6 through the electromagnetic induction. Since a fixed potential (a ground potential, a GND potential, a power source potential or others) is supplied from the semiconductor chip CP2 to the pad PD7, the induced electromotive force or the induction current of the coil CL5 and the induced electromotive force or the induction current of the coil CL6 can be detected and differentially controlled (operated).

A specific configuration of these coils CL5, CL6, CL7 and CL8 and pads PD5, PD6 and PD7 will be described below with reference to FIG. 5 to FIG. 10.

First of all, a specific configuration of the coils CL5 and CL6 configuring the secondary coil and the pads (the pad electrode, the bonding pad) PD5, PD6 and PD7 connected thereto will be described.

As shown in FIG. 5 and FIG. 8 to FIG. 11, two coils (inductors) CL5 and CL6 are connected in series between the pad PD5 and the pad PD6. The pad PD7 is electrically connected between the coil CL5 and the coil CL6.

The coil CL5 and the coil CL6 are formed in the same layer as each other within the semiconductor chip CP1, the coil CL5 is formed of a spirally-winding coil wiring CW5 (in a coil shape, a loop shape), and the coil CL6 is formed of a spirally-winding coil wiring CW6 (in a coil shape, a loop shape). Further, each of the coil CL5 and the coil CL6 is formed on a plane. Each of the coil CL5 and the coil CL6 can be regarded as an inductor.

Further, as shown in FIG. 6 and FIG. 8 to FIG. 11, two coils (inductors) CL7 and CL8 are connected in series. As shown in FIG. 6 and FIG. 8, the coil CL7 and the coil CL8 are formed in the same layer as each other within the semiconductor chip CP1, the coil CL7 is formed of a spirally-winding coil wiring CW7 (in a coil shape, a loop shape), and the coil CL8 is formed of a spirally-winding coil wiring CW8 (in a coil shape, a loop shape). Further, each of the coil CL7 and the coil CL8 is formed on a plane. Each of the coil CL7 and the coil CL8 can be regarded as an inductor.

Figure 9:
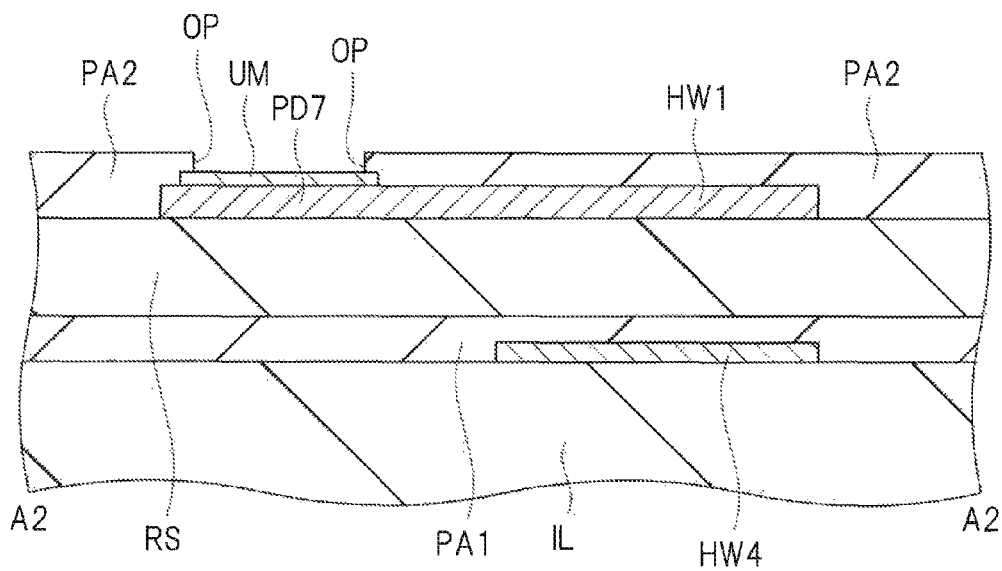
FIG. 9 is a cross-sectional view of a principal part of the semiconductor chip of the first embodiment.
Figure 10:
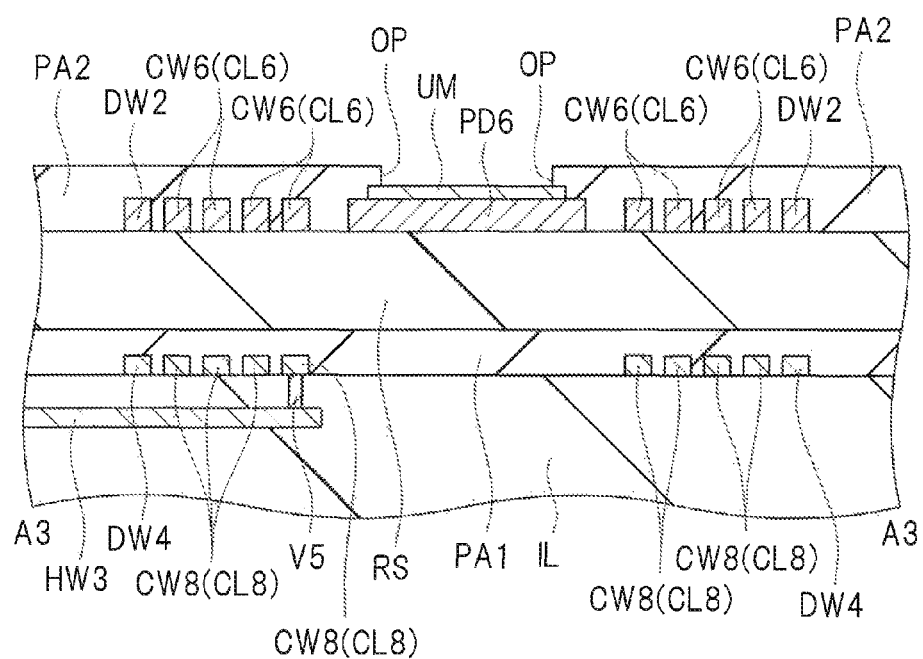
FIG. 10 is a cross-sectional view of a principal part of the semiconductor chip of the first embodiment.

As seen also from FIG. 8 to FIG. 10, the coils CL7 and L8 are formed within the semiconductor chip CP1 in a lower layer than the coils CL5 and CL6. That is, within the semiconductor chip CP1, the coil CL5 and the coil CL6 are formed in the same layer as each other and the coil CL7 and the coil CL8 are formed in the same layer as each other. However, the coils CL7 and L8 are arranged in a lower layer than the coils CL5 and CL6, and the coils CL5 and CL6 are arranged in an upper layer than the coils CL7 and CL8.

The coil CL7 is arranged just below the coil CL7, and the coil CL8 is arranged just below the coil CL6. That is, the coil CL7 is arranged so as to overlap with the coil CL5 in a plan view, and the coil CL8 is arranged so as to overlap with the coil CL6 in a plan view. In other words, the coil CL5 is arranged just above the coil CL7, and the coil CL6 is arranged just above the coil CL8. That is, the coil CL5 is arranged so as to overlap with the coil CL7 in a plan view, and the coil CL6 is arranged so as to overlap with the coil CL8 in a plan view.

The coil CL5 and the coil CL6 configure the secondary coil of the transformer TR1, and they correspond to the above-described coil CL2a. Further, the coil CL7 and the coil CL8 configure the primary coil of the transformer TR1, and they correspond to the above-described coil CL1a. The coil CL5 and the coil CL7 are magnetically coupled to each other, and the coil CL6 and the coil CL8 are magnetically coupled to each other. That is, the coil CL5 and the coil CL7 are not connected to each other by a conductor but are magnetically coupled to each other, and the coil CL6 and the coil CL8 are not connected to each other by a conductor but are magnetically coupled to each other. On the other hand, the coil CL5 and the coil CL6 are connected to each other by a conductor, and the coil CL7 and the coil CL8 are connected to each other by a conductor.

Note that cross-sectional views shown in FIG. 8 to FIG. 10 show the case that the structure shown in FIG. 4 is applied so that the secondary coil (coils CL5, CL6) is formed on the resin film RS and the primary coil (coils CL7 and CL8) is formed below the resin film RS. However, the structure shown in the above-described FIG. 3 can also be applied.

The pads PD5, PD6 and PD7 are formed by the same conductive layer as the layer of the coils CL5 and CL6 (coil wirings CW5 and CW6). While the coil wirings CW5 and CW6 and the lead wiring HW1 are covered with the uppermost protection film (the protection film PA2 in the case of FIG. 8 to FIG. 10) of the semiconductor chip CP1, the pads PD5, PD6 and PD7 are exposed from opening portions OP provided in the protection film (PA2). In FIG. 5, the opening portions OP are shown with a dotted line. Further, an underlying metal film UM composed of a stacked film made of a nickel (Ni) film and a gold (Au) film on the nickel film or others can be formed on the surfaces of the pads PD5, PD6 and PD7, so that the connection members such as the bonding wire BW are easy to connect to the pad PD5, PD6 and PD7.

The coils CL5 and CL6 and the pads PD5, Pd6 and Pd7 will be further described with reference to FIG. 5 and FIG. 8 to FIG. 10.

As shown in FIG. 5 and FIG. 8 to FIG. 10, the pad PD5 is arranged inside the spiral of the coil CL5, and one end of the coil CL5 is connected to the pad PD5. That is, the coil CL5 is formed by winding the coil wiring CW5 connected to the pad PD5 around the pad PD5 a plurality of times. In the case shown in FIG. 5, the coil CL5 is formed by winding the coil wiring CW5 connected to the pad PD5 around the pad PD5 at a right-hand turn (clockwise). Since the coil wirings CW5 do not intersect with each other, the coil wiring CW5 connected to the pad PD5 is gradually shifted to the side far from the pad PD5 each time of the right-hand turn (clockwise) winding around the pad PD5.

Further, the pad PD6 is arranged inside the spiral of the coil CL6, and one end of the coil CL6 is connected to the pad PD6. That is, the coil CL6 is formed by winding the coil wining CW6 connected to the pad PD6 around the pad PD6 a plurality of times. In the case shown in FIG. 5, the coil CL6 is formed by winding the coil wiring CW6 connected to the pad PD6 around the pad PD6 at a right-hand turn (clockwise). Since the coil wirings CW6 do not intersect with each other, the coil wiring CW6 connected to the pad PD6 is gradually shifted to the side far from the pad PD6 each time of the right-hand turn (clockwise) winding of the coil wiring CW6 around the pad PD6.

Here, the term "right-hand turn" has the same meaning as the term "clockwise", while the term "a left-hand turn" has the same meaning as the term "counterclockwise". When the "winding diction (spiral direction) of a coil or a coil wiring" is described, the winding direction indicates a winding direction formed from the inside of the spiral to the outside thereof when the coil or the coil winding is viewed from the above, the apparently-clockwise winding in the viewing from the inside of the spiral to the outside thereof as viewed from above is referred to as "right winding", and the apparently-counterclockwise winding in the viewing from the inside of the spiral to the outside thereof as viewed from above is referred to as "left winding". For example, in the case of the description of the winding direction of the coil CL5 of the semiconductor chip CP1, when a surface side (the surface side is a side on which the pad is formed) of the semiconductor chip CP1 is viewed from above of the semiconductor chip CP1 (FIG. 5 and FIG. 6 correspond to the viewing), the apparently-clockwise winding in the viewing from the inside of the spiral of the coil CL5 to the outside thereof is referred to as "right winding", and the apparently-counterclockwise winding therein is referred to as "left winding".

Since the coil CL5 shown in FIG. 5 can be apparently winded clockwise in the viewing from the inside of the spiral of the coil CL5 to the outside thereof as viewed from above, the winding direction of the coil CL5 (the coil winding CW5) can be said to be the right winding. Further, since the coil CL6 shown in FIG. 5 can be apparently winded clockwise in the viewing from the inside of the spiral of the coil CL6 to the outside thereof as viewed from above, the winding direction of the coil CL6 (the coil winding CW6) can be said to be the right winding.

The number of windings (the number of turns) of the coil CL5 (the coil winding CW5) and the number of windings (the number of turns) of the coil CL6 (the coil winding CW6) are changeable as necessary. However, it is preferable that the number of windings of the coil CL5 (the coil winding CW5) and the number of windings of the coil CL6 (the coil winding CW6) are the same. Further, it is preferable that a size (a diameter) of the coil CL5 and a size (a diameter) of the coil CL6 are the same. Moreover, it is preferable that a self-inductance of the coil CL5 and a self-inductance of the coil CL6 are the same.

Between the coil CL5 and the coil CL6, the other end (an end portion opposed to an end portion connected to the pad PD5) of the coil CL5 (the coil winding CW5) and the other end (an end portion opposed to an end portion connected to the pad PD6) of the coil CL6 (the coil winding CW6) are connected to the lead wiring (leading wiring) HW1. Therefore, the above-described other end of the coil CL5 (the coil wiring CW5) and the above-described other end of the coil CL6 (the coil wiring CW6) are electrically connected to each other through the lead wiring HW1.

Here, the above-described other end of the coil CL5 (the coil wiring CW5) corresponds to an outer end portion (the outside of the spiral) of the coil CL5 (the coil wiring CW5), and the above-described other end of the coil CL6 (the coil wiring CW6) corresponds to an outer end portion (the outside of the spiral) of the coil CL6 (the coil wiring CW6). That is, the coil CL5 (the coil wiring CW5) has an inner end portion (the inside of the spiral) and an outer end portion (the outside of the spiral) which are end portions opposed to each other, and the inner end portion among them is connected to the pad PD5 while the outer end portion is connected to the lead wiring HW1. Further, the coil CL6 (the coil wiring CW6) has an inner end portion (the inside of the spiral) and an outer end portion (the outside of the spiral) which are end portions opposed to each other, and the inner end portion among them is connected to the pad PD6 while the outer end portion is connected to the lead wiring HW1.

The lead wiring HW1 is formed in the same layer as those of the coil CL5 (the coil wiring CW5) and the coil CL6 (the coil wiring CW6), and extends from a portion between the coil CL5 and the coil CL6 to a pad PD7 in a plan view as shown in FIG. 5. As shown in FIG. 5, the pad PD7 is not positioned between the coil CL5 and the coil CL6 as viewed at a position in a plan view, and therefore, the pad PD7 is not positioned between the pad PD5 and the pad PD6, either.

The lead wiring HW1 is a wiring for electrically connecting the outer end portion (the outside of the spiral) of the coil CL5 (the coil wiring CW5) and the outer end portion (the outside of the spiral) of the coil CL6 (the coil wiring CW6) and for leading these end portions to the pad PD7. If the pad PD7 is arranged between the coil CL5 and the coil CL6, it is not required to provide the lead wiring HW1, so that the outer end portion of the coil CL5 (the coil wiring CW5) and the outer end portion of the coil CL6 (the coil wiring CW6) can be directly connected to the pad PD7. As shown in FIG. 5, however, the pad PD7 is not positioned between the coil CL5 and the coil CL6 in a plan view, and therefore, the outer end portion of the coil CL5 (the coil wiring CW5) and the outer end portion of the coil CL6 (the coil wiring CW6) are connected to a portion of the lead wiring HW1 extending between the coil CL5 and the coil CL6, and the lead wiring HW1 is led out to the pad PD7.

Between the coil CL5 and the coil CL6, the lead wiring HW1 extends in a direction (more specifically, substantially orthogonal direction) intersecting a direction connecting the coil CL5 and the coil CL6 (this direction also corresponding to a direction connecting the pad PD5 and the pad PD6), and further extends to the pad PD7 so as to be connected to the pad PD7. Further, the respective sizes (lengths of sides) of the pad PD5, PD6 and PD7 may be almost the same.

It is preferable that the width W1 of the lead wiring HW1 is larger than each width W2 of the coil wirings CW5 and CW6 (namely, W1>W2), and it is preferable that the width W1 is smaller than the length (size) L1 of the side of the pad PD7 (namely, W1<L1). It is effective to thin the wiring widths of the coil wirings CW5 and CW6 in order to increase the number of windings (the number of turns) of the coil wirings CW5 and CW6 without increasing occupation areas of the coil wirings CW5 and CW6. However, since the lead wiring HW1 has no relation with the number of windings of the coils, a resistance (wiring resistance) of the lead wiring HW1 can be reduced by increasing the wiring width of the lead wiring HW1. Therefore, the occupation areas of the coil wirings CW5 and CW6 can be suppressed and the number of windings of the coil wirings CW5 and CW6 can be increased by forming each width of the coil wirings CW5 and CW6 to be smaller than the width of the lead wiring HW1. Further, the resistance of the lead wiring HW1 can be reduced by forming the width of the lead wiring HW1 to be larger than each width of the coil wiring CW5 and CW6. Furthermore, a distance (space) L2 between the coil CL5 and the coil CL6 can be shortened by forming the width of the lead wiring HW1 to be smaller than the length of the side of the pad PD7. It is preferable that the distance (space) L2 between the coil CL5 and the coil CL6 is smaller than the length (size) L1 of the side of the pad PD7 (L2<L1).

Further, it is preferable that dummy wirings DW1 and DW2 are arranged outside the outermost circumference of the coil wiring CW5 and outside the outermost circumference of the coil wiring CW6, respectively. The dummy wirings DW1 and DW2 are formed in the same layer as those of the coil wirings CW5 and CW6. However, they are dummy wirings which are not connected to the coil wirings CW5 and CW6 and can be isolated patterns. Since the coil wirings CW5 and CW6 are dummy wirings which are not used as wirings, they can be set to be floating potentials.

The dummy wiring DW1 is formed so as to be spaced away from the outermost circumference of the coil wiring CW5 along the outermost circumference of the coil wiring CW5 except for a region (corresponding to a region where the lead wiring HW1 extends) where the coil CL5 and the coil CL6 face each other. Further, the dummy wiring DW2 is formed so as to be spaced away from the outermost circumference of the coil wiring CW6 along the outermost circumference of the coil wiring CW6 except for a region (corresponding to a region where the lead wiring HW1 extends) where the coil CL5 and the coil CL6 face each other. A gap between the outermost circumference of the coil wiring CW5 and the dummy wiring DW1 can be made almost equal to a gap between the winding coil wirings CW5, and a gap between the outermost circumference of the coil wiring CW6 and the dummy wiring DW2 can be made almost equal to a gap between the winding coil wirings CW6.

The coil wirings CW5 and CW6 can be formed by, for example, patterning a conductive film formed on the insulation film utilizing a photolithography process and an etching process. However, when a photoresist pattern is formed by the photolithography process, the shape of the outermost photoresist pattern collapses easily (for example, the shape becomes thinner than a targeted one), and therefore, when a coil is formed by etching using this photoresist pattern to etch the conductive film, there is such a risk that the shape of the outermost circumference of the coil also collapses.

On the other hand, if the dummy wirings DW1 and DW2 are provided outside the outermost circumferences of the coil wirings CW5 and CW6, the easy collapse of the shape of the photoresist pattern is caused in the photoresist patterns for formation of the dummy wiring DW1 and DW2, and the shapes of the photoresist patterns for formation of the coil wirings CW5 and CW6 including the outermost circumferences can be properly formed without the shape collapse. Therefore, the shapes of the coil wirings CW5 and CW6 including the outermost circumferences can be properly formed without the shape collapse. Further, even if the shapes of the dummy wirings DW1 and DW2 collapse, the dummy wirings DW1 and DW2 are formed in the dummy wiring patterns not used as the wirings, and therefore, there is no problem.

Further, dummy wirings DW3 and DW4 similar to the dummy wirings DW1 and DW2 can be provided outside the outermost circumferences of the coils CL7 and CL8 (the coil wirings CW7 and CW8) which configure the primary coil. Also in this case, an effect similar to the above-described effect can be obtained. That is, as shown in FIG. 6, the dummy wiring DW3 is formed so as to be spaced away from the outermost circumference of the coil wiring CW7 along the outermost circumference of the coil wiring CW7 except for a region (corresponding to a region where the connection wiring HW4 extends) where the coil CL7 and the coil CL8 face each other. Further, the dummy wiring DW4 is formed so as to be spaced away from the outermost circumference of the coil wiring CW8 along the outermost circumference of the coil wiring CW8 except for a region (corresponding to a region where the connection wiring HW4 extends) where the coil CL7 and the coil CL8 face each other.

Further, when the coils CL5 and CL6 are formed on the resin film RS, as shown in FIG. 5, it is preferable that each angle of the coil CL5 and CL6 (the coil wirings CW5 and CW6) is set at an obtuse angle (angle larger than 90°) in a plan view. This is because the resin film, especially, a polyimide film is weak to a right angle or an acute angle of a metal pattern. By setting each angle of the coils CL5 and CL6 (the coil wirings CW5 and CW6) at the obtuse angle (angle larger than 90°), the reliability of the underlying resin film RS of the coils CL5 and CL6 and the resin film (the protection film PA1 or the protection film PA2) covering the coils CL5 and CL6 can be improved. Further, this manner causes large effect especially when the underlying resin film RS of the coils CL5 and CL6 or the resin film (the protection film PA1 or the protection film PA2) covering the coils CL5 and CL6 is a polyimide film. In the case shown in FIG. 5, each plane shape of the coils CL5 and CL6 (the coil wirings CW5 and CW6) is substantially octagonal, and therefore, each angle of the coils CL5 and CL6 (the coil wirings CW5 and CW6) is about 135°.

Next, the coils CL7 and CL8 will be further described with reference to FIG. 6 to FIG. 10.

As also seen from FIG. 6, no pad is arranged inside the spiral of the coil CL7. An inner end portion (the inside of the spiral) of the coil CL7 (coil wiring CW7) is electrically connected through a via portion to a lead wiring HW2 arranged in a lower layer than the coil wiring CW7. This via portion is positioned between the coil wiring CW7 and the lead wiring HW2 to connect the coil wiring CW7 and the lead wiring HW2, corresponds to any one of the above-described via portions V2, V3, V4 and V5, and corresponds to the via portion V5 in FIG. 10. This via portion can be formed in a different step from that of the coil wiring CW7 or can be formed in the same step as that of the coil wiring CW7 integrally with the coil wiring CW7.

The lead wiring HW2 is connected to a wiring in the same layer as that of the lead wiring HW2, a wiring in an upper layer than the lead wiring HW2, or a wiring in a lower layer than the lead wiring HW2, and is connected to one corresponding to the transmission circuit TX1 formed inside the semiconductor chip CP1 through an internal wiring of the semiconductor chip CP1.

The coil CL7 is formed by winding the coil wiring CW7 connected to the lead wiring HW2 through the via portion a plurality of times. Note that it is preferable that the coil wiring CW7 does not wind in a region (position) just below the pad PD5, and the coil wiring CW7 winds so as to surround the region (position) just below the pad PD5.

In the case shown in FIG. 6, the coil CL7 is formed by winding the coil wiring CW7 connected to the lead wiring HW2 through the via portion around the region (position) just below the pad PD5 at a right-hand turn (clockwise). Since the coil wirings CW7 do not intersect with each other, the coil wiring CW7 connected to the lead wiring HW2 through the via portion is gradually shifted from the center of the spiral to the far side circulates for every right-hand turn (clockwise) winding around the region (position) just below the pad PD5.

Further, no pad is arranged inside the spiral of the coil CL8. An inner end portion (the inside of the spiral) of the coil CL8 (coil wiring CW8) is electrically connected to a lead wiring HW3 arranged in a lower layer than the coil wiring CW8 through a via portion. This via portion is positioned between the coil wiring CW8 and the lead wiring HW3 to connect the coil wiring CW8 and the lead wiring HW3, corresponds to any one of the above-described via portions V2, V3, V4 and V5, and corresponds to the via portion V5 in FIG. 10. This via portion can be formed in a different step from that of the coil wiring CW8 or can be formed in the same step as that of the coil wiring CW8 integrally with the coil wiring CW8.

The lead wiring HW3 is connected to a wiring in the same layer as the lead wiring HW3, a wiring in an upper layer than the lead wiring HW3 or a wiring in a lower layer than the lead wiring HW3, and is connected to one corresponding to the transmission circuit TX1 formed inside the semiconductor chip CP1 via an internal wiring of the semiconductor chip CP1.

The coil CL8 is formed by winding the coil wiring CW8 connected to the lead wiring HW3 through the via portion a plurality of times. Note that it is preferable that the coil wiring CW8 does not wind in a region (position) just below the pad PD6, and the coil wiring CW8 winds so as to surround the region (position) just below the pad PD6.

In the case shown in FIG. 6, the coil CL8 is formed by winding the coil wiring CW8 connected to the lead wiring HW3 via the via portion around the region (position) just below the pad PD6 at a right-hand turn (clockwise). Since the coil wirings CW8 do not intersect with each other, the coil wiring CW8 connected to the lead wiring HW3 through the via portion is gradually shifted from the center of the spiral to the far side for every right-hand turn (clockwise) winding around the region (position) just below the pad PD6.

The number of windings (the number of turns) of the coil CL7 (the coil winding CW7) and the number of windings (the number of turns) of the coil CL8 (the coil winding CW8) are changeable as necessary. However, it is preferable that the number of windings of the coil CL7 (the coil winding CW7) and the number of windings of the coil CL8 (the coil winding CW8) are the same. Further, it is preferable that a size (a diameter) of the coil CL7 and a size (a diameter) of the coil CL8 are the same. Moreover, it is preferable that a self-inductance of the coil CL7 and a self-inductance of the coil CL8 are the same. Also, it is preferable that a mutual inductance between the coils CL5 and CL7 which are magnetically coupled to each other and a mutual inductance between the coils CL6 and CL8 which are magnetically coupled to each other are the same.

Between the coil CL7 and the coil CL8, an outer end portion of the coil CL7 (the coil winding CW7) and an outer end portion of the coil CL8 (the coil winding CW8) are connected to the connection wiring (connecting wiring) HW4. That is, an inner end portion of the inner end portion (the inside of the spiral) and the outer end portion (the outside of the spiral) of the coil CL7 (the coil winding CW7) is connected to the lead wiring HW2 in a lower layer than that of the coil CL7 through the via portion, and the outer end portion thereof is connected to the lead wiring HW4 in the same layer as that of the coil CL7. Also, an inner end portion of the inner end portion (the inside of the spiral) and the outer end portion (the outside of the spiral) of the coil CL8 (the coil winding CW8) is connected to the lead wiring HW3 in a lower layer than that of the coil CL8 through the via portion, and the outer end portion thereof is connected to the connection wiring HW4 in the same layer as that of the coil CL8. Therefore, one end portion (the outer end portion) of the coil CL7 (the coil wiring CW7) and one end portion (the outer end portion) of the coil CL8 (the coil wiring CW8) are electrically connected to the connection wiring HW4.

Note that the inner end portion (the inside of the spiral) of the coil CL7 or the coil wiring CW7 and the outer end portion (the outside of the spiral) thereof are end portions positioned opposed to each other, and the inner end portion (the inside of the spiral) of the coil CL8 or the coil wiring CW8 and the outer end portion (the outside of the spiral) thereof are end portions opposed to each other.

The connection wiring HW4 is formed in the same layer as those of the coil CL7 (the coil wiring CW7) and the coil CL8 (the coil wiring CW8), and extends (is positioned) between the coil CL7 (the coil wiring CW7) and the coil CL8 (the coil wiring CW8) in a plan view.

The connection wiring HW4 is a wiring for electrically connecting the outer end portion of the coil CL7 (the coil wiring CW7) and the outer end portion of the coil CL8 (the coil wiring CW8). The connection wiring HW4 extends between the coil CL7 and the coil CL8 in a direction (more specifically, substantially orthogonal direction) intersecting a direction connecting the coil CL7 and the coil CL8 (corresponding to a direction connecting the center of the spiral of the coil CL7 and the center of spiral of the coil CL8).

The outer end portion of the coil CL7 (the coil wiring CW7) and the outer end portion of the coil CL8 (the coil wiring CW8) can be directly connected to each other without providing the connection portion HW4. As shown in FIG. 6, however, if the connection wiring HW4 having a wiring width larger than each wiring width of the coil wirings CW7 and CW8 is provided between the coil CL7 and the coil CL8 in a plan view, the wiring resistance can be reduced.

It is preferable that the connection wiring HW4 is provided just below the above-described lead wiring HW1. However, since it is required to connect the above-described lead wiring HW1 to the above-described pad PD7, it is required to extend (lead out) the lead wiring HW1 not only a portion between the coil CL5 and the coil CL6 but also further from a portion between the coil CL5 and the coil CL6 so as to reach the pad PD7. On the other hand, it is only required to provide the connection wiring HW4 between the coil CL7 and the coil CL8, and therefore, a wiring other than the coil wirings CW7 and CW8 is not required to be led out of the connection wiring HW4.

The coil CL7 and the coil CL8 connected in series correspond to the above-described coil CL1a on the primary side of the transformer TR1, and the coil CL5 and the coil CL6 connected in series correspond to the above-described coil CL2a on the secondary side of the transformer TR1. The lead wirings HW2 and HW3 are connected to the transmission circuit TX1 formed within the semiconductor chip CP1 through the internal wirings (M1 to M5) of the semiconductor chip CP1. The above-described pads PD5, PD6 and PD7 are connected to the reception circuit RX1 formed within the semiconductor chip CP2 through conductive connection members such as the above-described bonding wirings BW connected to these PD5, PD6 and PD7 and the internal wirings (M1 to M5) of the semiconductor chip CP2.

Therefore, when a signal for transmission is sent from the transmission circuit TX1 to the lead wirings HW2 and HW3, a current flows in the coil CL7 and coil CL8 connected in series between the lead wiring HW2 and the lead wiring HW3. At this time, since the coil CL7 and the coil CL8 are connected in series, a current flowing in the coil CL7 and a current flowing in the coil CL8 are substantially the same as each other in a magnitude. The coil CL5 and the coil CL7 are not connected by a conductor but are magnetically coupled to each other, while the coil CL6 and the coil CL8 are not connected by a conductor but are magnetically coupled to each other. Therefore, when a current flow in the coil CL7 and the coil CL8 on the primary side, induced electromotive forces are generated in the coil CL5 and the coil CL6 on the secondary side in accordance with change of the current, and an induction current flows.

Next, a current flowing in the coils CL7 and CL8 on the primary side will be further described.

As the case that a current flows in the coils CL7 and CL8 configuring the primary coil, there are two cases of a case that a current flows in the lead wiring HW3 from the lead wiring HW2 through the coil CL7 and the coil CL8 and a case that a current flows in the lead wiring HW2 from the lead wiring HW3 through the coil cL8 and the coil CL7.

In the case that a current flows in the lead wiring HW3 from the lead wiring HW2 through the coil CL7 and the coil CL8, the current flows in the coils CL7 and CL8 as follows. That is, in the coil CL7, a current flows from the inner end portion side (the end portion side connected to the lead wiring HW2 through the via portion) of the coil wiring CW7 to the outer end portion side (the end portion side connected to the connection wiring HW4) of the coil wiring CW7 through the coil wiring CW7. That is, in the coil CL7, a current flows from the inside of the spiral to the outside thereof. On the other hand, in the coil CL8, a current flows from the outer end portion side (the end portion side connected to the connection wiring HW4) of the coil wiring CW8 to the inner end portion side (the end portion side connected to the lead wiring HW3 via the via portion) of the coil CL8 through the coil wiring CW8. That is, in the coil CL8, a current flows from the outside of the spiral to the inside thereof.

On the other hand, in the case that a current flows in the lead wiring HW2 from the lead wiring HW3 through the coil CL8 and the coil CL7, the current flows in the coils CL8 and CL7 as follows. That is, in the coil CL8, a current flows from the inner end portion side (the end portion side connected to the lead wiring HW3 through the via portion) of the coil wiring CW8 to the outer end portion side (the end portion side connected to the connection wiring HW4) of the coil wiring CW8 through the coil wiring CW8. That is, in the coil CL8, a current flows from the inside of the spiral to the outside thereof. On the other hand, in the coil CL7, a current flows from the outer end portion side (the end portion side connected to the connection wiring HW4) of the coil wiring CW7 to the of the inner end portion side (the end portion side connected to the lead wiring HW2 through the via portion) of the coil CL7 through the coil wiring CW8. That is, in the coil CL7, a current flows from the outside of the spiral to the inside thereof.

Therefore, in the coil CL7 (the coil wiring CW7), when a current flows from the inner end portion side to the outer end portion side (namely, when a current flows from the inside of the spiral toward the outside thereof in the coil CL7), a current flows always from the outer end portion side to the inner end portion side in the coil CL8 (the coil wiring CW8) (namely, a current flows from the outside of the spiral toward the inside thereof). On the other hand, in the coil CL7 (the coil wiring CW7), when a current flows from the outer end portion side to the inner end portion side (namely, when a current flows from the outside of the spiral toward the inside thereof in the coil CL7), a current flows always from the inner end portion side to the outer end portion side in the coil CL8 (the coil wiring CW8) (namely, a current flows from the inside of the spiral toward the outside thereof).

Here, when the winding directions (directions of spirals) of the coil CL7 and the coil CL8 are paid attention to, both the coils CL7 and CL8 are in the right-hand turn winding which winds in right-hand turn (clockwise) from the inner end portions (the end portions on sides connected to the lead wirings HW2 and HW3) toward the outer end portions (the end portions on the sides connected to the connection wiring HW4) when the coils CL7 and cL8 are viewed from above. Therefore, in the coil CL7, when a current flows from the inner end portion side to the outer end portion side through the coil wiring CW7, the current flows in the coil CL7 in the right-hand turn (clockwise). On the other hand, when a current flows from the outer end portion side to the inner end portion side through the coil wiring CW7, the current flows in the coil CL7 in the left-hand turn (counterclockwise). Furthermore, similarly, also in the coil CL8, when a current flows from the inner end portion side to the outer end portion side through the coil wiring CW8, the current flows in the coil CL8 in the right-hand turn (clockwise). On the other hand, when a current flows from the outer end portion side to the inner end portion side through the coil wiring CW8, the current flows in the coil CL8 in the left-hand turn (counterclockwise).

When a current flows in the coil CL7, such magnetic flux penetrating through the coil CL7 (magnetic flux in a direction substantially perpendicular to a sheet of FIG. 6) is generated in the inside (the inside of the spiral) of the coil CL7. Further, when a current flows in the coil CL8, such magnetic flux penetrating through the coil CL8 (magnetic flux in a direction substantially perpendicular to a sheet showing FIG. 6) is generated in the inside (the inside of the spiral) of the coil CL8. At this time, the case that the current flows in the coil in a right-hand turn (clockwise) and the case that the current flows in the coil in a left-hand turn (counterclockwise) are opposed to each other in the direction of the generated magnetic flux.

As described above, when a current flows from the inner end portion side to the outer end portion side in the coil CL7 (the coil wiring CW7), a current flows necessarily from the outer end portion side to the inner end portion side in the coil CL8 (the coil wiring CW8). At this time, a current flows in a right-hand turn (clockwise) in the coil CL7, and a current flows in the left-hand turn (counterclockwise) in the coil CL8. At this time, the direction of the magnetic flux penetrating through the inside of the coil CL7 and the direction of the magnetic flux penetrating through the inside of the coil CL8 are opposed to each other. Specifically, in the coil CL7, a magnetic flux extending in a direction of penetrating through the sheet of FIG. 6 from a front surface side thereof to a back surface side thereof is generated inside the coil CL7 (inside the spiral) by the flowing of a current in a right-hand turn (clockwise). In the coil CL8, a magnetic flux extending in a direction of penetrating through the sheet of FIG. 6 from a back surface thereof to a front surface thereof is generated inside the coil CL8 (inside the spiral) by the flowing of a current in a left-hand turn (counterclockwise).

Also, as described above, when a current flows from the outer end portion side to the inner end portion side in the coil CL7 (the coil wiring CW7), a current flows necessarily from the inner end portion side to the outer end portion side in the coil CL8 (the coil wiring CW8). At this time, a current flows in a left-hand turn (counterclockwise) in the coil CL7, and a current flows in the right-hand turn (clockwise) in the coil CL8. At this time, the direction of the magnetic flux penetrating through the inside of the coil CL7 and the direction of the magnetic flux penetrating through the inside of the coil CL8 are opposed to each other. Specifically, in the coil CL7, a magnetic flux extending in a direction of penetrating through the sheet of FIG. 6 from a back surface side thereof to a front surface side thereof is generated inside the coil CL7 (inside the spiral) by the flowing of a current in a left-hand turn (counterclockwise). In the coil CL8, a magnetic flux extending in a direction of penetrating through the sheet of FIG. 6 from a front surface thereof to a back surface thereof is generated inside the coil CL8 (inside the spiral) by the flowing of a current in a right-hand turn (clockwise).

That is, when a current flow in the coil CL7 and the coil CL8 connected in series, the directions of the current flow in the coil CL7 and the coil CL8 are opposed to each other, so that the magnetic fluxes in directions opposed to each other are generated in the coil CL7 and the coil CL8.

Here, a direction of a current (or a direction of a current flow) in a coil indicates a current flowing in the coil in a right-hand turn (clockwise) or a current flowing in the coil in a left-hand turn (counterclockwise) when the coil (or the coil wiring) is viewed from above. Therefore, when two coils are described to be the same as each other in the direction of the current (the same as each other in the direction of the current flow) in the coil, the description corresponds to a state of the right-hand turn (clockwise) current flow in both two coils or a state of the left-hand turn (counterclockwise) current flow in both two coils when the two coils are viewed from above. Further, when two coils are described to be different from each other in the direction of the current (different from each other in the direction of the current flow) in the coil, the description corresponds to a state of the right-hand turn (clockwise) current flow in one of two coils and the left-hand turn (counterclockwise) current flow in the other when the two coils are viewed from above.

The coil CL5 and the coil CL7 are magnetically coupled to each other, and therefore, when a magnetic flux generated by a current flowing in the coil CL7 on the primary side changes, such induced electromotive force as cancelling the change of the magnetic flux is generated in the coil CL5 on the secondary side, so that an induction current flows. Similarly, the coil CL6 and the coil CL8 are magnetically coupled to each other, and therefore, when a magnetic flux generated by a current flowing in the coil CL8 on the primary side changes, such induced electromotive force as cancelling the change of the magnetic flux is generated in the coil CL6 on the secondary side, so that an induction current flows.

As described above, when a current flow in the coil CL7 and the coil CL8 connected in series, the coil CL7 and the coil CL8 are opposed to each other in the direction of current flow, and are also opposed to each other in the direction of the generated magnetic flux. Since the coil CL7 and the coil CL8 are connected in series, when a current flowing in the coil CL7 decreases, a current flowing in the coil CL8 also decreases. When a current flowing in the coil CL7 increases, a current flowing in the coil CL8 also increases. Therefore, when induction current flows in the coils CL5 and CL6 on the secondary side, a direction of a current flowing in the coil CL5 and a direction of a current flowing in the coil CL6 are opposed to each other.

First, such a case is assumed that a current is flowed from the lead wiring HW2 side to the lead wiring HW3 side through the coil CL7 and the coil CL8. In this case, regarding the coils CL7 and CL8 on the primary side, a right-hand turn current flows in the coil CL7 and a left-hand turn current flows in the coil CL8. At this time, during increase of a current flowing in the primary coil (CL7 and CL8), a left-hand turn induction current flows in the coil CL5 and a right-hand turn induction current flows in the coil CL6 on the secondary coil side (CL5 and CL6). On the other hand, during decrease of a current flowing in the primary coil (CL7 and CL8), a right-hand turn induction current flows in the coil CL5 and a left-hand turn induction current flows in the coil CL6 on the secondary coil side (CL5 and CL6).

Next, such a case is assumed that a current is flowed from the lead wiring HW3 side to the lead wiring HW2 side through the coil CL8 and the coil CL7. In this case, regarding the coils CL7 and CL8 on the primary side, a right-hand turn current flows in the coil CL8 and a left-hand turn current flows in the coil CL7. At this time, during increase of a current flowing in the primary coil (CL7 and CL8), a left-hand turn induction current flows in the coil CL6 and a right-hand turn induction current flows in the coil CL5 on the secondary coil (CL5 and CL6) side. On the other hand, during decrease of a current flowing in the primary coil (CL7 and CL8), a right-hand turn induction current flows in the coil CL6 and a left-hand turn induction current flows in the coil CL5 on the secondary coil side (CL5 and CL6).

That is, when induction currents flow in the coils CL5 and CL6 on the secondary side, the direction of a current (an induction current) flowing in the coil CL5 and the direction of a current (an induction current) flowing in the coil CL6 are opposed (reverse) to each other. Therefore, when induction currents flow in the coils CL5 and CL6 on the secondary side, the direction of a magnetic flux generated so as to penetrate through the coil CL5 by the induction current flowing the coil CL5 and the direction of a magnetic flux generated so as to penetrate through the coil CL6 by the induction current flowing the coil CL6 are opposed (reverse) to each other.

The coil CL5 and the coil CL6 are connected in series between the pad PD5 and the pad PD6. Here, when the winding directions (directions of the spirals) of the coil CL5 and the coil CL6 are paid attention to, both the coils CL5 and CL6 wind from the inner end portions thereof to the outer end portions thereof in a right-hand turn (clockwise). That is, both the coil CL5 and CL6 are in the right-hand turn.

Therefore, in the coil CL5, when a current flows in the coil CL5 in a right-hand turn (clockwise), the current flows from the inner end portion side (namely, the pad PD5 side) to the outer end portion side (namely, the lead wiring HW1 side) through the coil CW5. On the other hand, in the coil CL5, when a current flows in the coil CL5 in a left-hand turn (counterclockwise), the current flows from the outer end portion side (namely, the leading wiring HW1 side) to the inner end portion side (namely, the pad PD5 side) through the coil CW5. Further, in the coil CL6, when a current flows in the coil CL6 in a right-hand turn (clockwise), the current flows from the inner end portion side (namely, the pad PD6 side) to the outer end portion side (namely, the lead wiring HW1 side) through the coil CW6. On the other hand, in the coil CL6, when a current flows in the coil CL6 in a left-hand turn (counterclockwise), the current flows from the outer end portion side (namely, the leading wiring HW1 side) to the inner end portion side (namely, the pad PD6 side) through the coil CW6.

Therefore, when induction currents flow in the coils CL5 and CL6 configuring the secondary coil, there are two cases of a case of a current flow in the coil CL5 in a right-hand turn and a current flow in the coil CL6 in a left-hand turn, and a case of a current flow in the coil CL5 in a left-hand turn and a current flow in the coil CL6 in a right-hand turn. In the case of the current flow in the coil CL5 in a right-hand turn and the current flow in the coil CL6 in a left-hand turn, the current flows from the pad PD5 to the pad PD6 through the coil CL5, the lead wiring HW1 and the coil CL6. On the other hand, in the case of the current flow in the coil CL5 in a left-hand turn and the current flow in the coil CL6 in a right-hand turn, the current flows from pad PD6 to the pad PD5 through the coil CL6, the lead wiring HW1 and the coil CL5. Note that the lead wiring HW1 between the coil CL5 and the coil CL6 is set at a fixed potential (a ground potential, a GND potential, a power source potential or others) since a fixed potential (a ground potential, a GND potential, a power source potential or others) is supplied to the pad PD7.

That is, in the present embodiment, the directions of the spirals of the coil CL7 and the coil CL8 are designed so that the directions of currents flowing in the coil CL7 and the coil CL8 are opposed to each other when a current flow in the coil CL7 and the coil CL8 connected in series. That is, the coil CL7 and the coil CL8 are connected in series between the lead wiring HW2 and the lead wiring HW3. The directions of the spirals of the coil CL7 and the coil CL8 are designed so that the directions of currents flowing in the coil CL7 and the coil CL8 are opposed to each other when a current flowing from the lead wiring HW2 to the lead wiring HW3 through the coils CL7 and CL8, and so that the directions of currents flowing in the coil CL7 and the coil CL8 are opposed to each other when a current flows from the lead wiring HW3 to the lead wiring HW2 through the coils CL8 and CL7. Therefore, the coil CL7 and the coil CL8 are set to be the same as each other in the winding direction. In FIG. 6, both the coil CL7 and the coil CL8 are set in a right-hand turn. However, as another aspect, both the coil CL7 and the coil CL8 can be set in a left-hand turn.

Further, the same goes for the secondary coil. That is, the directions of the spirals of the coil CL5 and the coil CL6 are designed so that the directions of currents (induction currents) flowing in the coil CL5 and the coil CL6 are opposed to each other when a current (an induction current) flow in the coil CL5 and the coil CL6 connected in series. That is, the coils CL5 and CL6 are connected in series between the pad PD5 and the pad PD6. The directions of the spirals of the coils CL5 and CL6 are designed so that the directions of the currents flowing in the coil CL5 and CL6 are opposed to each other when a current flows from the pad PD5 to the pad PD6 side through the coils CL5 and CL6, and so that the directions of the currents flowing in the coil CL5 and CL6 are opposed to each other when a current flows from the pad PD6 to the pad PD5 through coils CL6 and CL5. Therefore, the coil CL5 and the coil CL6 are set so as to be the same as each other in the winding direction. In FIG. 5, both the coil CL5 and the coil CL6 are set in a right-hand turn. However, as another aspect, both the coil CL5 and the coil CL6 can be set in a left-hand turn.

Thus, the coil CL5 and the coil CL6 are designed so that the current flows therein in directions opposed to each other, and the coil CL7 and the coil CL8 are designed so that the current flows therein in directions opposed to each other. In this manner, when a signal is transmitted from the transmission circuit TX1 to the reception circuit RX1 via the transformer TR1, the direction of the current flowing in the coil CL7 and the direction of the current flowing in the coil CL8 are opposed to each other on the primary side, and the direction of the current (induction current) flowing in the coil CL5 and the direction of the current (induction current) flowing in the coil CL6 are opposed to each other on the secondary side. In this manner, when a signal is transmitted from the transmission circuit TX1 to the reception circuit RX1 via the transformer TR1, the direction of the magnetic flux generated so as to penetrate through the magnetically-coupled coils CL5 and CL7 and the direction of the magnetic flux generated so as to penetrate through the magnetically-coupled coils CL6 and CL8 can be set to be opposed to each other.

Further, the above-described transformer TR2 of the semiconductor chip CP2 can be formed as similar to the transformer TR1 of the semiconductor chip CP1. Therefore, also in the semiconductor chip CP2, the above-described coils CL7 and CL8 are formed as the above-described coil CL1b, the above-described coils CL5 and CL6 are formed as the above-described coil CL2b, and the above-described pads PD5, PD6 and PD7 connected to the coils CL5 and CL6 can be formed.

<Regarding Study Examples>

Figure 12:
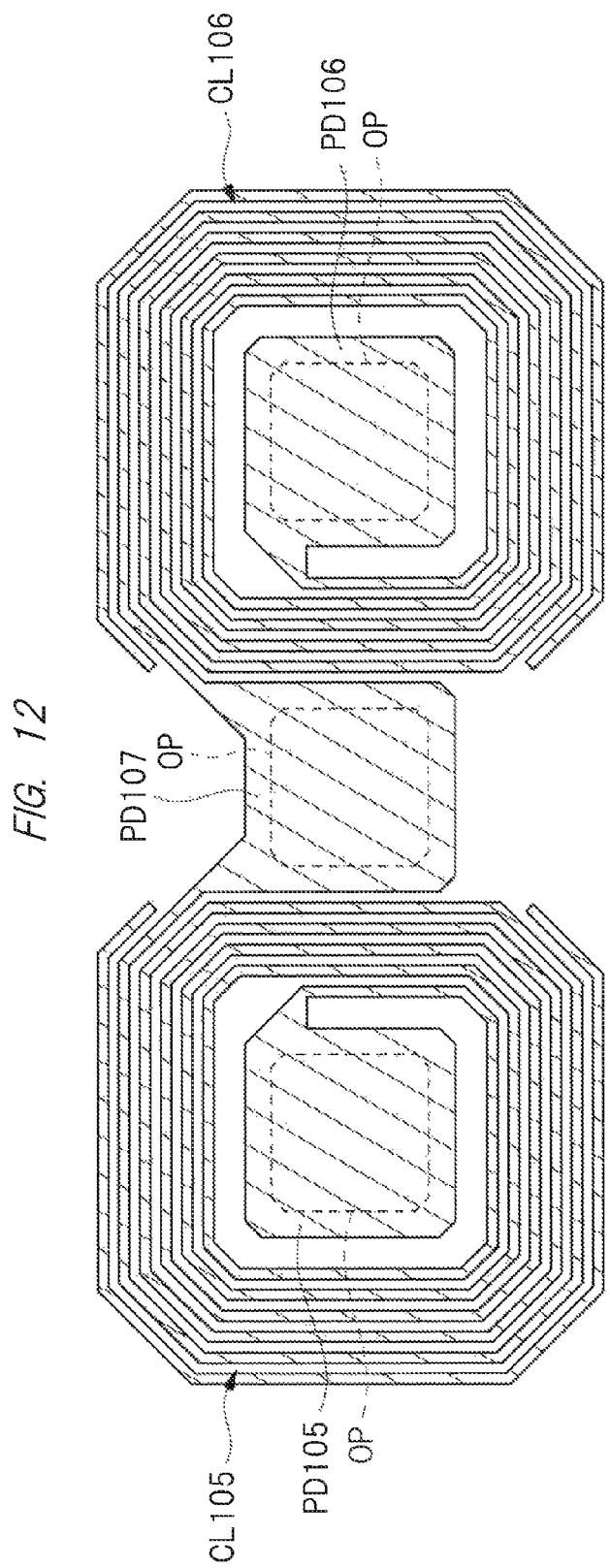
FIG. 12 is a plan view of a principal part of a semiconductor chip of a first study example.
Figure 13:
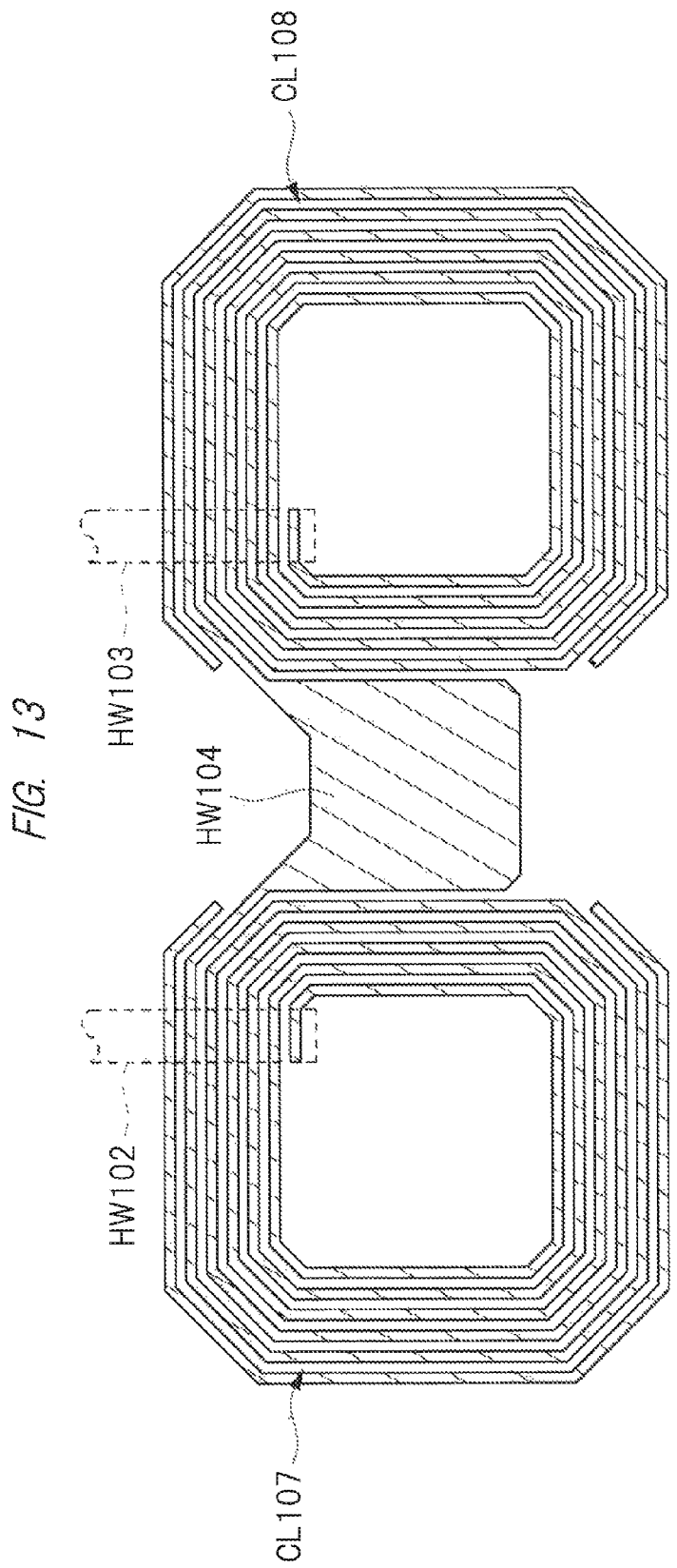
FIG. 13 is a plan view of a principal part of the semiconductor chip of the first study example.

Each of FIG. 12 and FIG. 13 is a plan view of a principal part of a semiconductor chip of a first study example, each of which corresponds to each of the above-described FIG. 5 and FIG. 6.

As shown in FIG. 12 and FIG. 13, the semiconductor chip of the first study example has a coil CL105 corresponding to the above-described coil CL5 and a coil CL106 corresponding to the above-described coil CL6 in the same layer, and has a coil CL107 corresponding to the above-described coil CL7 and a coil CL108 corresponding to the above-described coil CL8 in the same layer which is in the same layer lower than the former layer. The coil CL107 is arranged just below the coil CL105, and the coil CL105 and the coil CL107 are not connected to each other by a conductor but are magnetically coupled to each other. Further, the coil CL108 is arranged just above the coil CL106, and the coil CL106 and the coil CL108 are not connected by a conductor but are magnetically coupled to each other.

In the first study example, the coil CL105 and the coil CL106 are connected in series between a pad PD105 corresponding to the above-described pad PD5 and a pad PD106 corresponding to the above-described pad PD6. A pad PD107 corresponding to the above-described pad PD7 is electrically connected between the coil CL105 and the coil CL106. The pad PD105 is arranged inside a spiral of the coil CL105 as similar to the above-described pad PD5, and the pad PD106 is arranged inside a spiral of the coil CL106 as similar to the pad PD6. However, while the above-described pad PD7 is not arranged between the coil CL5 and the coil CL6, the pad PD107 is arranged between the coil CL105 and the coil CL106. A distance (space) between the coil CL105 and the coil CL016 is spaced away from each other by the arrangement degree of the pad PD107 between the coil CL105 and the coil CL106.

An inner end portion of the coil CL105 is connected to the pad PD105, and an outer end portion of the coil CL105 is connected to the pad PD107. Further, an inner end portion of the coil CL106 is connected to the pad PD106, and an outer end portion of the coil CL106 is connected to the pad PD107.

While the winding direction of the coil CL105 is a right-hand turn which is the same as the winding direction of the above-described coil CL5, the winding direction of the coil CL106 is a left-hand turn which is different from the winding direction of the above-described coil CL6.

No pad is arranged inside the spiral of the coil CL107, and an inner end portion of the inside of the coil CL107 is electrically connected to a lead wiring HW102 corresponding to the above-described lead wiring HW2 through a via portion. Further, no pad is arranged inside the spiral of the coil CL108, and an inner end portion of the coil CL108 is electrically connected to a lead wiring HW103 corresponding to the above-described lead wiring HW3 through a via portion.

An outer end portion of the coil CL107 and an outer end portion of the coil CL108 are connected to a connection wiring HW104 provided between the coil CL107 and the coil CL108, and they are electrically connected to each other through the connection wiring HW104.

While the winding direction of the coil CL107 is the right-hand turn which is the same as the winding direction of the above-described coil CL7, the winding direction of the coil CL108 is a left-hand turn which is opposed to the winding direction of the above-described coil CL8.

In such a first study example, when a current flows in the coil CL107 and the coil CL108 on the primary side, induced electromotive forces are generated in the coil CL105 and the coil CL106 on the secondary side in accordance with change of the current, so that an induction current flows. By utilizing this, a signal can be transmitted from the transmission circuit (this transmission circuit is formed within the semiconductor chip formed with the coils CL105 to CL108) connected to the coils CL107 and CL108 to the reception circuit (this reception circuit is formed in a semiconductor chip other than the semiconductor chip formed with the coils CL105 to CL108) connected to the pad PD105, PD106 and PD107.

However, in the first study example, when a signal is transmitted from the transmission circuit to the reception circuit through the coils CL105 to CL108, the direction of a current flowing in the coil CL107 and the direction of a current flowing in the coil CL108 become the same direction as each other on the primary side, and the direction of a current (induction current) flowing in the coil CL105 and a current (induction current) flowing in the coil CL106 become the same direction as each other on the secondary side. This point will be further described.

As the case that a current flows in the coils CL107 and CL108 configuring the primary coil, there are two cases of a case that a current flows from the lead wiring HW102 to the lead wiring HW103 through the coil CL108 and the coil CL107 and a case that a current flows from the lead wiring HW103 to the lead wiring HW102 through the coil CL108 and the coil CL107. The winding direction of the coil CL107 and the direction of the coil CL108 are directions opposed to each other. In the case shown in FIG. 13, the coil CL107 is in a right-hand turn while the coil CL108 is in a left-hand turn. Therefore, when a current flows from the lead wiring HW102 to the lead wiring HW103 through the coils CL107 and CL108, the current flows in the coil CL107 in a right-hand turn (clockwise) since a current flows from the inside of the spiral to the outside of the spiral in the right-hand turn coil CL107, and the current flows in the coil CL108 in a right-hand turn (clockwise) since a current flows from the outside of the spiral to the inside of the spiral in the left-hand turn coil CL108. Further, when a current flows from the lead wiring HW103 to the lead wiring HW102 through the coils CL108 and CL107, the current flows in the coil CL108 in a left-hand turn (counterclockwise) since a current flows from the inside of the spiral to the outside of the spiral in the left-hand turn coil CL108, and the current flows in the coil CL107 in a left-hand turn (counterclockwise) since a current flows from the outside of the spiral to the inside of the spiral in the right-hand turn coil CL107.

Therefore, when a current flows in the coil CL107 and the coil CL108 connected in series, the directions of currents flowing in the coil cL107 and the coil CL108 become the same as each other, so that magnetic fluxes in the same direction are generated in the coil CL107 and the coil CL108.

Since the CL105 and the coil CL107 are magnetically coupled to each other, when a magnetic flux generated by a current flowing in the coil CL107 on the primary side changes, such induced electromotive force as cancelling the change of the magnetic flux is generated in the coil CL105 on the secondary side, so that an induced current flows. Similarly, since the CL106 and the coil CL108 are magnetically coupled to each other, when a magnetic flux generated by a current flowing in the coil CL108 on the primary side changes, such induced electromotive force as cancelling the change of the magnetic flux is generated in the coil CL106 on the secondary side, so that an induced current flows.

Therefore, when a current flows in the coil CL107 and the coil CL108, the directions of the current in the coil CL107 and the coil CL108 become the same as each other, and magnetic fluxes in the same direction as each other are generated in the coil CL107 and the coil CL108, so that the direction of an induction current generated in the coil CL105 and the direction of an induction current generated in the coil CL106 become the same as each other. That is, an induction current in a right-hand turn (clockwise) also flows in the coil CL106 when an induction current in a right-hand turn (clockwise) flows in the coil CL105, and an induction current in a left-hand turn (counterclockwise) also flows in the coil CL106 when an induction current in a left-hand turn (counterclockwise) flows in the coil CL105. When an induction current in a right-hand turn (clockwise) flows in the coils CL105 and CL106, a current flows from the inside of the spiral (the pad PD105 side) to the outside thereof (the pad PD107 side) in the right-hand turn coil CL105, and a current flows from the outside of the spiral (the pad PD107 side) to the inside thereof (the pad PD106 side) in the left-hand turn coil CL106. When an induction current in a left-hand turn (counterclockwise) flows in the coils CL105 and CL106, a current flows the inside of the spiral (the pad PD106 side) to the outside thereof (the pad PD107 side) in the left-hand turn coil CL106, and a current flows from the outside of the spiral (the pad PD107 side) to the inside thereof (the pad PD105 side) in the right-hand turn coil CL105.

Thus, in the first study example, when a signal is transmitted from the transmission circuit to the reception circuit through the coils CL105 to CAL108, the direction of a current flowing in the coil CL107 and the direction of a current flowing in the coil CL108 become the same direction on the primary side, and the direction of a current (induction current) flowing in the coil CL105 and the direction of a current (induction current) flowing in the coil CL106 become the same direction on the secondary side. Therefore, when a signal is transmitted from the transmission circuit to the reception circuit through the coils CL105 to CL108, the direction of a magnetic flux generated so as to penetrate through the coil CL105 and the coil CL107 magnetically coupled and the direction of a magnetic flux generated so as to penetrate through the coil CL106 and the coil CL108 magnetically coupled become the same direction.

By the study made by the inventors, it has been found that such a first study example has the following problem.

On the secondary coil side, the direction of a current (induction current) flowing in the coil CL105 and the direction of a current (induction current) flowing in the coil CL106 become the same direction. Therefore, the direction of a magnetic flux generated so as to penetrate through the coil CL105 by the induction current flowing in the coil CL105 and the direction of a magnetic flux generated so as to penetrate through the coil CL106 by the induction current flowing in the coil CL106 become the same as each other. However, when the directions of flowing induction currents in the coil CL105 and the coil CL106 are the same as each other, the coils CL105 and CL106 act so as to cancel their magnetic fluxes (magnetic fields) from each other.

That is, a magnetic flux (a magnetic field) generated outside the coil CL105 by the induction current flowing in the coil CL105 acts so as to cancel the magnetic flux (magnetic field) penetrating through the coil CL106 and generated by the induction current flowing in the coil CL106. Further, a magnetic flux (a magnetic field) generated outside the coil CL106 by the induction current flowing in the coil CL106 acts so as to cancel the magnetic flux (magnetic field) penetrating through the coil CL105 and generated by the induction current flowing in the coil CL105.

Further, on the primary coil side, the direction of a current flowing in the coil CL107 and the direction of a current flowing in the coil CL108 become the same direction. Therefore, the direction of the magnetic flux generated so as to penetrate through the coil CL107 by the current flowing in the coil CL107 and the direction of the magnetic flux generated so as to penetrate through the coil CL108 by the current flowing in the coil CL108 becomes the same as each other. However, when the directions of the flowing currents in the coil CL107 and CL108 are the same as each other, the coils CL107 and CL108 act so as to cancel their magnetic fluxes (magnetic fields) from each other.

That is, the magnetic flux (magnetic field) generated outside the coil CL107 by the current flowing in the coil CL107 acts so as to cancel the magnetic flux (magnetic field) penetrating the coil CL108 generated by the current flowing in the coil CL108. Further, the magnetic flux (magnetic field) generated outside the coil CL108 by the current flowing in the coil CL108 acts so as to cancel the magnetic flux (magnetic field) penetrating the coil CL107 generated by the current flowing in the coil CL107.

Therefore, loss occurring when a signal is transmitted from the transmission circuit to the reception circuit through the coils CL105 to CL108 increases, and therefore, the intensity of the signal received by the reception circuit from the coils CL105 and CL106 on the secondary side decreases. This causes decrease in the performance of the semiconductor device.

Regarding Main Features and Effects of Present Embodiment

The semiconductor chip CP1 of the present embodiment has the coil CL5, the coil CL6, the coil CL7, the coil CL8, the pad PD5, the pad PD6 and the pad PD7 formed on the semiconductor substrate (SB1) via the insulation layers (RS, IL). The coil CL5 and the coil CL6 are electrically connected in series between the pad PD5 and the pad PD6, and the pad PD7 is electrically connected between the coil CL5 and the coil CL6. The coil CL7 and the coil CL8 are electrically connected in series. The coil CL5 is arranged above the coil CL7 so that the coil CL5 and the coil CL7 are not connected by a conductor but are magnetically coupled to each other, while the coil CL6 is arranged above the coil CL8 so that the coil CL6 and the coil CL8 are not connected by a conductor but are magnetically coupled to each other. When a current is flowed in the coil CL7 and the coil CL8 connected in series, the directions of induction currents flowing in the coil CL5 and the coil CL6 are directions opposed to each other in the coil CL5 and the coil CL6.

In the present embodiment, the directions of the flowing induction currents are configured to be opposed to each other in the coil CL5 and the coil CL6 when induction currents flow in the coil CL5 and CL6. That is, the induction current flows in one of the coils CL5 and CL6 in a right-hand turn (clockwise), while the induction current flows in the other in a left-hand turn (counterclockwise). Therefore, when induction currents flow in the coil CL5 and CL6, the direction of the magnetic flux generated so as to penetrate through the coil CL5 by the induction current flowing in the coil CL5 and the direction of the magnetic flux generated so as to penetrate through the coil CL6 by the induction current flowing in the coil CL6 become directions opposed to each other. In this manner, such action of the coils CL5 and CL6 as cancelling their magnetic fluxes (magnetic fields) from each other can be suppressed or prevented.

That is, if the directions of the magnetic flux (magnetic field) penetrating through the coil CL5 and the magnetic flux (magnetic field) penetrating through the coil CL6 are opposed to each other, the magnetic flux (magnetic field) penetrating through the coil CL5 and the magnetic flux (magnetic field) penetrating through the coil CL6 can connect to each other in a loop manner (that is, can be closed in a loop manner). Therefore, the cancellation of the magnetic flux (magnetic field) generated by the induction current flowing in the coil CL5 and the magnetic flux (magnetic field) generated by the induction current flowing in the coil CL6 from each other can be suppressed or prevented.

That is, as similar to the above-described first study example, the coils CL105 and CL106 act so as to cancel their magnetic fluxes (magnetic fields) from each other in the case of the same direction in the direction of the magnetic flux generated so as to penetrate through the coil CL105 by the induction current of the coil CL105 and the direction of the magnetic flux generated so as to penetrate through the coil CL106 by the induction current of the coil CL106 when induction currents flow in the coil CL105 and CL106. On the other hand, in the present embodiment, such action of the coils CL5 and CL6 as cancelling their magnetic fluxes (magnetic fields) from each other can be suppressed or prevented by providing the opposite direction in the direction of the magnetic flux generated so as to penetrate through the coil CL5 by the induction current of the coil CL5 and the direction of the magnetic flux generated so as to penetrate through the coil CL6 by the induction current of the coil CL6 to each other when the induction currents flow in the coil CL5 and CL6. Therefore, in the present embodiment, when a signal is transmitted to the primary coil (CL7, CL8) to the secondary coil (CL5, CL6) using induction currents, a signal intensity (a reception signal intensity) detected by the secondary coil (CL5, CL6) can be improved. Therefore, the performance of the semiconductor chip can be improved, which can result in improvement in performance of a semiconductor device including the semiconductor chip.

Further, in the present embodiment, the coils CL7 and CL8 are configured so that the directions of currents flowing in the coil CL7 and the coil CL8 are opposed to each other when a current is flowed in the coil CL7 and the coil CL8 connected in series. That is, a current flows in one of the coils CL7 and CL8 in a right-hand turn (clockwise), and a current flows in the other in a left-hand turn (counterclockwise). Therefore, when a current flows in the coils CL7 and CL8, the direction of the magnetic flux generated so as to penetrate through the coil CL7 by the current flowing in the coil CL7 and the direction of the magnetic flux generated so as to penetrate through the coil CL8 by the current flowing in the coil CL8 are opposed to each other. In this manner, such action of the coils CL7 and CL8 as cancelling their magnetic fluxes (magnetic fields) from each other can be suppressed or prevented.

Further, if the directions of currents flowing in the coils CL7 and the coil CL8 are configured so as to be opposed to each other when a current is flowed in the coil CL7 and the coil CL8 connected in series, the directions of the induction currents flowing in the coil CL5 and the coil CL6 become are opposed to each other when induction currents flow in the coil CL5 and the coil CL6. In this manner, the direction of the magnetic flux generated so as to penetrate through the coil CL7 by the current of the coil CL7 and the direction of the magnetic flux generated so as to penetrate through the coil CL8 by the current of the coil CL8 are opposed to each other, and the direction of the magnetic flux generated so as to penetrate through the coil CL5 by the induction current of the coil CL5 and the direction of the magnetic flux generated so as to penetrate through the coil CL6 by the induction current of the coil CL6 are opposed to each other. By adopting such a configuration, such action of the transformer composed of the coils CL5 and CL6 and the transformer composed of the coils CL7 and CL8 acting as cancelling their magnetic fluxes (magnetic fields) from each other can be suppressed or prevented. Therefore, in the present embodiment, when a signal is transmitted from the primary coil (CL7, CL8) to the secondary coil (CL5, CL6) using induction currents, a signal intensity (reception signal intensity) detected by the secondary coil (CL5, CL6) can be appropriately improved. Therefore, the performance of the semiconductor chip can be appropriately improved, which can result in appropriate improvement in the performance of the semiconductor device including the semiconductor chip.

Further, in the present embodiment, the pad PD5 is arranged inside (inside the spiral of) the coil CL5 (coil wiring CW5), while the pad PD6 is arranged inside (inside the spiral of) the coil CL6 (coil wiring CW6).

When the pad PD 5 is arranged outside the coil CL5 (coil wiring CW5), it is required to provide the lead wiring for connecting the inner end portion of the coil CL5 and the pad PD5 (the lead wiring crosses the coil wiring CW5) in a lower layer than the coil CL5. However, when such a lead wiring is formed, there is such a possibility that a breakdown voltage between the lead wiring and the coil CL7 has a dominant influence on a breakdown voltage of the transformer, and therefore, there is a risk of decrease in the breakdown voltage of the transformer.

On the other hand, in the present embodiment, by arranging the pad PD5 inside the coil CL5 (the coil wiring CW5), the inner end portion of the coil CL5 can be connected to the pad PD5 without forming a lead wiring (the lead wiring for connecting the pad PD5 and the coil CL5). Therefore, since it is not required to form a lead wiring for the pad PD5 in the lower layer than the coil CL5 (the coil wiring CW5), a breakdown voltage between the coil CL5 and the coil CL7 has a dominant influence on a breakdown voltage of the transformer, so that the breakdown voltage of the transformer can be improved. Further, since it is not required to form the lead wiring for the pad PD5, it is not required to form a via portion for connection to the lead wiring, so that a manufacturing cost or a manufacturing time can also be suppressed.

Further, in the present embodiment, by arranging the pad PD6 inside the coil CL6 (the coil wiring CW6), the inner end portion of the coil CL6 can be connected to the pad PD6 without forming a lead wiring (the lead wiring for connecting the pad PD6 and the coil CL6). Therefore, since it is not required to form a lead wiring for the pad PD6 in a lower layer than the coil CL6 (the coil wiring CW6), a breakdown voltage between the coil CL6 and the coil CL8 has a dominant influence on a breakdown voltage of the transformer, so that the breakdown voltage of the transformer can be improved. Further, since it is not required to form the lead wiring for the pad PD6, it is not required to form a via portion for connection to the lead wiring, so that a manufacturing cost or a manufacturing time can also be suppressed.

Further, in the present embodiment, the coil CL5 and the coil CL6 are formed in the same layer, and the coil CL7 and the coil CL8 are formed in the same layer. The coils CL7 and CL8 are formed in the lower layer than the coil CL5 and CL6. By arranging the coils CL5 and CL6 to be connected to the pads PD5, PD6 and PD7 among the coils CL5, CL6 and the coils CL7, CL8 on an upper layer side, the coils CL5 and CL6 are easily connected to the pads PD5, PD6 and PD7. Further, by forming the coil CL5 and the coil CL6 in the same layer, and forming the coil CL7 and the coil CL8 in the same layer, a mutual inductance between the coils CL5 and CL7 and a mutual inductance between the coils CL6 and CL8 are easily coincided with each other. Therefore, a signal is easily appropriately transmitted through the coils CL5, CL6, CL7 and CL8. Further, the number of layers required to form the coils CL5, CL6, CL7 and CL8 can be suppressed. Therefore, the semiconductor chip is easily designed. This configuration is also advantageous for downsizing of the semiconductor chip.

Further, in the present embodiment, the pad PD7 is arranged in a region other than the region positioned between the coil CL5 and the coil CL6. The lead wiring HW1 for connecting the coil CL5 and the coil CL6 to the pad PD7 is formed, and the lead wiring HW1 extends from a portion between the coil CL5 and the coil CL6 to the pad PD7. In this manner, the coil CL5 and the coil CL6 can be appropriately connected to the pad PD7.

Further, it is preferable that the width W1 of the lead wiring HW1 is made larger than the wiring widths of the coil CL5 and the coil CL6 (namely, the width W2 of the coil wiring CW5 and the width W2 of the coil wiring CW6) (W1>W2). In this manner, the resistance of the lead wiring HW1 can be reduced without affecting the number of windings of each of the coil CL5 and CL6.

Figure 14:
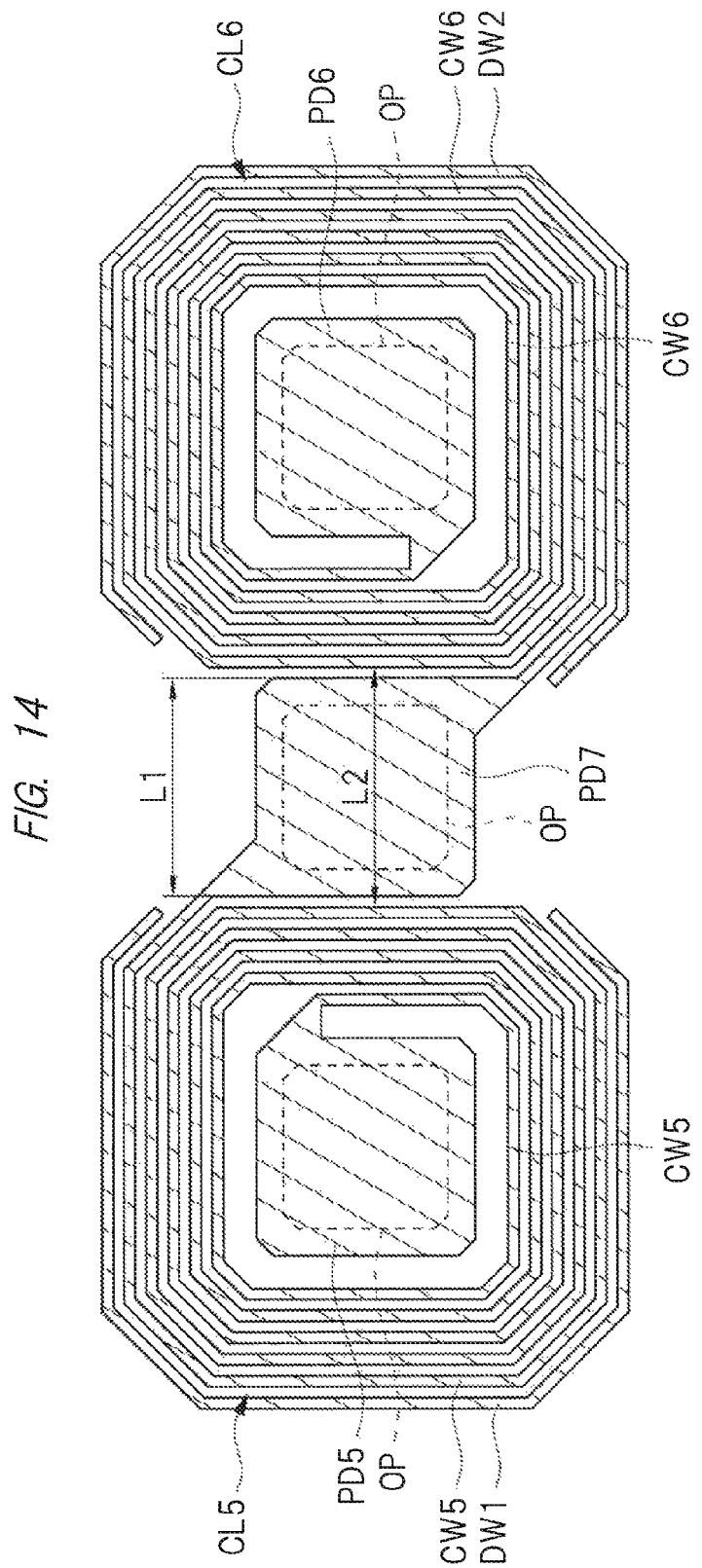
FIG. 14 is a plan view of a principal part of the semiconductor chip of the first study example.
Figure 15:
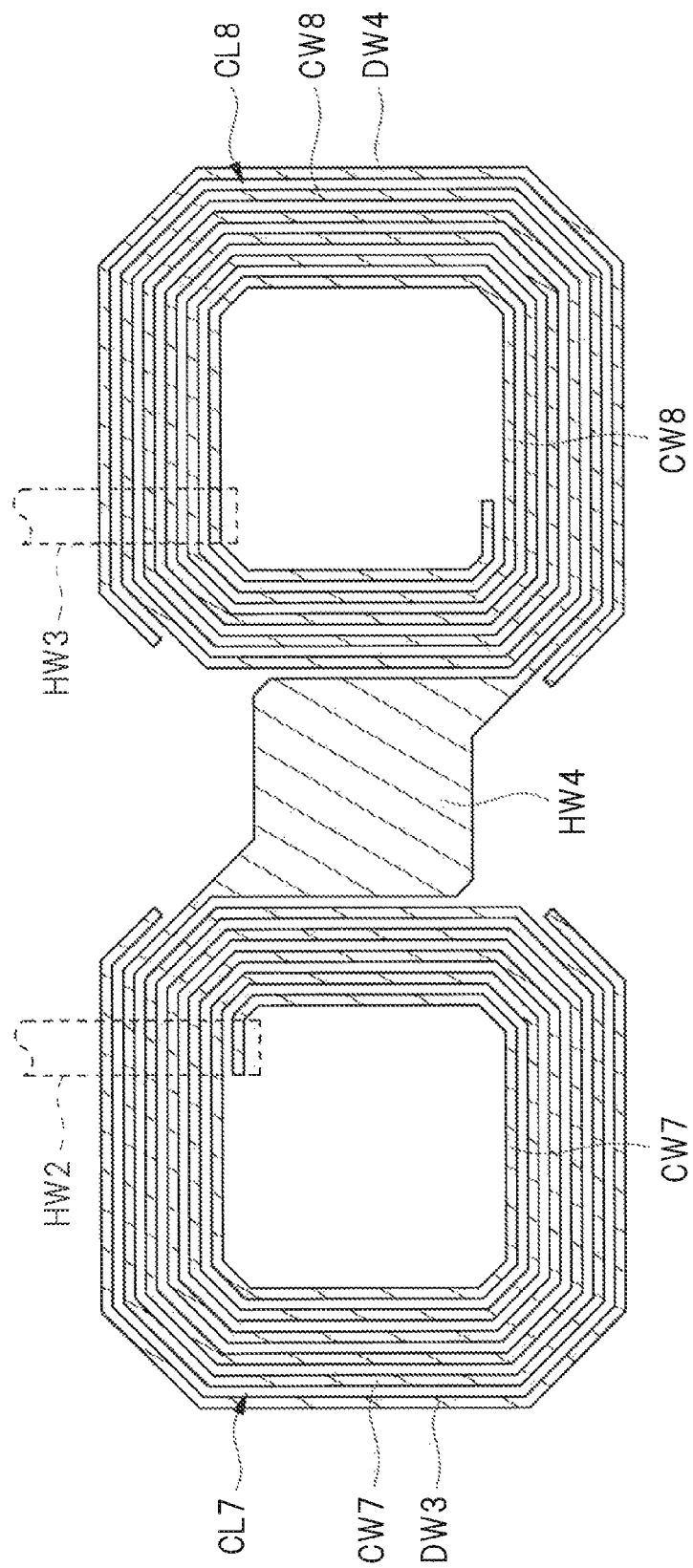
FIG. 15 is a plan view of a principal part of the semiconductor chip of the first study example.

Each of FIG. 14 and FIG. 15 is a plan view of a principal part showing a first modified embodiment of the semiconductor chip CP1 of the present embodiment, and they correspond to the above-described FIG. 5 and FIG. 6, respectively.

A difference of the first modified embodiment shown in FIG. 14 and FIG. 15 from the embodiment shown in FIG. 5 and FIG. 6 lies in that the pad PD7 is disposed between the coil CL5 and the coil CL6 in a plan view. Therefore, in the first modified embodiment shown in FIG. 14 and FIG. 15, the pad PD5, the pad PD7, and the pad PD6 are arranged in this order in a column (on a straight line).

In the first modified embodiment shown in FIG. 14 and FIG. 15, a distance (space) between the coil CL5 and the coil CL6 is spaced away from each other more than those in FIG. 5 and FIG. 6 by the arrangement degree of the pad PD7 between the coil CL5 and the coil CL6. The coil CL7 is arranged just below the coil CL5, and the coil CL8 is arranged just below the coil CL6. Therefore, in the first modified embodiment shown in FIG. 14 and FIG. 15, a distance (space) between the coil CL7 and the coil CL8 is spaced away from each other more than those in FIG. 5 and FIG. 6 by the arrangement degree of the pad PD7 between the coil CL5 and the coil CL6. Further, in the first modified embodiment shown in FIG. 14 and FIG. 15, the pad PD7 is arranged between the coil CL5 and the coil CL6, and therefore, the above-described lead wiring HW1 is not required, the outer end portion (the outside of the spiral) of the coil CL5 is directly connected to the pad PD7, and the outer end portion (the outside of the spiral) of the coil CL6 is directly connected to the pad PD7. Further, in the first modified embodiment shown in FIG. 14 and FIG. 15, the size (width) of the connection wiring HW4 becomes larger than those in FIG. 5 and FIG. 6 by the degree of the spaced distance between the coil CL7 and the coil CL8.

The first modified embodiment shown in FIG. 14 and FIG. 15 is basically the same as the embodiment shown in FIG. 5 and FIG. 6 in other points, and therefore, repetitive explanation thereof is omitted here.

As similarly to the case shown in FIG. 5 and FIG. 6, also in the case of the first modified embodiment shown in FIG. 14 and FIG. 15, when induction currents flow in the coil CL5 and CL6, directions of the flowing induction currents in the coil CL5 and the coil CL6 are opposed to each other. That is, an induction current flows in a right-hand turn (clockwise) in one of the coils CL5 and CL6, while an induction current flows in a left-hand turn (counterclockwise) in the other. Therefore, when induction currents flows in the coils CL5 and CL6, the direction of a magnetic flux generated so as to penetrate through the coil CL5 by the current flowing in the coil CL5 and the direction of a magnetic flux generated so as to penetrate through the coil CL6 by the current flowing in the coil CL6 are opposed to each other (reversed to each other). In this manner, such an action of the coils CL5 and CL6 as cancelling their magnetic fluxes (magnetic fields) from each other can be suppressed or prevented.

Further, also in the case of the first modified embodiment shown in FIG. 14 and FIG. 15 as similar to the case shown in FIG. 5 and FIG. 6, in the coils CL7 and CL8, when a current is flowed in the coil CL7 and the coil CL8 connected in series, the directions of currents flowing in the coil CL7 and the coil CL8 are opposed to each other (reversed to each other). That is, a current flows in a right-hand turn (clockwise) in one of the coils CL7 and CL8, while a current flows in a left-hand turn (counterclockwise) in the other. Therefore, when currents flow in the coils CL7 and CL8, the direction of a magnetic flux generated so as to penetrate through the coil CL7 by the current flowing in the coil CL7 and the direction of a magnetic flux generated so as to penetrate through the coil CL8 by the current flowing in the coil CL8 are opposed to each other (reversed to each other). In this manner, such action of the coils CL7 and CL8 as cancelling their magnetic fluxes (magnetic fields) from each other can be suppressed or prevented.

Therefore, also in the first modified embodiment shown in FIG. 14 and FIG. 15, when a signal is transmitted from the primary coil (CL7, CL8) to the secondary coil (CL5, CL6) using the induction currents, the signal intensity (reception signal intensity) detected by the secondary coil (CL5, CL6) can be improved more than the first study example shown in the above-described FIG. 12 and FIG. 13.

However, in layout of the coils CL5 and CL6 and the pads PD5, PD6 and PD7 on a semiconductor chip, if there is limitation of arrangement of the pad PD7 between the coil CL5 and CL6, it becomes difficult to design the layout of the semiconductor chip. If the arrangement position of the pad PD7 can be freely set in a region other than the region between the coil CL5 and the coil CL6 without the limitation of the arrangement of the pad PD7 between the coil CL5 and CL6, the degree of freedom of design is improved in designing the whole semiconductor chip, so that the semiconductor chip is easily designed.

For example, as similar to the first modified embodiment shown in FIG. 14 and FIG. 15, when the pad PD7 is arranged between the coil CL5 and CL6, an arrangement region with a long size is required in a direction of arrangement of the coil CL5, the pad PD7 and the coil CL6 as an arrangement region of the coils CL5 and CL6, and the pads PD5, PD6 and PD7. However, in the design of the whole semiconductor chip, it is desired to avoid providing such an arrangement region long in one direction as the arrangement region of the coils CL5 and CL6, and the pads PD5, PD6 and PD7 in some cases. Further, if there is the limitation of the arrangement of the pad PD7 between the coil CL5 and CL6, the pad PD5, the pad PD7 and the pad PD6 are arranged in this order on a line. However, in connecting a connection member such as the above-described bonding wire BW to these pads PD5, PD6 and PD7, the arrangement of the pads PD5, PD6 and PD7 is desired to be of another aspect other than the aspect that the pad PD5, the pad PD7 and the pad PD6 are arranged in this order in some cases.

Therefore, the present inventors have considered not the arrangement of the pad PD7 between the coil CL5 and the coil CL6 as similar to the first modified embodiment shown in FIG. 14 and FIG. 15 but the arrangement of the pad PD7 in a region other than a region between the coil CL5 and the coil CL6 without arranging the pad PD7. When the pad PD7 is arranged in a region other than the region between the coil CL5 and the coil CL6, it is preferable to shorten the distance between the coil CL5 and the coil CL6 further than that in the case of the first modified example shown in FIG. 14 and FIG. 15 by no arrangement of the pad PD7 between the coil CL5 and the coil CL6.

In the case of the first modified example shown in FIG. 14 and FIG. 15, since the pad PD7 is arranged between the coil CL5 and the coil CL6, the distance (space) L2 between the coil CL5 and the coil CL6 becomes equal to or larger than the side length L1 of the pad PD7 (L2≥L1). When only the position of the pad PD7 is moved at a position other than a position between the coil CL5 and the coil CL6 while the arrangement positions of the coils CL5 and CL6 and the pads PD5 and PD6 are maintained at the same positions as shown in FIG. 14, a necessary area for the arrangement regions of the coils CL5 and CL6 and the pads PD5, PD6 and PD7 is increased by the required arrangement region of the pad PD7, and therefore, this is disadvantage for downsizing (area reduction) of the semiconductor chip. That is, the first modified example becomes disadvantageous for size reduction (area reduction) of the semiconductor chip by a size corresponding to the matter that a region between the coil CL5 and the coil CL6 becomes useless Therefore, when the pad PD7 is arranged in a region other than a region between the coil CL5 and the coil CL6, it is preferable that the coil CL5 and the coil CL6 are arranged so as to be close to each other by a degree of no requirement of arrangement of the pad PD7 between the coil CL5 and the coil CL6 so that the distance (space) between the coil CL5 and the coil CL6 is made shorter than the case shown in FIG. 14. Therefore, when the pad PD7 is arranged at a region other than the region between the coil CL5 and the coil CL6, it is preferable that a distance (space) L2 between the coil CL5 and the coil CL6 is made smaller than the side length L1 of the pad PD7 (L2<L1). The case shown in FIG. 5 satisfies this condition. In this manner, an area required for the arrangement of the coils CL5 and CL6 and the pads PD5, PD6 and PD7 can be suppressed, and therefore, this is advantageous for downsizing (area reduction) of the semiconductor chip.

That is, when the pad PD7 is arranged in a region other than a region between the coil CL5 and the coil CL6, it is preferable that the coil CL5 and the coil CL6 are arranged at such a space that they are made close to each other as close as the pad PD7 cannot be arranged between the coil CL5 and the coil CL6. That is, it is preferable that the space (L2 corresponds to this space in the case shown in FIG. 5) between the coil CL5 and the coil CL6 as viewed in a direction parallel to a direction connecting the center of the coil CL5 and the center of the coil CL6 becomes smaller than the size of the pad PD7 (L1 corresponds to this size in the case shown in FIG. 5) as viewed in a direction parallel to a direction connecting the center of the coil CL5 and the center of the coil CL6.

Further, since the coil CL7 is arranged just below the coil CL5, and the coil CL8 is arranged just below the coil CL6, and therefore, the distance (space) L2 between the coil CL5 and the coil CL6 is substantially equal to a distance (space) L3 between the coil CL7 and the coil CL8 (L2=L3). Note that each of the distance L2 between the coil CL5 and the coil CL6 and the distance (space) L3 between the coil CL7 and the coil CL8 corresponds to a distance (space) in a plan view.

Figure 16:
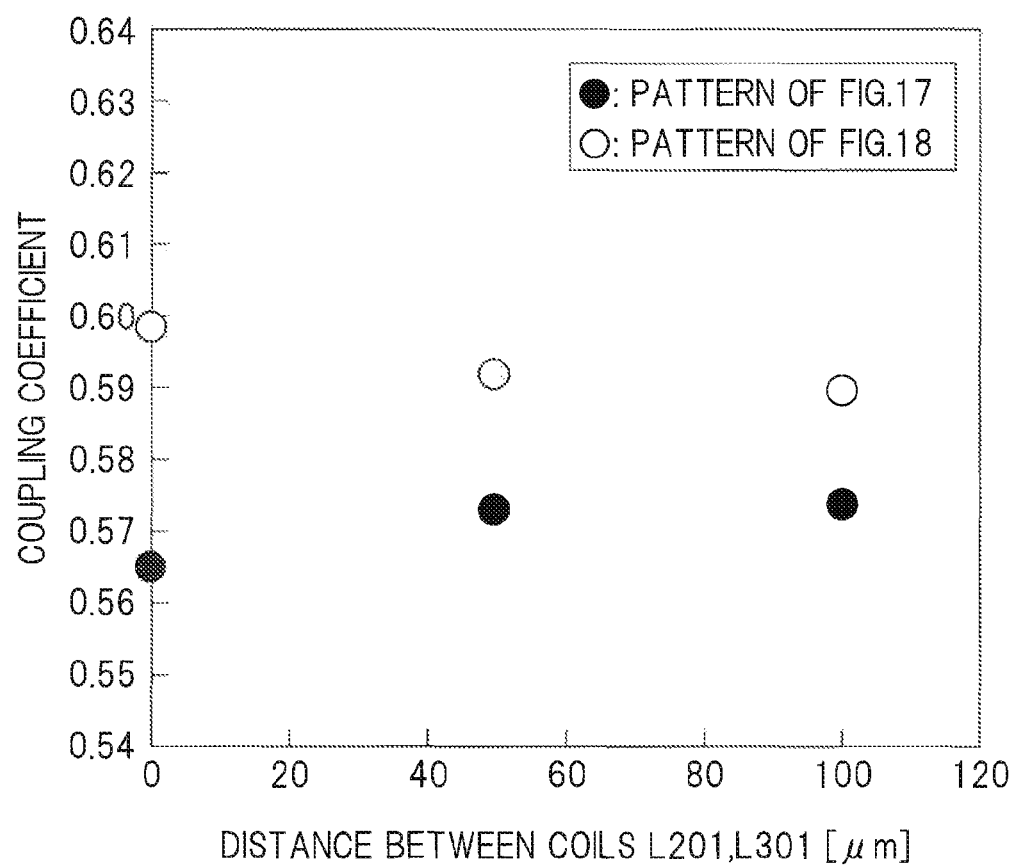
FIG. 16 is a graph showing relation between a coupling coefficient and a distance between coils.
Figure 17:
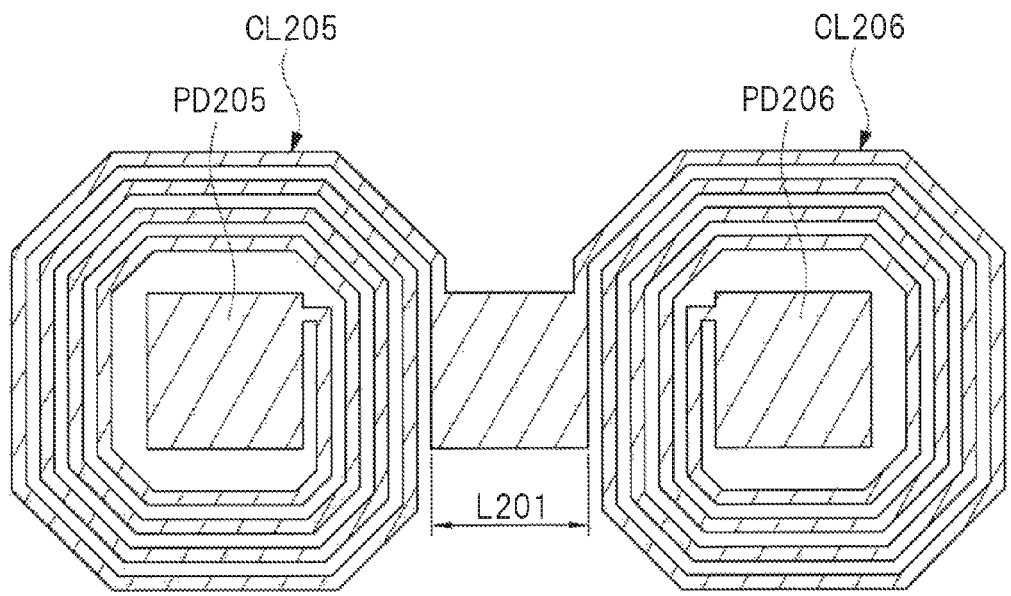
FIG. 17 is a plan view showing a coil pattern used for simulation for obtaining the graph of FIG. 16.
Figure 18:
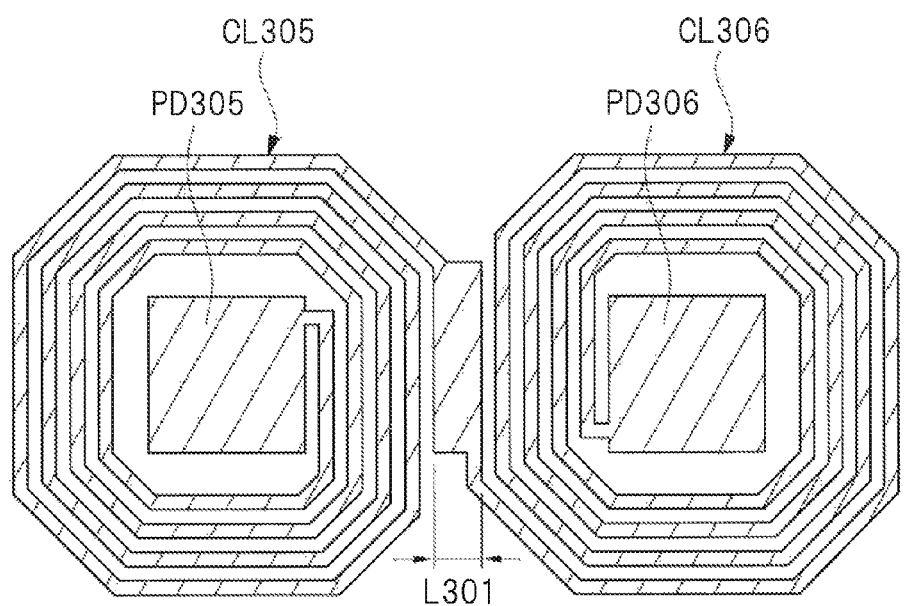
FIG. 18 is a plan view showing a coil pattern used for simulation for obtaining the graph of FIG. 16.

FIG. 16 is a graph showing a correlation between a distance (space) between coils and a coupling coefficient. Each of FIG. 17 and FIG. 18 is a plan view showing a coil pattern used in simulation for obtaining the graph shown in FIG. 16. The graph shown in FIG. 16 is obtained by simulation performed based on the coil patterns shown in FIG. 17 and FIG. 18.

The coil pattern shown in FIG. 17 is obtained by imitating the coil pattern shown in the above-described FIG. 12. That is, a coil CL205 shown in FIG. 17 is obtained by imitating the coil CL105 shown in the above-described FIG. 12, a coil CL206 shown in FIG. 17 is obtained by imitating the coil CL106 shown in the above-described FIG. 12, a pad pattern PD205 shown in FIG. 17 is obtained by imitating the pad PD105 shown in the above-described FIG. 12, and a pad pattern PD206 shown in FIG. 17 is obtained by imitating the pad PD106 shown in the above-described FIG. 12. The coil CL205 is in a right-hand turn similar to that of the above-described coil CL105, and the coil CL206 is a left-hand turn similar to that of the above-described coil CL106. Further, while two coils (two coils connected in series) obtained by imitating the above-described coils CL107 and CL108 are arranged just below the coil CL205 and the coil CL206, the drawings thereof are omitted. The coil (not shown) just below the coil CL205 has the same size and the same number of windings as those of the coil CL205, and a winding direction thereof is in a right-hand turn similar to the above-described coil CL107. The coil (not shown) just below the coil CL206 has the same size and the same number of windings as those of the coil CL206, and a winding direction thereof is in a left-hand turn similar to the above-described coil CL108.

The coil pattern shown in FIG. 18 is obtained by imitating the coil pattern shown in the above-described FIG. 5. That is, a coil CL305 shown in FIG. 18 is obtained by imitating the coil CL5 shown in the above-described FIG. 5, a coil CL306 shown in FIG. 18 is obtained by imitating the coil CL6 shown in the above-described FIG. 5, a pad pattern PD305 shown in FIG. 18 is obtained by imitating the pad PD5 shown in the above-described FIG. 5, and a pad pattern PD306 shown in FIG. 18 is obtained by imitating the pad PD6 shown in the above-described FIG. 5. The coil CL305 is in a right-hand turn similar to the above-described coil CL5, and the coil CL306 is in a right-hand turn similar to the above-described coil CL6. Further, while two coils (two coils connected in series) obtained by imitating the above-described coils CL7 and CL8 are arranged just below the coil CL305 and the coil CL306, the drawings thereof are omitted. The coil (not shown) just below the coil CL305 has the same size and the same number of windings as those of the coil CL305, and a winding direction thereof is in a right-hand turn similar to the above-described coil CL7. The coil (not shown) just below the coil CL306 has the same size and the same number of windings as those of the coil CL306, and a winding direction thereof is in a right-hand turn similar to the above-described coil CL8.

Note that the coils CL205 and CL206 shown in FIG. 17 and the coils CL305 and CL306 shown in FIG. 18 are almost the same as each other (in the number of windings of the coil, the size thereof, and others) other than the winding direction of the coil. For each of the coils CL205, CL206, CL305 and CL306, the coupling coefficient has been simulated in assumption that an inter diameter is 130 μm, a space between wires of the coil wiring is 11 μm, the number of windings is three, and distances L201 and L301 between coils are three types of about 0 μm, about 50 μm, and about 100 μm.

In the case of the coil pattern shown in FIG. 17, when induction currents flow in the coil CL205 and CL206 in accordance with the flow of a current in two coils just below the coils CL205 and CL206, the directions of flowing induction currents become the same in the coil CL205 and the coil CL206. That is, the direction of a magnetic flux penetrating through the coil CL205 and the direction of a magnetic flux penetrating through the coil CL206 become the same as each other. The examination result obtained by simulating the coupling coefficients of the primary coil (coils just below the coils CL205 and CL206) and the secondary coil (the coils CL205 and CL206) on the premise of the same direction is shown by black circle marks (•) in the graph shown in FIG. 16. Here, the coupling coefficients of the primary coil and the secondary coil are examined in the case that the distance (space) L201 between the coil CL205 and the coil CL206 is changed to be the three types of values (about 0 μm, about 50 μm, and about 100 μm), and are plotted with taking the distance L201 between the coil CL205 and the coil CL206 in a horizontal axis of the graph shown in FIG. 16 and taking the coupling coefficient in a vertical axis of the graph shown in FIG. 16.

Further, in the case of the coil pattern shown in FIG. 18, when induction currents flow in the coil CL305 and CL306 in accordance with the flow of a current in two coils just below the coils CL305 and CL306, the directions of induction currents flowing in the coil CL305 and the coil CL306 are opposed to each other. That is, the direction of a magnetic flux penetrating through the coil CL305 and the direction of a magnetic flux penetrating through the coil CL306 are opposed to each other. The examination result obtained by simulating the coupling coefficients of the primary coil (coils just below the coils CL305 and CL306) and the secondary coil (the coils CL305 and CL306) on the premise of the opposed direction is shown by white circle marks (○) in the graph shown in FIG. 16. Here, the coupling coefficients of the primary coil and the secondary coil are examined in the case that the distance (space) L301 between the coil CL305 and the coil CL306 is changed to be the three types of values (about 0 μm, about 50 μm, and about 100 μm), and are plotted with taking the distance L301 between the coil CL305 and the coil CL306 in a horizontal axis of the graph shown in FIG. 16 and taking the coupling coefficient in a vertical axis of the graph shown in FIG. 16.

As seen from the graph shown in FIG. 16, in comparison in the case that the distances (L201, L301) between coils are the same as each other, the coupling coefficients of the primary coil and the secondary coil are larger in the case of the coil pattern shown in FIG. 18 (corresponding to the white circle mark in the graph shown in FIG. 16) than the case of the coil pattern shown in FIG. 17 (corresponding to the black circle mark in the graph shown in FIG. 16). That is, the coupling coefficients of the primary coil and the secondary coil are larger in the case that the directions of induction currents flowing in the coils CL305 and CL306 are opposed to each other in the coil CL305 and the coil CL306 as similar to the case shown in FIG. 18 than the case that the directions of induction currents flowing in the coils CL205 and CL206 become the same as each other in the coil CL205 and the coil CL206 as similar to the case shown in FIG. 17. The large coupling coefficient leads to a large signal intensity (reception signal intensity) detected on the secondary side when a signal is transmitted via the primary coil and the secondary coil. Further, when the number of windings of a coil is increased, the coupling intensity becomes large, but causes area increase of the coil, and therefore, this is disadvantageous for downsizing (area reduction) of a semiconductor chip. Therefore, even if the area of the coil is suppressed, a necessary coupling coefficient can be secured by the increase in the coupling coefficient in the case of the coil pattern shown in FIG. 18 (the case that the directions of the induction currents are opposed to each other in the coil CL305 and the coil CL306) larger that the case of the coil pattern shown in FIG. 17 (the directions of the induction currents are the same as each other in the coil CL205 and the coil CL206), and therefore, this is advantageous for downsizing (area reduction) of a semiconductor chip.

Further, as seen from the graph shown in FIG. 16, in the case of the coil pattern shown in FIG. 17 (the case that the directions of the induction currents are the same as each other in the coil CL205 and the coil CL206), the coupling coefficients of the primary coil and the secondary coil become smaller when the distance L201 between the coil CL205 and the coil CL206 is small (namely, when the coil CL205 and the coil CL206 are closer to each other). This may be because the case of the coil pattern shown in FIG. 17 (the case that the directions of induction currents become the same as each other in the coil CL205 and the coil CL206) has such larger action as cancelling the magnetic fluxes from each other as the coil CL205 and the coil CL206 come closer to each other. Therefore, in the first study example shown in the above-described FIG. 12 and FIG. 13, if it is assumed that the above-described pad PD107 has been moved to a region other than the region between the coil CL105 and the coil CL106 and that the coil CL105 and the coil CL106 have been made close to each other (the coils CL105 and CL106 have been made close to each other as close as being shown in FIG. 5 and FIG. 6), the coupling coefficients of the primary coil and the secondary coil become further smaller than those in the above-described FIG. 12 and FIG. 13.

On the other hand, in the case of the coil pattern shown in FIG. 18 (the case that the directions of induction currents are opposed to each other in the coil CL305 and the coil CL306), when the distance L301 between the coil CL305 and the coil CL306 becomes short (namely, when the coil CL305 and the coil CL306 are made close to each other), the coupling coefficients of the primary coil and the secondary coil become large. Therefore, as similar to the above-described FIG. 5 and FIG. 6, the coupling coefficients of the primary coil and the secondary coil are further larger in the case that the pad PD7 is arranged in a region other than the region between the coil CL5 and the coil CL6 and that the coil CL5 and the coil CL6 are made close to each other than the case of the first modified embodiment shown in the above-described FIG. 14 and FIG. 15.

Therefore, the coupling coefficients of the primary coil and the secondary coil can be made large by setting the directions of induction currents flowing in the coils CL5 and CL6 so as to be opposed to each other in the coil CL5 and the coil CL6 regardless of whether or not the pad PD7 is arranged between the coil CL5 and the coil CL6. However, while the distance between the coil CL5 and the coil CL6 can be made small when the pad PD7 is arranged in a region other than between the region the coil CL5 and the coil CL6, it is especially important in this case to set the directions of induction currents so as to be opposed to each other in the coil CL5 and the coil CL6 for securing the coupling coefficient. That is, if the directions of induction currents are the same as each other in the coil CL5 and the coil CL6, the smaller distance between the coil CL5 and the coil CL6 leads to the smaller coupling coefficient. On the other hand, if the directions of induction currents are opposed to each other in the coil CL5 and the coil CL6, the coupling coefficient can be made large even if the distance between the coil CL5 and the coil CL6 is small.

Therefore, the setting that the directions of induction currents are opposed to each other in the coil CL5 and the coil CL6 is effective for increase of the coupling coefficient regardless of the arrangement position of the pad PD7. However, it can be said that the case of the arrangement of the pad PD7 in a region other than the region between the coil CL5 and the coil CL6 has particularly a large effect.

In the first modified embodiment shown in the above-described FIG. 14, the pad PD7 is arranged between the coil CL5 and the coil CL6. On the other hand, in the present embodiment shown in the above-described FIG. 5, the pad PD7 is arranged in a region other than the region between the coil CL5 and the coil CL6. Therefore, there is no such limitation as arranging the pad PD7 between the coil CL5 and the coil CL6, and therefore, the degree of freedom of the design increases in designing a whole semiconductor chip, so that the semiconductor chip is easily designed. In this embodiment shown in above-described FIG. 5, the distance (space) between the coil CL5 and the coil CL6 is made smaller than the side length L1 of the pad PD7. Therefore, an area required for arrangement of the coils CL5 and CL6 and the pads PD5, PD6 and PD7 can be suppressed, and therefore, this is advantageous for downsizing (area reduction) of a semiconductor chip.

<Regarding Configuration Example of Semiconductor Package>

Next, a configuration example of the semiconductor package of the present embodiment will be described. Note that the semiconductor package can be regarded to be a semiconductor device.

Figure 19:
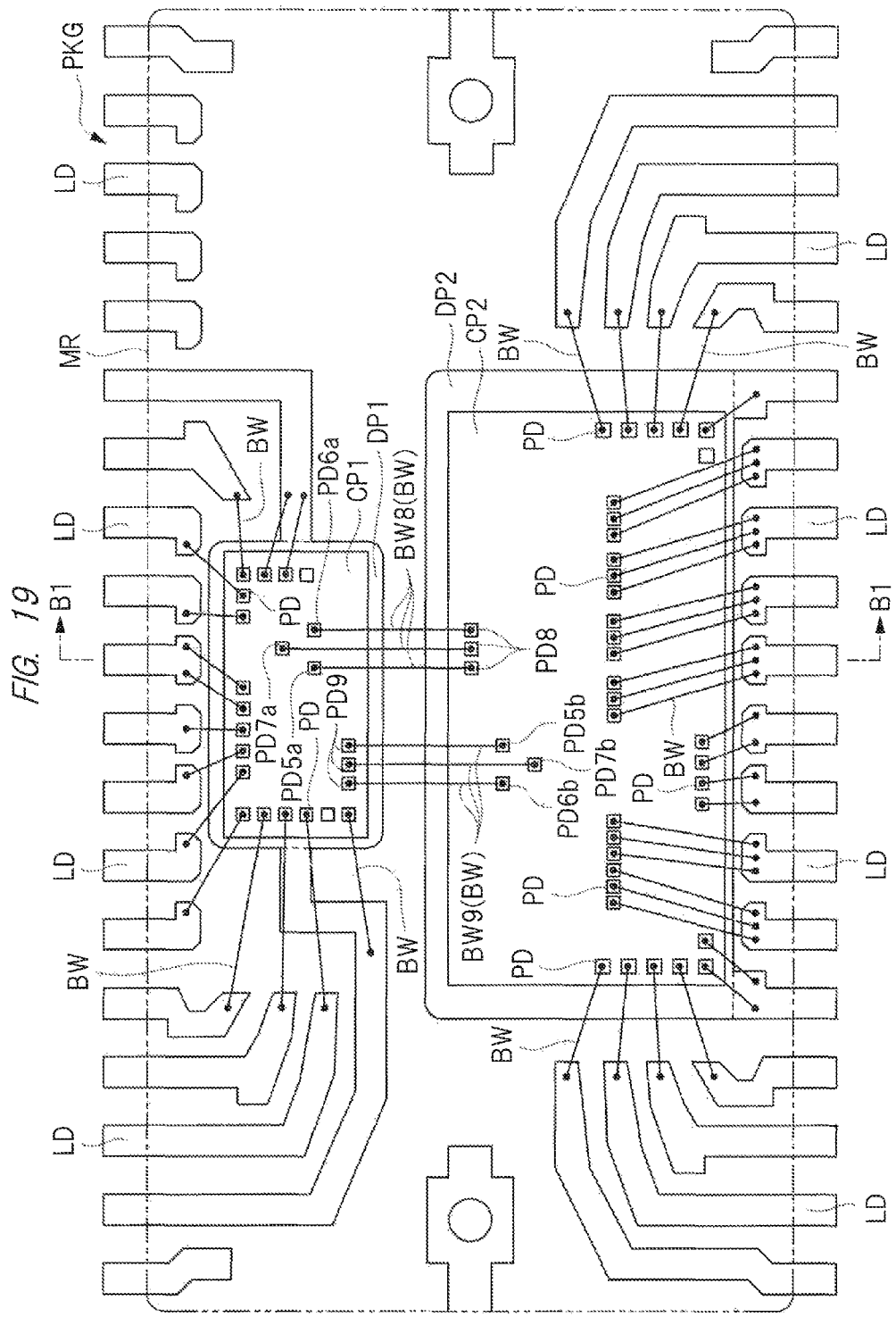
FIG. 19 is a plan view showing a semiconductor package of the first embodiment.
Figure 20:
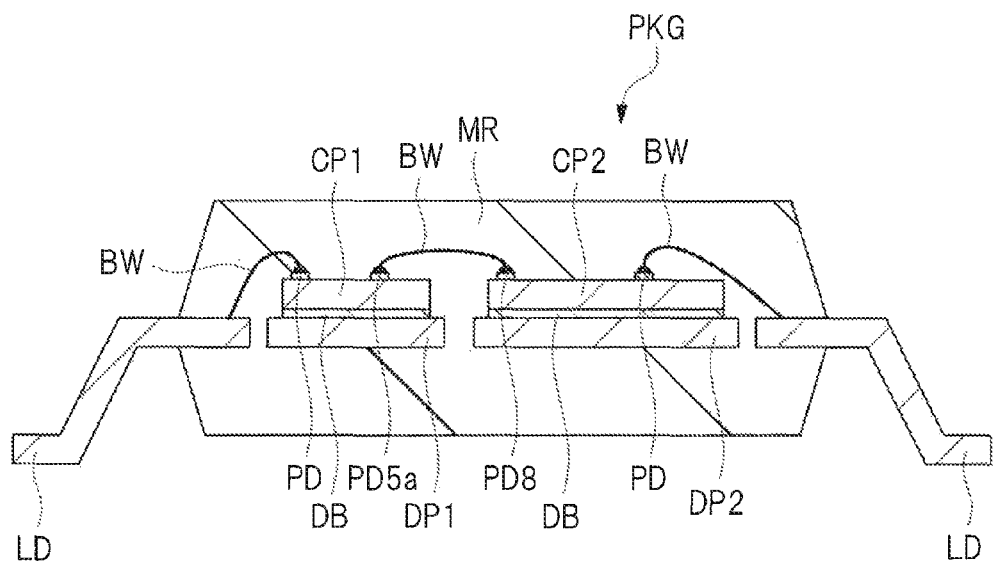
FIG. 20 is a cross-sectional view showing the semiconductor package of the first embodiment.

FIG. 19 is a plan view showing a semiconductor package (semiconductor device) PKG of the present embodiment, and FIG. 20 is a cross-sectional view of the semiconductor package PKG. However, in FIG. 19, a sealing resin portion MR is visually transparent, and an outer form (an outer circumference) of the sealing resin portion MR is shown by a two-dot chain line. Further, a cross-sectional view taken along a line B1-B1 in FIG. 19 almost corresponds to FIG. 20.

The semiconductor package PKG shown in FIG. 19 and FIG. 20 is a semiconductor package including the semiconductor chips CP1 and CP2. The configuration of the semiconductor package PKG will be specifically described below.

The semiconductor package PKG shown in FIG. 19 and FIG. 20 includes: the semiconductor chips CP1 and CP2; die pads DP1 and DP2 on which the semiconductor chips CP1 and CP2 are mounted, respectively; a plurality of leads LD made of a conductor; a plurality of bonding wires BW connecting the semiconductor chips CP1 and CP2 and connecting the semiconductor chip CP1 or CP2 and the plurality of leads LD; and a sealing resin portion MR sealing these members.

The sealing resin portion (a sealing portion, a sealing resin, a sealing body) MR is made of resin material such as a thermosetting resin material, and can include a filler or others. The semiconductor chips CP1 and CP2, the die pads DP1 and DP2, the plurality of leads LD and the plurality of bonding wires BW are sealed and protected electrically and mechanically by the sealing resin portion MR. A plain shape (outer shape) of the sealing resin portion MR intersecting its thickness direction can be rectangular (square).

A plurality of pads (pad electrodes, bonding pads) PD are formed on a front surface of the semiconductor chip CP1 which is a main surface of the semiconductor chip CP1 on a device formation side. Each pad PD of the semiconductor chip CP1 is electrically connected to a semiconductor integrated circuit (such as the above-described control circuit CC) or others formed inside the semiconductor chip CP1.

Pads (pad electrode, bonding pad) PD5$a$, PD6$a$ and PD7$a$ corresponding to the above-described pads PD5, PD6 and PD7, respectively, are further formed on a surface of the semiconductor chip CP1.

That is, the semiconductor chip CP1 includes: the above-described transmission circuit TX1; the above-described coils CL7 and CL8 (the primary coil) connected to the transmission circuit TX1; the above-described coils CL5 and CL6 (the secondary coil) magnetically coupled to the coils CL7 and CL8, respectively; and the above-described pads PD5, PD6 and PD7 connected to the coils CL5 or CL6. The pad PD5 included in the semiconductor chip CP1 corresponds to the pad PD5$a$, the pad PD6 included in the semiconductor chip CP1 corresponds to the pad PD6$a$, and the pad PD7 included in the semiconductor chip CP1 corresponds to the pad PD7$a$.

Further, the semiconductor chip CP1 further includes: the above-described reception circuit RX2; and a plurality of pads (pad electrode, bonding pad) PD9 connected to the reception circuit RX2. Therefore, pads PD, PD5$a$, PD6$a$, PD7$a$, and PD9 are formed on a front surface of the semiconductor chip CP1. Note that a pad PD9 of the plurality of pads PD9 of the semiconductor chip CP1 which is connected to the pad PD7$b$ of the semiconductor chip CP2 through a bonding wire BW is a pad for supplying a fixed potential (ground potential, GND potential, power source potential or others).

A plurality of pads PD are formed on a surface of the semiconductor chip CP2 which is a main surface of the semiconductor chip CP2 on the device formation side. Each pad of the semiconductor chip CP2 is electrically connected to a semiconductor integrated circuit (such as the above-described drive circuit DR) formed inside the semiconductor chip CP2.

Pads (pad electrode, bonding pad) PD5$b$, PD6$b$ and PD7$b$ corresponding to the above-described pads PD5, PD6 and PD7, respectively, are further formed on a surface of the semiconductor chip CP2.

That is, the semiconductor chip CP2 includes: the above-described transmission circuit TX2; the above-described coils CL7 and CL8 (the primary coil) connected to the transmission circuit TX2; the above-described coils CL5 and CL6 (the secondary coil) magnetically coupled to the coils CL7 and CL8, respectively; and the above-described pads PD5, PD6 and PD7 connected to the coils CL5 or CL6. The pad PD5 included in the semiconductor chip CP2 corresponds to the pad PD5*b*, the pad PD6 included in the semiconductor chip CP2 corresponds to the pad PD6*b*, and the pad PD7 included in the semiconductor chip CP2 corresponds to the pad PD7*b*.

Further, the semiconductor chip CP2 further includes: the above-described reception circuit RX1; and a plurality of pads (pad electrode, bonding pad) PD8 connected to the reception circuit RX1. Therefore, pads PD, PD5*b*, PD6*b*, PD7*b*, and PD8 are formed on a front surface of the semiconductor chip CP2. Note that a pad PD8 of the plurality of pads PD8 of the semiconductor chip CP2 which is connected to the pad PD7*a* of the semiconductor chip CP1 through a bonding wire BW is a pad for supplying a fixed potential (ground potential, GND potential, power source potential or others).

Note that the main surface of the semiconductor chip CP1 on the side on which the pads PD, PD5*a*, PD6*a*, PD7*a* and PD9 are formed is called "a front surface of the semiconductor chip CP1", and the main surface opposed thereto is called "a back surface of the semiconductor chip CP1". Further, the main surface of the semiconductor chip CP2 on the side on which the pads PD, PD5*b*, PD6*b*, PD7*b* and PD8 are formed is called "a front surface of the semiconductor chip CP2", and the main surface opposed thereto is called "a back surface of the semiconductor chip CP2".

The semiconductor chip CP1 is mounted (arranged) on an upper surface of the die pad DP1 which is a chip-mounting portion so that the front surface of the semiconductor chip CP1 faces upward, and the back surface of the semiconductor chip CP1 is bonded and fixed onto the upper surface of the die pad DP1 through a die bond material (adhesive) DB.

The semiconductor chip CP2 is mounted (arranged) on an upper surface of the die pad DP2 which is a chip-mounting portion so that the front surface of the semiconductor chip CP2 faces upward, and the back surface of the semiconductor chip CP2 is bonded and fixed onto the upper surface of the die pad PD2 through a die bond material (adhesive) DB.

The die pad DP1 and the die pad DP2 are spaced away from each other through a material configuring the sealing resin portion MR interposed therebetween, and they are electrically insulated from each other.

The leads LD are made of a conductor, and preferably made of metal material such as copper (Cu) or copper alloy. Each lead LD is composed of an inner lead portion which is a portion of the lead LD positioned inside the sealing resin portion MR and an outer lead portion which is a portion of the lead LD positioned outside the sealing resin portion MR, and the outer lead portion of the lead LD protrudes from a side surface of the sealing resin portion MR to the outside of the sealing resin portion MR. A section between the inner lead portions of the adjacent leads LD is filled with the material configuring the sealing resin portion MR. The outer lead portion of each lead LD can function as a terminal portion for external connection (an external terminal) of the semiconductor package PKG. The outer lead portion of each lead LD is bent so that a lower surface thereof in the vicinity of an end portion of the outer lead portion is positioned slightly lower than the lower surface of the sealing resin portion MR.

Each pad PD on the front surfaces of the semiconductor chips CP1 and CP2 is electrically connected to the inner lead portion of each lead LD through a bonding wire BW which is an electrically-conductive connection member. That is, the other end of the bonding wire BW whose one end is connected to each pad PD on the front surfaces of the semiconductor chips CP1 and CP2 is connected to an upper surface of the inner lead portion of each lead LD. Further, each of the pads PD5*a*, PD6*a* and PD7*a* on the front surface of the semiconductor chip CP1 is electrically connected to the pad PD8 on the front surface of the semiconductor chip CP2 through bonding wire BW. Further, each of the pads PD5*b*, PD6*b* and PD7*b* on the front surface of the semiconductor chip CP2 is electrically connected to the pad PD9 on the front surface of the semiconductor chip CP1 through bonding wire BW.

The bonding wire BW is the electrically-conductive connection member (a member for connection), and more specifically an electrically-conductive wire made of a metal thin wire such as a gold (Au) wire or a copper (CU) wire. The bonding wire BW is sealed within the sealing resin portion MR, and is not exposed from the sealing resin portion MR.

Here, the bonding wire BW connecting the pad PD5*a*, PD6*a* and PD7*a* of the semiconductor chip CP1 and the pad PD8 of the semiconductor chip CP2 is called "bonding wire BW8" denoted with a reference symbol BW8 below. Further, the bonding wire BW connecting the pad PD5*b*, PD6*b* or PD7*b* of the semiconductor chip CP2 and the pad PD9 of the semiconductor chip CP1 is called "bonding wire BW9" denoted with a reference symbol BW9 below.

Although the semiconductor chip CP1 and the semiconductor chip CP2 are connected to each other by the bonding wires BW8 and BW9, they are not connected to each other by the other bonding wire BW (electrically-conductive connection member). Therefore, the electric signal between the semiconductor chip CP1 and the semiconductor chip CP2 is transmitted through only a route from the pad PD5*a*, PD6*a* or PD7*a* of the semiconductor chip CP1 to the pad PD8 of the semiconductor chip CP2 through the bonding wire BW8 and a route from the pad PD5*b*, PD6*b* or PD7*b* of the semiconductor chip CP2 to the pad PD9 of the semiconductor chip CP2 through the bonding wire BW9.

The pads PD5*a*, PD6*a* and PD7*a* of the semiconductor chip CP1 are connected to the above-described coils CL5 and CL6 (the secondary coil) formed within the semiconductor chip CP1. However, the coils CP5 and CP6 are not connected to a circuit formed within the semiconductor chip CP1 through a conductor (internal wiring), and are magnetically coupled to the above-described coils CL7 and CL8 (the primary coil) within the semiconductor chip CP1. Therefore, only a signal transmitted from the circuit (the above-described transmission circuit TX1 or others) formed within the semiconductor chip CP1 through the above-described coils CL7 and CL8 (the primary coil) and the above-described coils CL5 and the CL6 (the secondary coil) within the semiconductor chip CP1 by magnetic induction is inputted from the pad PD5*a*, PD6*a* or PD7*a* into the semiconductor chip CP2 (the above-described reception circuit RX1) through the bonding wire BW8.

Further, the pads PD5*b*, PD6*b* and PD7*b* of the semiconductor chip CP2 are connected to the above-described coils CL5 and CL6 (the secondary coil) formed within the semiconductor chip CP2. However, the coils CL5 and CL6 are not connected to a circuit formed within the semiconductor chip CP2 through a conductor (internal wiring), and are magnetically coupled to the above-described coil CL7 and CL8 (the primary coil) within the semiconductor chip CP2. Therefore, only a signal transmitted from the circuit (the above-described transmission circuit TX2 or others) formed within the semiconductor chip CP2 through the above-described coils CL7 and CL8 (the primary coil) and the above-described coils CL5 and the CL6 (the secondary coil) within the semiconductor chip CP2 by magnetic induction is inputted from the pad PD5b, PD6b or PD7b into the semiconductor chip CP1 (the above-described reception circuit RX2) through the bonding wire BW9.

The semiconductor chip CP1 and the semiconductor chip CP2 are different from each other in a voltage level (reference potential) from each other. For example, the drive circuit DR drives such a load LOD as a motor, and specifically drives or controls a switch (a switching element) of such a load LOD as a motor for turning the switch. Therefore, when a switch to be driven turns ON, the case that the reference potential (voltage level) of the semiconductor chip CP2 rises up to a voltage almost coincident with the power source voltage (operation voltage) of the switch to be driven in some cases, and the power source voltage is a significantly high voltage (for example, about several-hundred volt to several-thousand volt). Therefore, a large difference in the voltage level (reference potential) occurs between the semiconductor chip CP1 and the semiconductor chip CP2. That is, when the switch to be driven is turned ON, a higher voltage (for example, about several-hundred volt to several-thousand volt) than the power source voltage (for example, about several volt to several-ten volt) supplied to the semiconductor chip CP1 is supplied to the semiconductor chip CP2.

As described above, however, only a signal transmitted by magnetic induction through the primary coil (CL7 and CL8) and the secondary coil (CL5 and CL6) within the semiconductor chip CP1 or a signal transmitted by magnetic induction through the primary coil (CL7 and CL8) and the secondary coil (CL5 and CL6) within the semiconductor chip CP2 is electrically transmitted between the semiconductor chip CP1 and the semiconductor chip CP2. Therefore, even if the voltage level (reference potential) of the semiconductor chip CP1 and the voltage level (reference potential) of the semiconductor chip CP2 are different from each other, inputting of the voltage level (reference potential) of the semiconductor chip CP2 into the semiconductor chip CP1 and inputting of the voltage level (reference potential) of the semiconductor chip CP1 into the semiconductor chip CP2 can be properly prevented. That is, even if the switch to be driven is turned ON and the voltage level (reference potential) of the semiconductor chip CP2 rises up to a voltage almost coincident with the power source voltage (for example, about several-hundred volt to several-thousand volt) of the switch to be driven, the inputting of the reference potential of the semiconductor chip CP2 into the semiconductor chip CP1 can be properly prevented. Therefore, transmission of an electric signal can be properly performed between the semiconductor chips CP1 and CP2 which are different from each other in the voltage level (reference potential). Further, the reliabilities of the semiconductor chip CP1 and the semiconductor chip CP2 can be enhanced. Further, the reliability of the semiconductor package PKG can be improved. Furthermore, the reliability of an electric device using the semiconductor package PKG can be improved.

Further, by transmitting a signal between the semiconductor chips utilizing the magnetically-coupled coils, while the semiconductor package PKG can be downsized, the reliability thereof can be improved.

Here, application examples of a product on which the semiconductor package PKG is mounted will be described. For example, the examples are an automobile, a motor control unit of home appliance such as a washing machine, a switching power source, a lighting controller, a solar power generation controller, a mobile phone, a mobile communication device and others.

For example, as an automobile application, the semiconductor chip CP1 is a low-voltage chip supplied with a low-voltage power source voltage, and a supply power source voltage at this time is, for example, about 5V. On the other hand, a power source voltage of a switch to be driven of the drive circuit DR is, for example, a high voltage equal to, for example, 600V to 1000V or higher, and this high voltage is supplied to the semiconductor chip CP2 when the switch is tuned ON.

Here, note that the case of an SOP (Small Outline Package) has been exemplified as a package form of the semiconductor package PKG for the explanation. However, a package other than the SOP is also applicable.

Second Embodiment

In the second embodiment, various layout examples (arrangement examples) of a secondary coil (coils corresponding to the above-described coils CL5 and CL6) and pads (pads corresponding to the above-described pads PD5, PD6 and PD7) in the semiconductor chip (CP1, CP2) will be described with reference to the drawings. The second embodiment can be regarded also as a modified example of the first embodiment.

Each of FIG. 21 to FIG. 31 is a plan view of a principal part of a semiconductor chip (a semiconductor device) of the second embodiment, and corresponds to the above-described FIG. 5 of the first embodiment.

Note that the repetitive description of each of FIG. 21 to FIG. 31 in the second embodiment will be omitted in the same part as FIG. 5 to FIG. 10 in the first embodiment, and different points each of them from FIG. 5 to FIG. 10 in the first embodiment will be mainly described.

Further, in the second embodiment, a layout of a secondary coil and pads connected to the secondary coil is described. Illustration and explanation of a primary coil (coils corresponding to the above-described coils CL7 and CL8) are omitted. However, practically just below each coil (the secondary coil) shown in FIG. 21 to FIG. 31, a coil (the primary coil) magnetically coupled to the coil (the secondary coil) is arranged. The primary coil is arranged just below the secondary coil, and therefore, when the layout of the secondary coil is determined, the layout of the primary coil is determined necessarily. Therefore, here, the description of the layout of the primary coil is omitted by the description of the layout of the secondary coil. Further, in the second embodiment, the layout of the coils and the pads in the semiconductor chip CP1 is explained. However, the layout described in the second embodiment is applicable to either one or both of the semiconductor chips CP1 and CP2.

Figure 21:
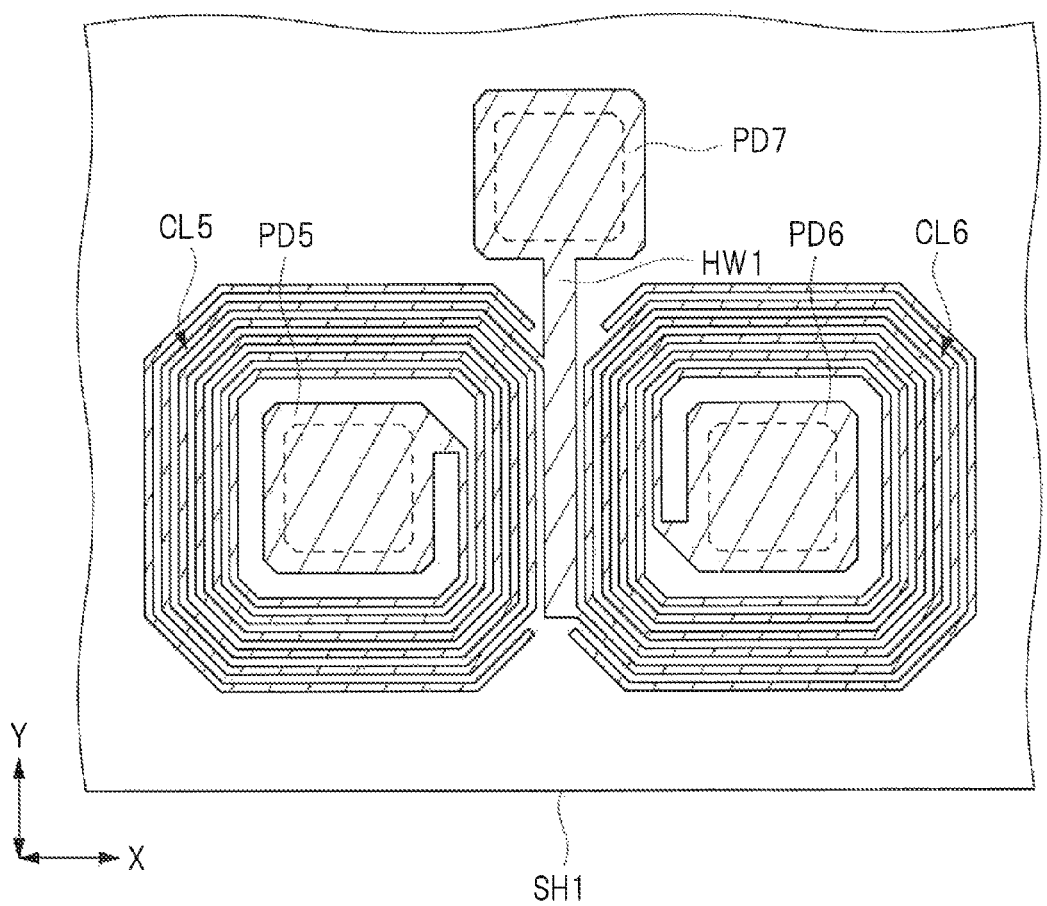
FIG. 21 is a plan view of a principal part of a semiconductor chip of a second embodiment.

First, a layout shown in FIG. 21 having a layout similar to the layout of the secondary coil (coils CL5 and CL6) in the above-described FIG. 5 of the above-described first embodiment and the pads (pads PD5, PD6 and PD7) connected thereto will be described. In FIG. 21 to FIG. 31, note that a dotted line drawn on each pad shows a position of the above-described opening portion OP for exposing the pad.

In the case shown in FIG. 21, in the semiconductor chip CP1, the coil CL5 and the coil CL6 configuring the secondary coil are arranged along a side SH1 of the semiconductor chip CP1. The side SH1 is one side of four sides configuring an outer circumference of the rectangular semiconductor chip CP1. Here, a direction parallel to the side SH1 (namely, a direction extending along the SH1) is defined as X direction, while a direction orthogonal to the side SH1 is defined as Y direction. The X direction and the Y direction are directions orthogonal to each other.

In the case shown in FIG. 21, in the semiconductor chip CP1, the coil CL5 and the coil CL6 are arranged in the vicinity of the side Sill of the semiconductor chip CP1 along the side Sill. Therefore, the coil CL5 and the coil CL6 are aligned in an X direction. As described above, the pad PD5 is arranged inside the coil CL5 (inside the spiral) so as to be connected to one end of the coil CL5, while the pad PD6 is arranged inside the coil CL6 (inside the spiral) so as to be connected to one end of the coil CL6. Since the coil CL5 and the coil CL6 are aligned in the X direction, the pad PD5 and the pad PD6 are also aligned in the X direction. The pad PD7 is arranged at a position shifted by a predetermined distance in a Y direction from the position between the coil CL5 and the coil CL6 aligned in the X direction (at a position shifted to be spaced away from the side SH1). The pad PD7 and the coils CL5 and CL6 are connected by a lead wiring HW1. The lead wiring HW1 extends from a portion between the coil CL5 and the coil CL6 up to the pad PD7. At this time, if the pad PD7 is shifted in the Y direction from the position between the coil CL5 and the coil CL6 by such a distance that the pad PD7 does not just overlap with the coils CL5 and CL6, an area required for layout of the coils CL5 and CL6 and the pads PD5, PD6 and PD7 can be reduced.

In the case of FIG. 21, the pad PD5 and the pad PD6 are aligned in the X direction, and the pad PD7 is arranged at a position shifted by the predetermined distance in the Y direction from the position between the coil CL5 and the coil CL6 (at a position shifted to be spaced away from the side SH1). That is, a distance between the pad PD5 and the side SH1 (the distance in the Y direction) and a distance between the pad PD6 and the side SH1 (the distance in the Y direction) are almost the same as each other. On the other hand, a distance between the pad PD7 and the side SH1 (the distance in the Y direction) is larger than the distance between the pad PD5 and the side SH1 (the distance in the Y direction) and the distance between the pad PD6 and the side Sill (the distance in the Y direction), and a difference between them is equal to or larger than the size of one side of the pad PD5 and pad PD6.

In the layout shown in FIG. 21, the size of the region in the X direction required for layout of the coils CL5 and CL6 and the pads PD5, PD6 and PD7 can be reduced, and can be, for example, about equal to the total of the size of the coil CL5 in the X direction and the size of the coil CL6 in the X direction. Therefore, in the design of a whole semiconductor chip CP1, when it is desired to reduce the size of the region in the X direction required for layout of the coils CL5 and CL6 and the pads PD5, PD6 and PD7, this layout is advantageous.

Further, in the layout shown in FIG. 21, when a connection member such as the bonding wire (BW) is connected to each of the pads PD5, PD6 and PD7, the bonding wire connected to the pad PD7 is positioned between the bonding wire connected to the pad PD5 and the bonding wire connected to the pad PD6. Since the pad PD7 is shifted in the Y direction from the position at which the pads PD5 and PD6 are aligned, it becomes easy to prevent mutual contact of the bonding wire connected to the pad PD5, the bonding wire connected to the pad PD7 and the bonding wire connected to the pad PD6.

Next, a layout of FIG. 22 will be described.

Figure 22:
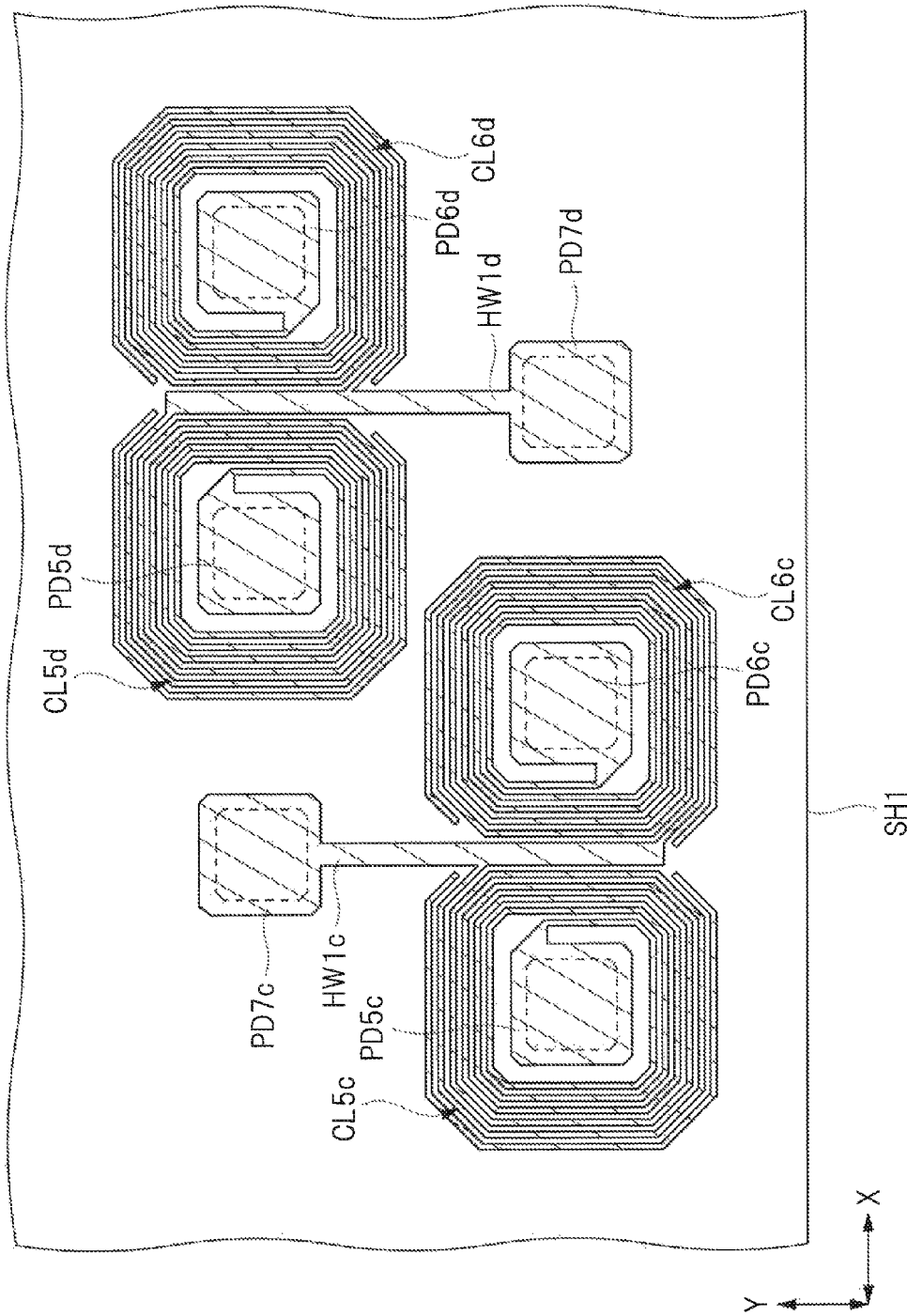
FIG. 22 is a plan view of a principal part of the semiconductor chip of the second embodiment.

In the case shown in FIG. 22, ones corresponding to the above-described coils CL5 and CL6 and pads PD5, PD6 and PD7 include totally two sets of a set of coils CL5c and CL6c and pads PD5c, PD6c and PD7c, and a set of coils CL5d and CL6d and pads PD5d, PD6d and PD7d. Each of the coils CL5c and CL5d of them corresponds to the above-described coil CL5, and each of the coils CL6c and CL6d corresponds to the above-described coil CL6. Each of the pads PD5c and PD5d corresponds to the above-described pad PD5, each of the pads PD6c and PD6d corresponds to the above-described pad PD6, and each of the pads PD7c and PD7d correspond to the above-described pad PD7.

That is, in the case shown in FIG. 22, the transmission route to the other semiconductor chip (CP2) has two channels. One of the two channels is a route transmitting a signal from the transmission circuit within the semiconductor chip CP1 to the reception circuit within the other semiconductor chip (CP2) through the primary coil (corresponding to the above-described coils CL7 and CL8 although not illustrated here) just below the above-described coils coil CL5c and CL6c and the coils CL5c and CL6c configuring the secondary coil. The other of the two channels is a route transmitting a signal from the transmission circuit within the semiconductor chip CP1 to the reception circuit within the other semiconductor chip (CP2) through the primary coil (corresponding to the above-described coils CL7 and CL8 although not illustrated here) just below the above-described coils coil CL5d and CL6d and the coils CL5d and CL6d configuring the secondary coil.

Therefore, in the semiconductor chip CP1, the set of the coils CL5c and CL6c and the pads PD5c, PD6c and PD7c and the set of the coils CL5d and CL6d and the pads PD5d, PD6d and PD7d are provided independently from each other.

A layout of FIG. 22 will be specifically described below.

In the case shown in FIG. 22, in the semiconductor chip CP1, the coil CL5c and the coil CL6c are arranged in the vicinity of the side Sill of the semiconductor chip CP1 along the side Sill. Therefore, the coil CL5c and the coil CL6c are aligned in the X direction. The pad PD5c is arranged inside the coil CL5c (inside the spiral) so as to be connected to one end of the coil CL5c, while the pad PD6c is arranged inside the coil CL6c (inside the spiral) so as to be connected to one end of the coil CL6c. Since the coil CL5c and the coil CL6c are aligned in the X direction, the pad PD5c and the pad PD6c are also aligned in the X direction. The pad PD7c is arranged at a position shifted by a predetermined distance in the Y direction from position between the coil CL5c and L6c aligned in the X direction (at a position shifted to be spaced away from the side SH1). The pad PD7c and the coils CL5c and CL6c are connected to each other by a lead wiring HW1c corresponding to the above-described lead wiring HW1. The lead wiring HW1c extends from a portion between the coil CL5c and the coil CL6c up to the pad PD7c.

Further, in focusing the attention on the set of the coils CL5d and CL6d and the pads PD5d, PD6d and PD7d, the coil CL5d and the coil CL6d are aligned in the X direction. The pad PD5d is arranged inside the coil CL5d (inside the spiral) so as to be connected to one end of the coil CL5d, while the ad PD6d is arranged inside the coil CL6d (inside the spiral) so as to be connected to one end of the coil CL6d. Since the coil CL5d and the coil CL6d are aligned in the X direction, the pad PD5d and the pad PD6d are also aligned in the X direction. The pad PD7d is arranged at a position shifted by a predetermined distance in the Y direction from a position between the coil CL5d and the coil CL6d aligned in the X direction (at a position shifted so as to come close to the side SH1). The pad PD7d and the coils CL5d and CL6d are connected to each other by a lead wiring HW1d corresponding to the lead wiring HW1. The lead wiring HW1d extends from a portion between the coil CL5d and the coil CL6d up to the pad PD7d.

The pad PD5c, the pad PD6c and the pad PD7d are aligned in the X direction, and the pad PD7c, the pad PD5d, and the pad PD6d are aligned in the X direction. That is, the pad PD7d is arranged at a position of the extension of the coil CL5c and the coil CL6d aligned in the X direction (at a position of the extension in the X direction), and the pad PD7c is arranged at a position of the extension of the coil CL6d and the coil CL5d aligned in the X direction (at a position of the extension in the X direction). Further, a portion of the coil CL6c and a portion of the coil CL5d face each other in the Y direction.

Therefore, a distance (a distance in the Y direction) between the pad PD5c and the side SH1, a distance (a distance in the Y direction) between the pad PD6c and the side SH1, and a distance (a distance in the Y direction) between the pad PD7d and the side SH1 are almost the same as one another. Further, a distance (a distance in the Y direction) between the pad PD6d and the side SH1, a distance (a distance in the Y direction) between the pad PD5d and the side SH1, and a distance (a distance in the Y direction) between the pad PD7c and the side SH1 are almost the same as one another. However, a distance (a distance in the Y direction) between the Pad PD5d, PD6d or PD7c and the side SH1 is larger than a distance (a distance in the Y direction) between the pad PD5c, PC6c or PD7d and the side SH1, and a difference in the distance is equal to or larger than the size of one side of the pad PD5c, PC6c or PC7d. At this time, if a row of the pads PD5c, PD6c and PD7d and a row of the pad PD7c, PD5d and PD6d are shifted in the Y direction from each other by such a distance that the coil CL5c and CL6c and the coil CL5d and CL6d do not just overlap with each other, an area required for layout of the coils CL5c, CL6c, CL5d and CL6d, and the pads PD5c, PD6c, PD7c, PD5d, PD6d and PD7d can be reduced. Further, a pitch (space) of the pads PD5c, PD6c and PD7d aligned in the X direction and a pitch (space) of the pads PD7c, PD5d and PD6d can also be made almost equal to each other.

When a plurality of sets of the above-described coils CL5 and CL6 and pads PD5, PD6 and PD7 are formed on the semiconductor chip CP1, a size of a region in the X direction required for layout of these coils and pads can be made small by adopting the layout shown in FIG. 22. Therefore, in the design of a whole semiconductor chip CP1, the layout shown in FIG. 22 is advantageous when it is desired to reduce the size of the region in the X direction required for layout of ones corresponding to the coils CL5 and CL6 and the pad PD5, PD6 and PD7.

Further, in the layout shown in FIG. 22, when the connection member such as a bonding wire (BW) is connected to each of the pads PD5c, PD6c, PD7c, PD5d, PD6d and PD7d, the bonding wire connected to the pad PD7c is positioned between the bonding wire connected to the pad PD5c and the bonding wire connected to the pad PD6c. Further, the bonding wire connected to the pad PD6c is positioned between the bonding wire connected to the pad PD7c and the bonding wire connected to the pad PD5d. The bonding wire connected to the pad PD5d is positioned between the bonding wire connected to the pad PD6c and the bonding wire connected to the pad PD7d. The bonding wire connected to the pad PD7d is positioned between the bonding wire connected to the pad PD5d and the bonding wire connected to the pad PD6d. That is, the bonding wire connected to the pad PD5c, the bonding wire connected to the pad PD7c, the bonding wire connected to the pad PD6c, the bonding wire connected to the pad PD5d, the bonding wire connected to the pad PD7d, and the bonding wire connected to the pad PD6d are aligned in this order.

When the shifting in the Y direction is set aside, the pad PD5c, the pad PD7c, the pad PD6c, the pad PD5d, the pad PD7d and the pad PD6d are aligned in the Y direction in this order. However, practically, these pads PD5c, PD7c, PD6c, PD5d, PD7d and PD6d are arranged alternately in two rows. That is, the pads PD5c, PD6c and PD7d are arranged in one row, and the pads PD7c, PD5d and PD6d are arranged in one row so as to be shifted in the Y direction from the row of the pads PD5c, PD6c and PD7d. That is, the pad PD5c, the pad PD7c, the pad PD6c, the pad PD5d, the pad PD7d and the pad PD6d are arranged in a staggered arrangement. Therefore, it is easy to prevent mutual contact among the bonding wire connected to the pad PD5c, the bonding wire connected to the pad PD7c, the bonding wire connected to the pad PD6c, the bonding wire connected to the pad PD5d, the bonding wire connected to the pad PD7d and the bonding wire connected to the pad PD6d.

Next, a layout of FIG. 23 will be described.

Figure 23:
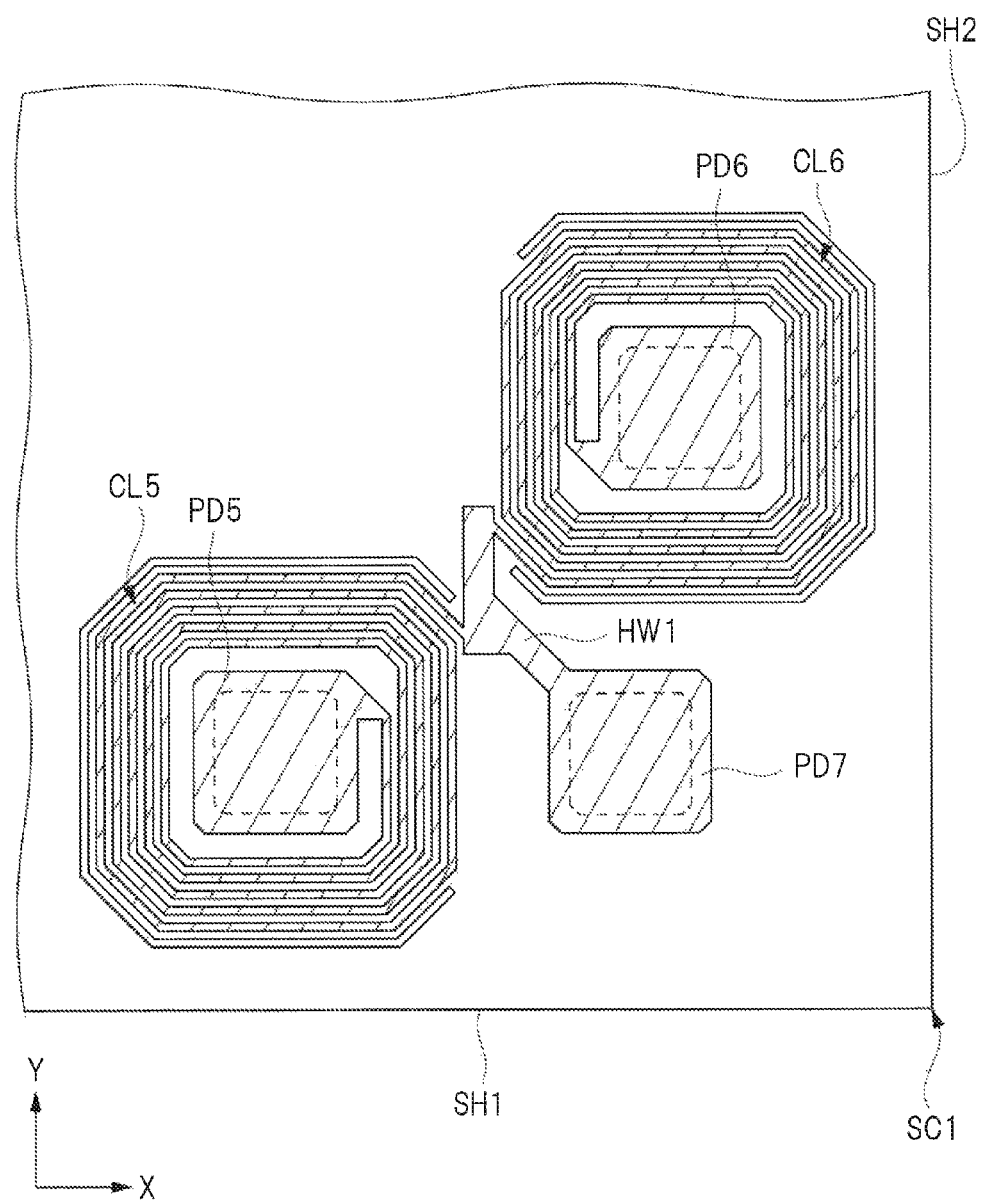
FIG. 23 is a plan view of a principal part of the semiconductor chip of the second embodiment.

In the case shown in FIG. 23, the coil CL5 and the coil CL6 are arranged in an oblique direction between the X direction and the Y direction. The pad PD5 arranged inside the coil CL5 (inside the spiral) is aligned with the pad PD7 in the X direction, and the pad PD6 arranged inside the coil CL6 (inside the spiral) is aligned with the pad PD7 in the Y direction. The pad PD7 and the coil CL5 and CL6 are connected to each other by the lead wiring HW1. The lead wiring HW1 extends from a portion between the coil CL5 and the coil CL6 to the pad PD7.

It is preferable that such a layout shown in FIG. 23 is applied to a case that the coils CL5 and CL6 and the pads PD5, PD6 and PD7 are arranged in the vicinity of a corner of the semiconductor chip CP1 on the main surface of the semiconductor chip CP1. That is, when the coils CL5 and CL6 and the pads PD5, PD6 and PD7 are arranged in the vicinity of a corner portion SC1 of the semiconductor chip CP1 formed by the side SH1 and a side SH2 of the semiconductor chip CP1, the pad PD7 is arranged in the vicinity of the corner portion SC1, the pad PD5 and the pad PD7 are aligned along the side SH1, and the pad PD6 and the pad PD7 are aligned along the side SH2. At this time, the pad PD7 of the pad PD5 and the pad PD7 aligned along the side SH1 is positioned to be closer to the corner SC1, and the pad PD7 of the pad PD6 and the pad PD7 aligned along the side SH2 is positioned to be closer to the corner portion SC1.

In this manner, the coils CL5 and CL6 and the pads PD5, PD6 and PD7 can be efficiently arranged in the vicinity of the corner portion SC1 of the semiconductor chip CP1. Here, the sides SH1 and SH2 are two sides of four sides configuring an outer circumference of the rectangular semiconductor chip CP1, and the side SH1 and the side SH2 intersect each other to form the corner portion SC1. The side SH1 is substantially parallel to the X direction, while the side SH2 is substantially parallel to the Y direction.

Next, a layout of FIG. 24 will be described.

Figure 24:
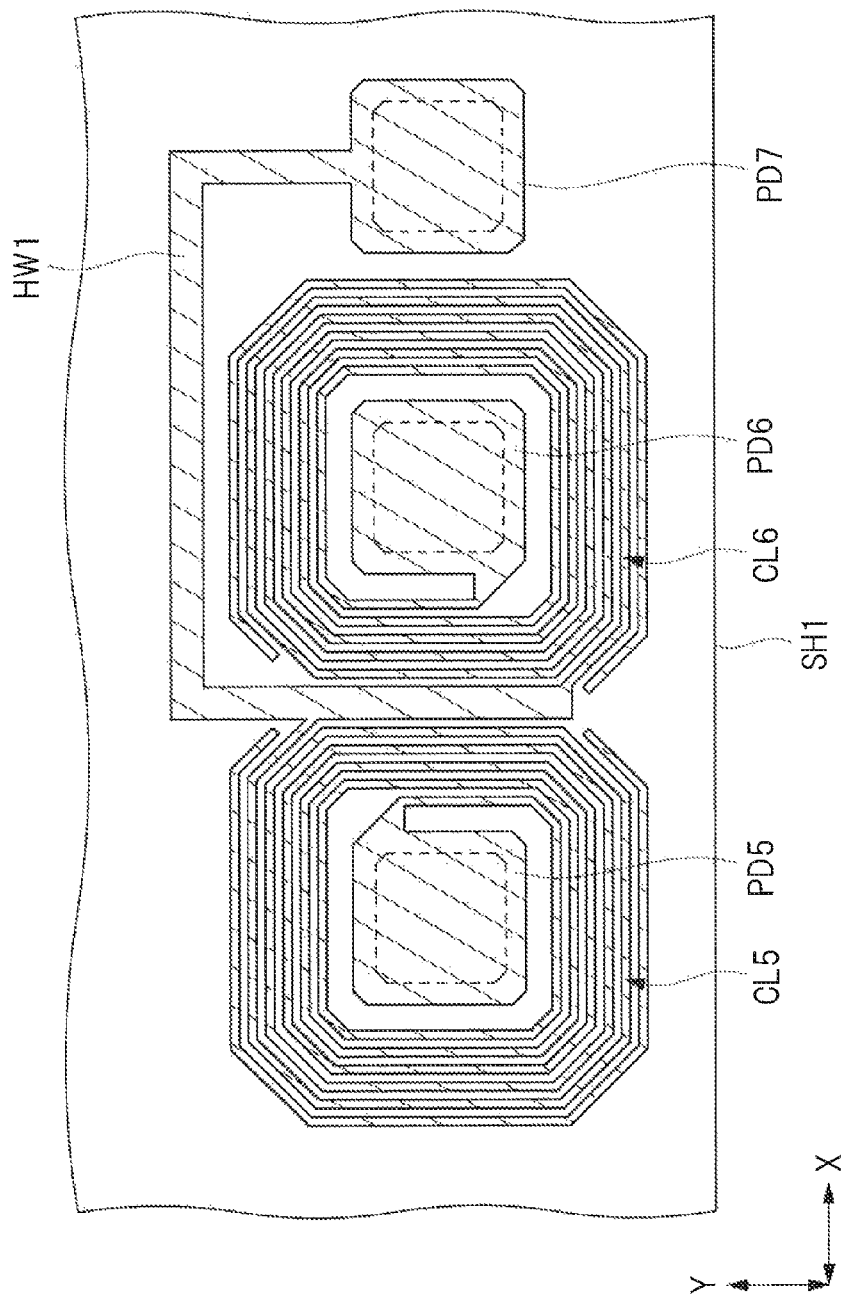
FIG. 24 is a cross-sectional view of a principal part of the semiconductor chip of the second embodiment.

In the case shown in FIG. 24, in the semiconductor chip CP1, the coil CL5 and the coil CL6 are arranged in the vicinity of the side SH1 of the semiconductor chip CP1 along the side SH1. Therefore, the coil CL5 and the coil CL6 are aligned in the X direction. The pad PD5 is arranged inside the coil CL5 (inside the spiral) so as to be connected to one end of the coil CL5, while the pad PD6 is arranged inside the coil CL6 (inside the spiral) so as to be connected to one end of the coil CL6. Since the coil CL5 and the coil CL6 are aligned in the X direction, the pad PD5 and the pad PD6 are also aligned in the X direction.

The pad PD5, the pad PD6 and the pad PD7 are aligned in the X direction. That is, the pad PD7 is arranged at a position on the extension of the coil CL5 and the coil CL6 aligned in the X direction (at a position on the extension in the X direction). In FIG. 24, the pad PD7 is arranged at a position adjacent to the coil CL6 in the X direction. However, as another aspect, the pad PD7 can be arranged at a position adjacent to the coil CL5 in the X direction. The pad PD7 and the coils CL5 and CL6 are connected to each other by the lead wiring HW1. The lead wiring HW1 extends from a portion between the coil CL5 and the coil CL6 to the pad PD7.

In a layout shown in FIG. 24, when a connection member such as a bonding wire (BW) is connected to each of the pads PD5, PD6 and PD7, the bonding wire connected to the pad PD5, the bonding wire connected to the pad PD6 and the bonding wire connected to the pad PD7 are aligned in this order in the X direction.

It is not desired to arrange the pad PD7 between the pad PD5 and the pad PD6 in some cases because of a circuit configuration of another semiconductor chip (CP2) connected with other ends of a plurality of bonding wires whose one ends are connected to the pads PD5, PD6 and PD7 of the semiconductor chip CP1. For example, when the pad PD7 is arranged between the pad PD5 and the pad PD6, it becomes difficult to connect these pads PD5, PD6 and PD7 of the semiconductor chip CP1 and pads of another semiconductor chip (CP2) through the connection member such as a bonding wire (BW) in some cases. In such a case, the pad PD7 is not positioned between the pad PD5 and the pad PD6 as shown in FIG. 24, so that it becomes easy to connect the pads PD5, PD6 and PD7 of the semiconductor chip CP1 to the pads of another semiconductor chip (CP2) through the connection member such as a bonding wire. Further, the pads PD5, PD6 and PD7 are arranged in a row, so that it becomes easy to connect bonding wires to the pads PD5, PD6 and PD7.

Next, a layout of FIG. 25 will be described.

Figure 25:
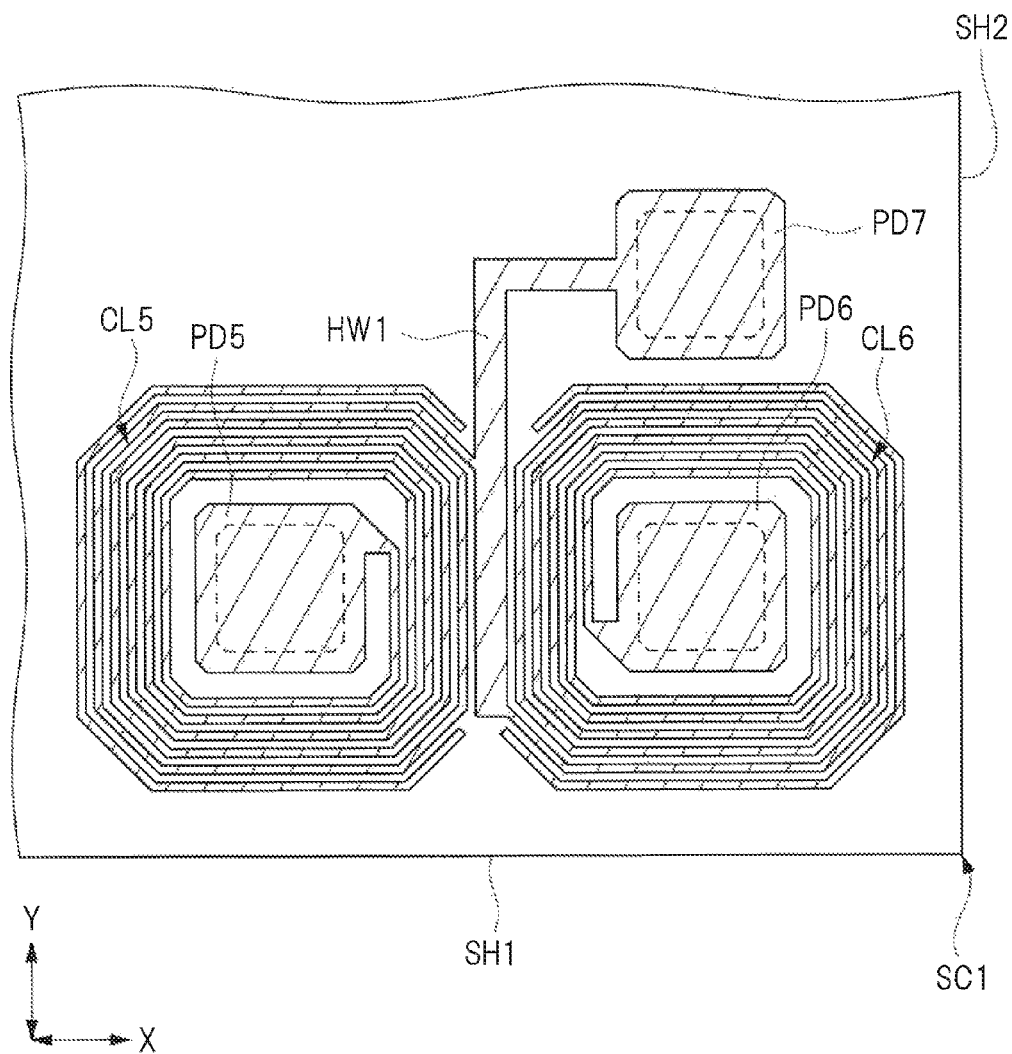
FIG. 25 is a plan view of a principal part of the semiconductor chip of the second embodiment.

In the case shown in FIG. 25, the coil CL5 and the coil CL6 are aligned in the X direction. The pad PD5 is arranged inside the coil CL5 (inside the spiral) so as to be connected to one end of the coil CL5, and the pad PD6 is arranged inside the coil CL6 (inside the spiral) so as to be connected to one end of the coil CL6. Since the coil CL5 and the coil CL6 are aligned in the X direction, the pad PD5 and the pad PD6 are also aligned in the X direction. The pad PD7 is arranged at a position adjacent to the coil CL6 in the Y direction. Therefore, the pad PD7 is aligned with the pad PD6 in the Y direction. That is, in the case shown in the above-described FIG. 21, the pad PD7 is arranged at a position shifted in the Y direction from a central portion between the pad PD5 and the pad PD6 aligned in the X direction. However, in the case shown in FIG. 25, the pad PD7 is arranged at a position shifted in the Y direction from the position of the pad PD6 (at a position shifted so that the pad PD7 does not overlap with the coil CL6). The pad PD7 and the coils CL5 and CL6 are connected to each other by a lead wiring HW1, and the lead wiring HW1 extends from a portion between the coil CL5 and the coil CL6 to the pad PD7.

It is preferable that such a layout shown in FIG. 25 is applied to a case that the coils CL5 and CL6 and the pads PD5, PD6 and PD7 are arranged in the vicinity of a corner portion of the semiconductor chip CP1 on the main surface of the semiconductor chip CP1. That is, when the coils CL5 and CL6 and the pads PD5, PD6 and PD7 are arranged in the vicinity of a corner portion SC1 of the semiconductor chip CP1 formed by the side SH1 and the side SH2 of the semiconductor chip CP1, the coil CL6 is arranged in the vicinity of the corner portion SC1, and the pad PD6 is arranged inside the coil CL6. The coil CL5 is arranged adjacent to the coil CL6 in the X direction, the pad PD5 is arranged inside the coil CL5, and the pad PD7 is arranged adjacent to the coil CL6 in the Y direction. In this manner, the pad PD6 and the pad PD5 are aligned along the side SH1, and the pad PD6 and the pad PD7 are aligned along the side SH2. At this time, the pad PD6 of the pad PD6 and the pad PD5 aligned along the side SH1 is positioned to be closer to the corner portion SC1, and the pad PD6 of the pad PD6 and the pad PD7 aligned along the side SH2 is positioned to be closer to the corner portion SC1.

In this manner, the coils CL5 and CL6 and the pads PD5, PD6 and PD7 can be efficiently arranged in the vicinity of the corner portion SC1 of the semiconductor chip CP1.

In FIG. 25, note that the positions of the coil CL5 and the pad PD5 can be replaced for the position of the pad PD7.

Next, a layout of FIG. 26 will be described.

Figure 26:
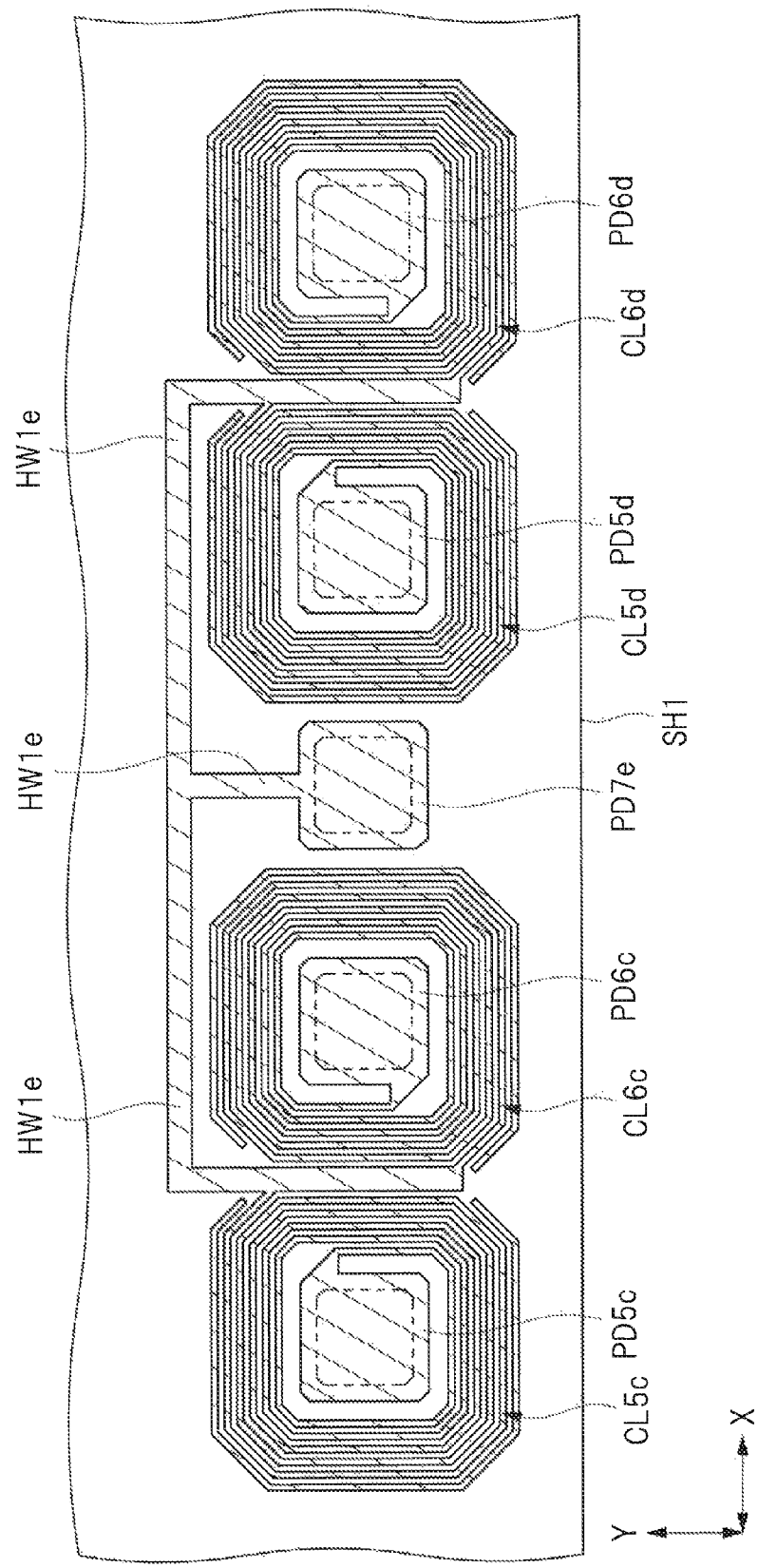
FIG. 26 is a plan view of a principal part of the semiconductor chip of the second embodiment.

Also in the case shown in FIG. 26, as similar to the case shown in the above-described FIG. 22, ones corresponding to the above-described coils CL5 and CL6 and pads PD5, PD6 and PD7 have two sets. However, the pad PD7c and the pad PD7d shown in FIG. 22 are integrated in common so as to be one pad PD7e.

In the case shown in FIG. 26, in the semiconductor chip CP1, the coil CL5c and the coil CL6c are arranged in the vicinity of the side SH1 of the semiconductor chip CP1 along the side SH1. The pad PD5c is arranged inside the coil CL5c (inside the spiral) so as to be connected to one end of the coil CL5c, and the pad PD6c is arranged inside the coil CL6c so as to be connected to one end of the coil CL6c. Since the coil CL5c and the coil CL6c are aligned in the X direction, the pad PD5c and the pad PD6c are also aligned in the X direction.

Further, in the case shown in FIG. 26, in the semiconductor chip CP1, the coil CL5d and the coil CL6d are arranged in the vicinity of the side SH1 of the semiconductor chip CP1 along the side SH1. The pad PD5d is arranged inside the coil CL5d (inside the spiral) so as to be connected to one end of the coil CL5d, and the pad PD6d is arranged inside the coil CL6d (inside the spiral) so as to be connected to one end of the coil CL6d. Since the coil CL5d and the coil CL6d are aligned in the X direction, the pad PD5d and the pad PD6d are also aligned in the X direction.

The coil CL5c, the coil CL6c, the coil CL5d, and the coil CL6d are aligned in the X direction, and a pad PD7e is arranged between the coil CL6c and the coil CL5d. Therefore, the pad PD5c, the pad PD6c, the pad PD7e, the pad PD5d and the pad PD6d are aligned in the X direction. Pitches (spaces) of the pads PD5c, PD6c, PD7e, PD5d and PD6d aligned in the X direction can be set almost equal to one another.

The pad PD7e is connected to (each outer end portion of) the coil CL5c and CL6c and is connected to (each outer end portion of) the coils CL5d and CL6d by a lead wiring HW1e corresponding to the above-described lead wirings HW1. The lead wiring HW1e extends from a portion between the coil CL5c and the coil CL6c to the pad PD7e and extends from a portion between the coil CL5d and the coil CL6d to the pad PD7e.

Since a pad electrically connected between the coil CL5c and the coil CL6c and a pad electrically connected between the coil CL5d and the coil CL6d are configured to be the common pad PD7e, the case shown in FIG. 26 can reduce the number of pads by one smaller than that in the case that the pad PD7c and the pad PD7d are provided separately as shown in the case shown in FIG. 22. In this manner, an area required for layout of the coils CL5c, CL6c, CL5d and CL6d, and the pads PD5c, PD6c, PD7e, PD5d and PD6d can be reduced. Further, the pads PD5c, PD6c, PD7e, PD5d and PD6d are arranged in one row, so that it becomes easy to connect the connection member such as a bonding wire to these pads PD5c, PD6c, PD7e, PD5d and PD6d.

Further, the pad PD7e is arranged between the coil CL6c and the coil CL5d, so that an extension distance of the lead wiring HW1e of an extending portion from a portion between the coil CL5c and the coil CL6c to the pad PD7e and an extension distance of the lead wiring HW1e of an extending portion from a portion between the coil CL5d and the coil CL6d to the pad PD7e can be set almost equal to each other. Therefore, it is easy to almost equalize a resistance component of the lead wiring HW1e required for electrically connecting the pad PD7e to the coil CL5c and the coil CL6c and a resistance component the lead wiring HW1e required for electrically connecting the pad PD7e to the coil CL5d and the coil CL6d, and therefore, the balance between the two channels becomes good.

Next, a layout of FIG. 27 will be described.

Figure 27:
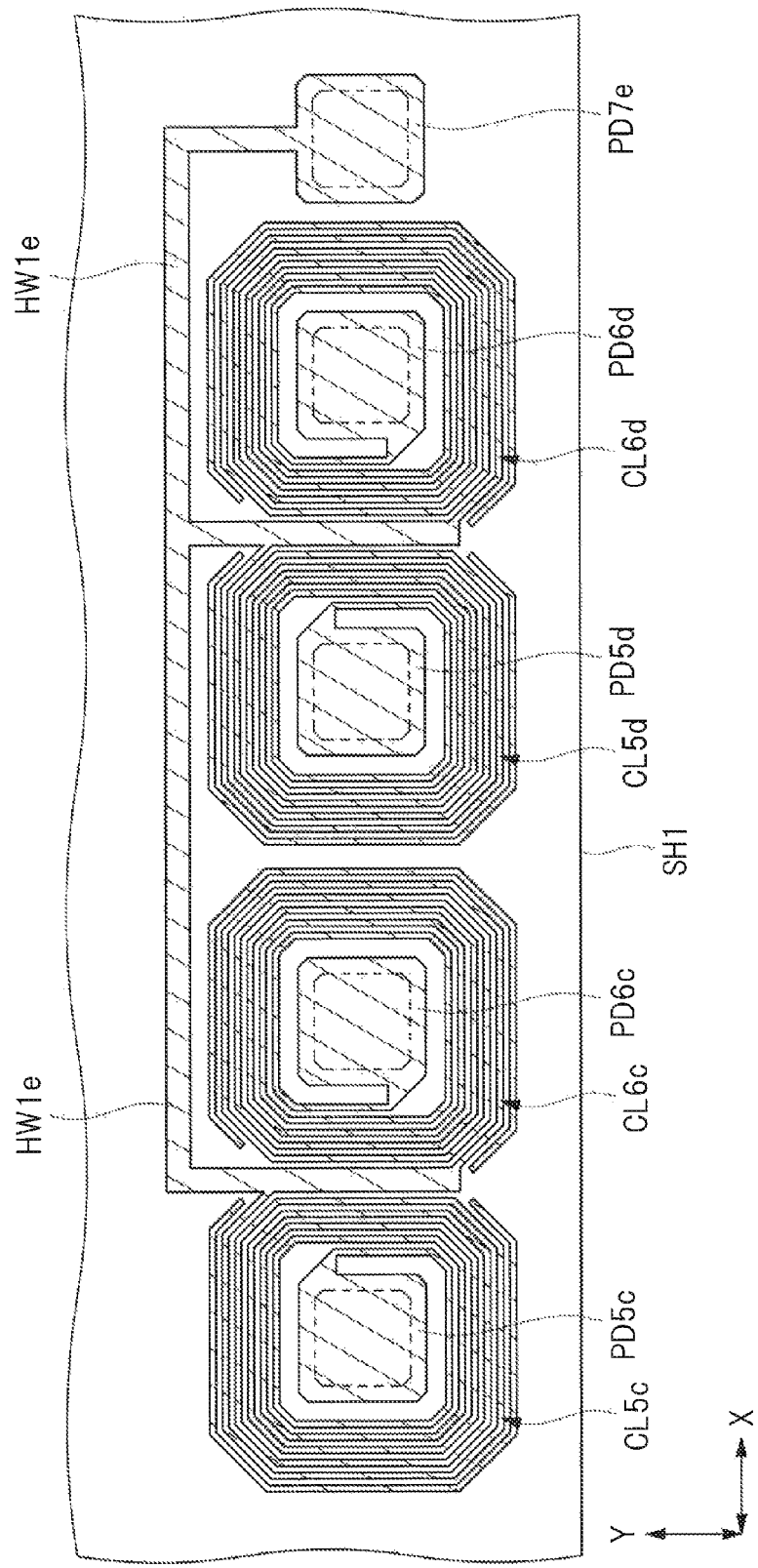
FIG. 27 is a plan view of a principal part of the semiconductor chip of the second embodiment.

The layout of FIG. 27 is a modified example of the layout of FIG. 26.

In the case shown in FIG. 27, in a semiconductor chip CP1, a coil CL5c, a coil CL6c, a coil CL5d and a coil CL6d are arranged in this order in the vicinity of a side SH1 of the semiconductor chip CP1 along the side SH1. A pad PD5c is arranged inside the coil CL5c so as to be connected to one end of the coil CL5c, a pad PD6c is arranged inside the coil CL6c so as to be connected to one end of the coil CL6c, the pad PD5d is arranged inside the coil CL5d so as to be connected to one end of the coil CL5d, and a pad PD6d is arranged inside the coil CL6d so as to be connected to one end of the coil CL6d. Since the coil CL5c, the coil CL6c, the coil CL5d and the coil CL6d are aligned in the X direction, the pad PD5c, the pad PD6c, the pad PD5d and the pad PD6d are also aligned in the X direction.

While the pad PD7e is arranged between the coil CL6c and the coil CL5d in the case shown in FIG. 26, the pad PD7e is not arranged between the coil CL6c and the coil CL5d in the case shown in FIG. 27. That is, in the case shown in FIG. 27, the pad PD7e is arranged at a position on the extension of the coil CL5c, the coil CL6c, the coil CL5d and the coil CL6d aligned in the X direction (at a position on the extension thereof in the X direction) so as to be adjacent to the coil CL6d in the X direction. Note that the pad PD7e can be arranged at a position adjacent to the coil CL5c in the X direction instead of the coil CL6d as another aspect.

In the case shown in FIG. 27, the coil CL6c and the coil CL5d are made closer to each other than the case shown in FIG. 26 by no arrangement of the pad PD7e between the coil CL6c and the coil CL5d. In the case shown in FIG. 27, the pad PD5c, the pad PD6c, the pad PD5d, the pad PD6d and the pad PD7e are aligned in the X direction, and the pad PD7e is arranged in an end of the arrangement. Pitches (spaces) of the pads PD5c, PD6c, PD5d, PD6d and PD7e aligned in the X direction can be set almost equal to one another.

The pad PD7e is connected to (each outer end portion of) the coils CL5c and CL6c and is connected to (each outer end portion of) the coils CL5d and CL6d by lead wirings HW1e corresponding to the above-described lead wirings HW1. The lead wiring HW1e extends from a portion between the coil CL5c and the coil CL6c to the pad PD7e and extends from a portion between the coil CL5d and the coil CL6d to the pad PD7e.

A pad electrically connected between the coil CL5c and the coil CL6c to each other and a pad electrically connected the coil CL5d and the coil CL6d to each other are configured to be a common pad PD7e, so that the case shown in FIG. 27 can reduce the number of pads by one smaller than the case that the pad PD7c and the pad PD7d are provided separately as shown in the case shown in FIG. 22. In this manner, an area required for layout of the coils CL5c, CL6c, CL5d and CL6d, and the pads PD5c, PD6c, PD7e, PD5d and PD6d can be reduced. Further, the pads PD5c, PD6c, PD5d, PD6d and PD7e are arranged in one row, so that it becomes easy to connect the connection member such as a bonding wire to these pads PD5c, PD6c, PD5d, PD6d and PD7e.

Further, when there is such a demand (a demand for designing or others) that it is not desired to arrange the pad PD7e among the pads PD5c, PD6c, PD5d and PD6d, this case is supported by arranging the pad PD7e at a position on the extension of the pads PD5c, PD6c, PD5d and PD6d aligned in the X direction as shown in FIG. 27.

Next, a layout of FIG. 28 will be described.

Figure 28:
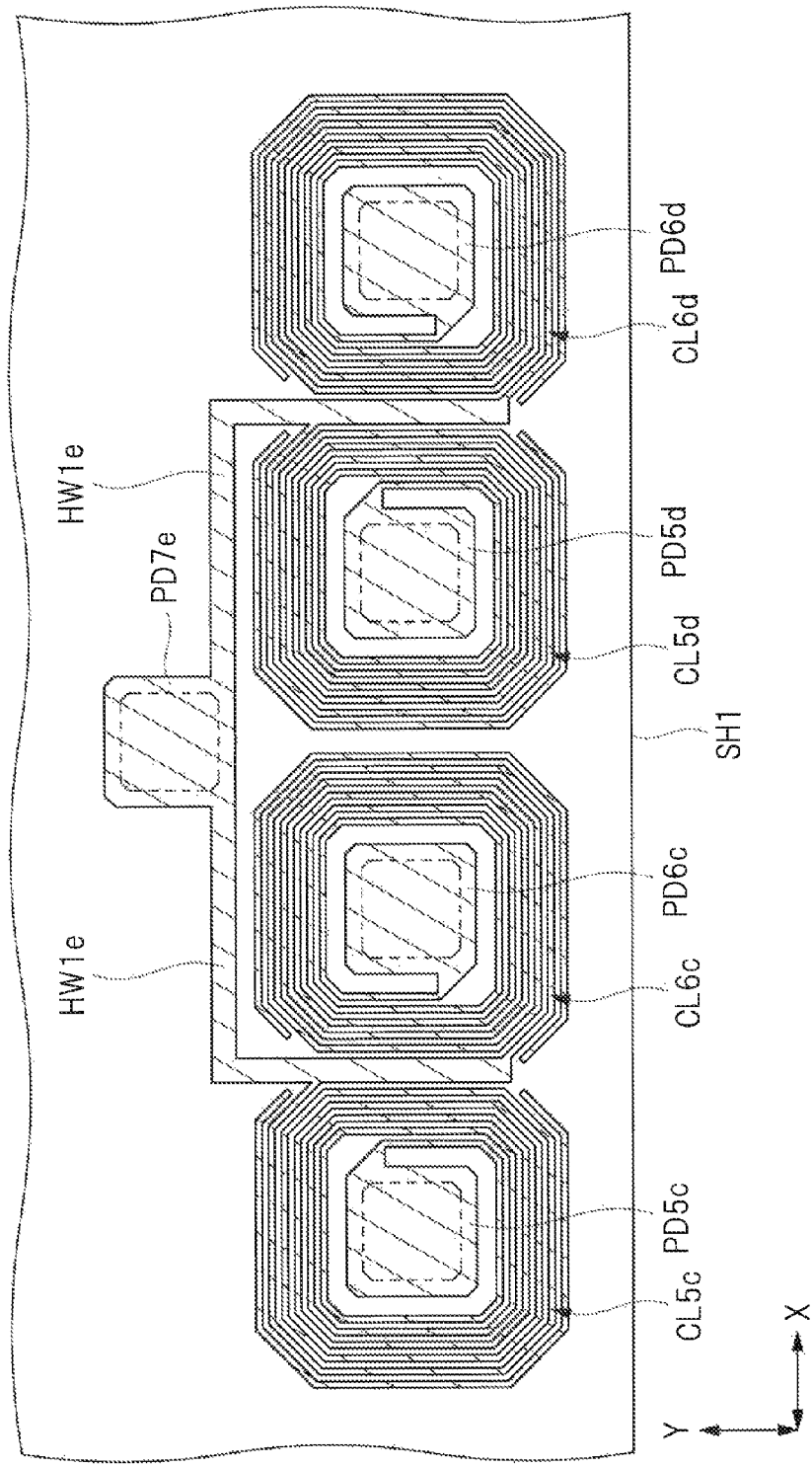
FIG. 28 is a cross-sectional view of a principal part of the semiconductor chip of the second embodiment.

The layout of FIG. 28 is a modified example of the layout of FIG. 26 and the layout of FIG. 27.

In a case shown in FIG. 28, in a semiconductor chip CP1, a coil CL5c, a coil CL6c, a coil CL5d and a coil CL6d are arranged in this order in the vicinity of a side SH1 of the semiconductor chip CP1 along the side SH1. A pad PD5c is arranged inside the coil CL5c so as to be connected to one end of the coil CL5c, the pad PD6c is arranged inside the coil CL6c so as to be connected to one end of the coil CL6c, the pad PD5d is arranged inside the coil CL5d so as to be connected to one end of the coil CL5d, and the pad PD6d is arranged inside the coil CL6d so as to be connected to one end of the coil CL6d. Since the coil CL5c, the coil CL6c, the coil CL5d and the coil CL6d are aligned in the X direction, the pad PD5c, the pad PD6c, the pad PD5d and the pad PD6d are also aligned in the X direction.

While the pad PD7e is arranged between the coil CL6c and the coil CL5d in the case shown in FIG. 26, the pad PD7e is not arranged between the coil CL6c and the coil CL5d in the case shown in FIG. 28. That is, in the case shown in FIG. 28, the pad PD7e is arranged at a position shifted by a predetermined distance in the Y direction from a position between the coil CL6c and the coil CL5d aligned in the X direction (at a position shifted in a direction spaced away from the side SH1).

Also in the case shown in FIG. 28 as similar to the case shown in FIG. 27, the coil CL6c and the coil CL5d are made closer to each other than the case shown in FIG. 26 by no arrangement of the pad PD7e between the coil CL6c and the coil CL5d. Pitches (spaces) of the pads PD5c, PD6c, PD5d and PD6d can be set almost equal to each other.

The pad PD7e is connected to (each outer end portion of) the coils CL5c and CL6c and is connected to (each outer end portion of) the coils CL5d and CL6d by lead wirings HW1e corresponding to the above-described lead wirings HW1. The lead wirings HW1e extend from a portion between the coil CL5c and the coil CL6c to the pad PD7e and extend from a portion between the coil CL5d and the coil CL6d to the pad PD7e.

In the case shown in FIG. 28, the pad PD5c, the pad PD6c, the pad PD5d and the pad PD6d are aligned in the X direction, and the pad PD7e is arranged at a position shifted by a predetermined distance in the Y direction from a position between the pad PD6c and the pad PD5d (at a position shifted in a direction spaced away from the side SH1). That is, a distance between the pad PD5c and the side SH1 (a distance in the Y direction), a distance between the PD6c and the side Sill (a direction in the Y direction), a distance between the PD5d and the side SH1 (a direction in the Y direction), and a distance between the PD6d and the side SH1 (a direction in the Y direction) are almost the same as one another. On the other hand, a distance between the pad PD7e and the side SH1 (a distance in the Y direction) is larger than the distance between the pad PD5c, PD6c, PD5d or PD6d and the side SH1 (a distance in the Y direction), and a difference therebetween is equal to or larger than the size of one side of the pad PD5c, PD6c, PD5d or PD6d.

In the case shown in FIG. 28, since a pad electrically connected between the coil CL5c and the coil CL6c and a pad electrically connected between the coil CL5d and the coil CL6d are configured to be a common pad PD7c, the number of pads can be reduced by one smaller than that of the case that the pad PD7c and the pad PD7d are provided separately from each other as shown in the case shown in FIG. 22. In this manner, an area required for layout of the coils CL5c, CL6c, CL5d and CL6d, and the pads PD5c, PD6c, PD7e, PD5d and PD6d can be reduced.

Further, in the layout shown in FIG. 28, a size of a region in the X direction required for layout of the coils CL5c, CL6c, CL5d and CL6d, and the pads PD5c, PD6c, PD5d, PD6d and PD7e can be made small, and can be set, for example, as the same as the total of the respective sizes in the X direction of the coils CL5c, CL6c, CL5d and CL6d. Therefore, in the design of a whole semiconductor chip CP1, this layout is advantageous in the case that it is desired to reduce the size of the region in the X direction required for layout of the coils CL5c, CL6c, CL5d and CL6d, and the pads PD5c, PD6c, PD5d, PD6d and PD7e.

Further, in the layout shown in FIG. 28, when the connection member such as a bonding wire is connected to each of the pads PD5c, PD6c, PD5d, PD6d and PD7e, a bonding wire connected to the pad PD7e is positioned between the bonding wire connected to the pad PD6c and the bonding wire connected to the pad PD5d. Since the pad PD7e is shifted in the Y direction from a position at which the pads PD6c and PD5d are aligned, it becomes easy to prevent mutual contact among the bonding wire connected to the pad PD6c, the bonding wire connected to the pad PD7e, and the bonding wire connected to the pad PD5d.

Further, the pad PD7e is arranged at a position shifted in the Y direction from a position between the coil CL6c and the coil CL5d, so that an extension distance of the lead wiring HW1e of a portion extending from a portion between the coil CL5c and the coil CL6c to the pad PD7e and an extension distance of the lead wiring HW1e of a portion extending from a portion between the coil CL5d and the coil CL6d to the pad PD7e can be set almost equal to each other. Therefore, since it is easy to almost equalize a resistance component of a portion of the lead wiring HW1e electrically connecting the pad PD7e between the coil CL5c and the coil CL6c and a resistance component of a portion of the lead wiring HW1e electrically connecting the pad PD7e between the coil CL5d and the coil CL6d, the balance between the two channels becomes good.

Next, a layout of FIG. 29 will be described.

Figure 29:
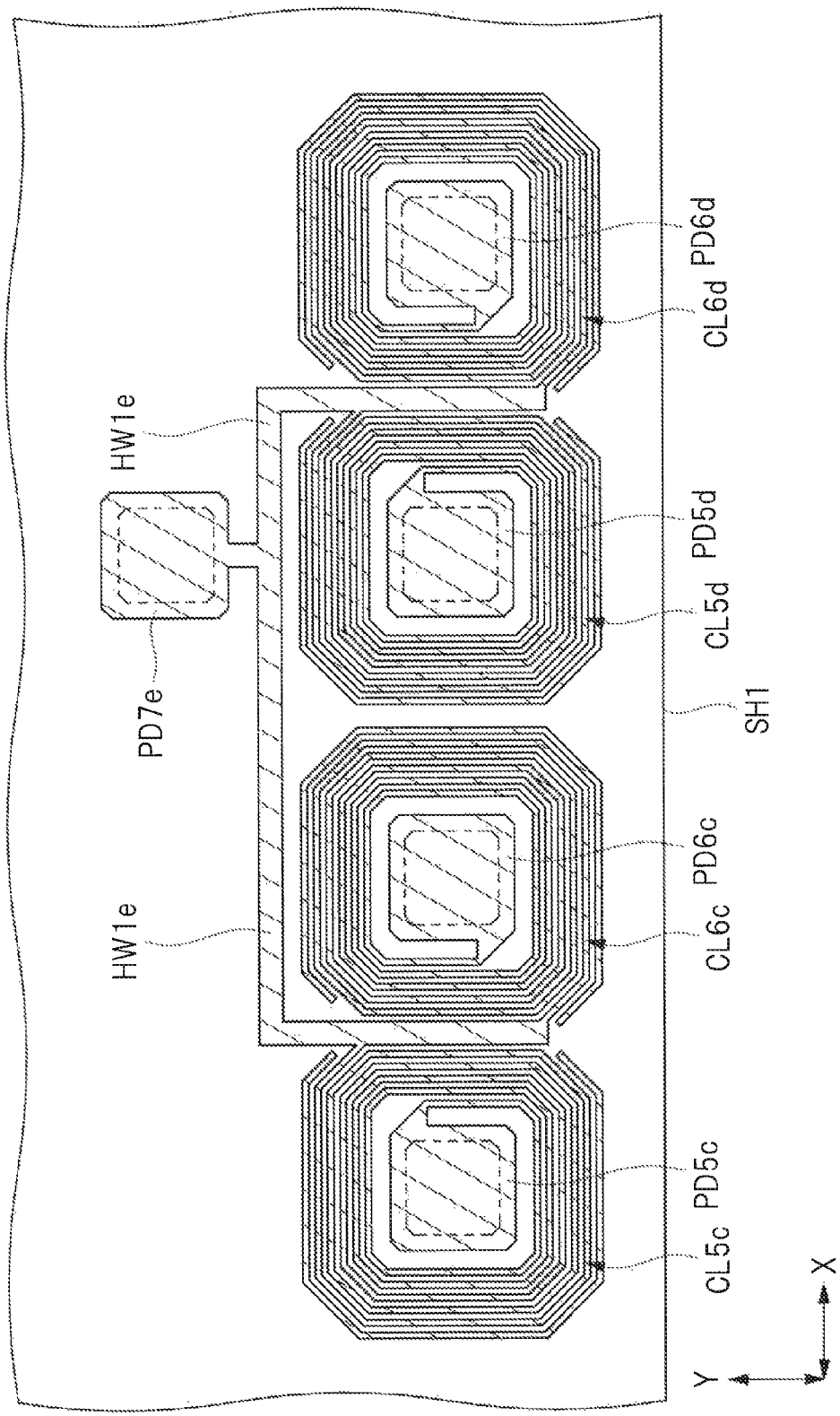
FIG. 29 is a cross-sectional view of a principal part of the semiconductor chip of the second embodiment.

The layout of FIG. 29 is a modified example of the layout of FIG. 28.

Since a main difference of the layout shown in FIG. 29 from the layout shown in the above-described FIG. 28 lies in an arrangement position of the pad PD7e, explanation about members other than the pad PD7e will be omitted here.

In the case shown in FIG. 28, the pad PD7e is arranged at a position shifted in the Y direction from a position between the coil CL6c and the coil CL5d which are two coils positioned on a central side of four coils CL5c, CL6c, CL5d and CL6d aligned in the X direction. Therefore, if the shifting in the Y direction is set aside in the layout shown in FIG. 28, the pad PD7e is positioned at almost center of alignment of the coils CL5c, CL6c, CL5d and CL6d (the pad PD7e is practically shifted in the Y direction from the alignment of the coils CL5c, CL6c, CL5d and CL6d).

On the other hand, while the case of the layout shown in FIG. 29 is common with the layout shown in the above-described FIG. 28 in such a point that the pad PD7e is arranged at a position shifted in the Y direction from four coils CL5c, CL6c, CL5d and CL6d aligned in the X direction, it is different from the layout of the above-described FIG. 28 in the position of the pad PD7e in the X direction. That is, when the shifting in the Y direction is set aside, the pad PD7e is positioned at almost center of the alignment of the coils CL5c, CL6c, CL5d and CL6d in the case of the layout shown in the above-described FIG. 28 while the pad PD7e is shifted from the center of the alignment of the coils CL5c, CL6c, CL5d and CL6d in the case shown in FIG. 29. For example, the pad PD7e can be arranged at a position shifted in the Y direction from any one of the pads PD5c, PD6c, PD5d and PD6d, at a position shifted in the Y direction from a position between the coil CL5c and the coil CL6c, at a position shifted in the Y direction from a position between the coil CL5d and the coil CL6d, or others.

In the case shown in FIG. 29, since a pad electrically connected between the coil CL5c and the coil CL6c and a pad electrically connected between the coil CL5d and the coil CL6d are configured to be a common pad PD7e, the number of pads can be reduced by one smaller than that of the case that the pad PD7c and the pad PD7d are provided separately from each other as shown in the case shown in FIG. 22. In this manner, an area required for layout of the coils CL5c, CL6c, CL5d and CL6d, and the pads PD5c, PD6c, PD7e, PD5d and PD6d can be reduced.

Further, in the layout shown in FIG. 29, a size of a region in the X direction required for layout of the coils CL5c, CL6c, CL5d and CL6d, and the pads PD5c, PD6c, PD5d, PD6d and PD7e can be made small, and can be set, for example, as the same as the total of the respective sizes in the X direction of the coils CL5c, CL6c, CL5d and CL6d. Therefore, in the design of a whole semiconductor chip CP1, this layout is advantageous in the case that it is desired to reduce the size of the region in the X direction required for layout of the coils CL5c, CL6c, CL5d and CL6d, and the pads PD5c, PD6c, PD5d, PD6d and PD7e.

Next, a layout of FIG. 30 will be described.

The case that each of the coils CL5, CL5c, CL5d, CL6, CL6c, CL6d, CL7 and CL8 explained above are formed by a coil wiring winding in an octagon is illustrated. However, as another embodiment, each shape of (the coil wiring configuring) these coils CL5, CL5c, CL5d, CL6, CL6c, CL6d, CL7 and CL8 can be also a shape other than the octagon. Another example of the shape is illustrated in FIG. 30, and still another example thereof is illustrated in FIG. 31.

Figure 30:
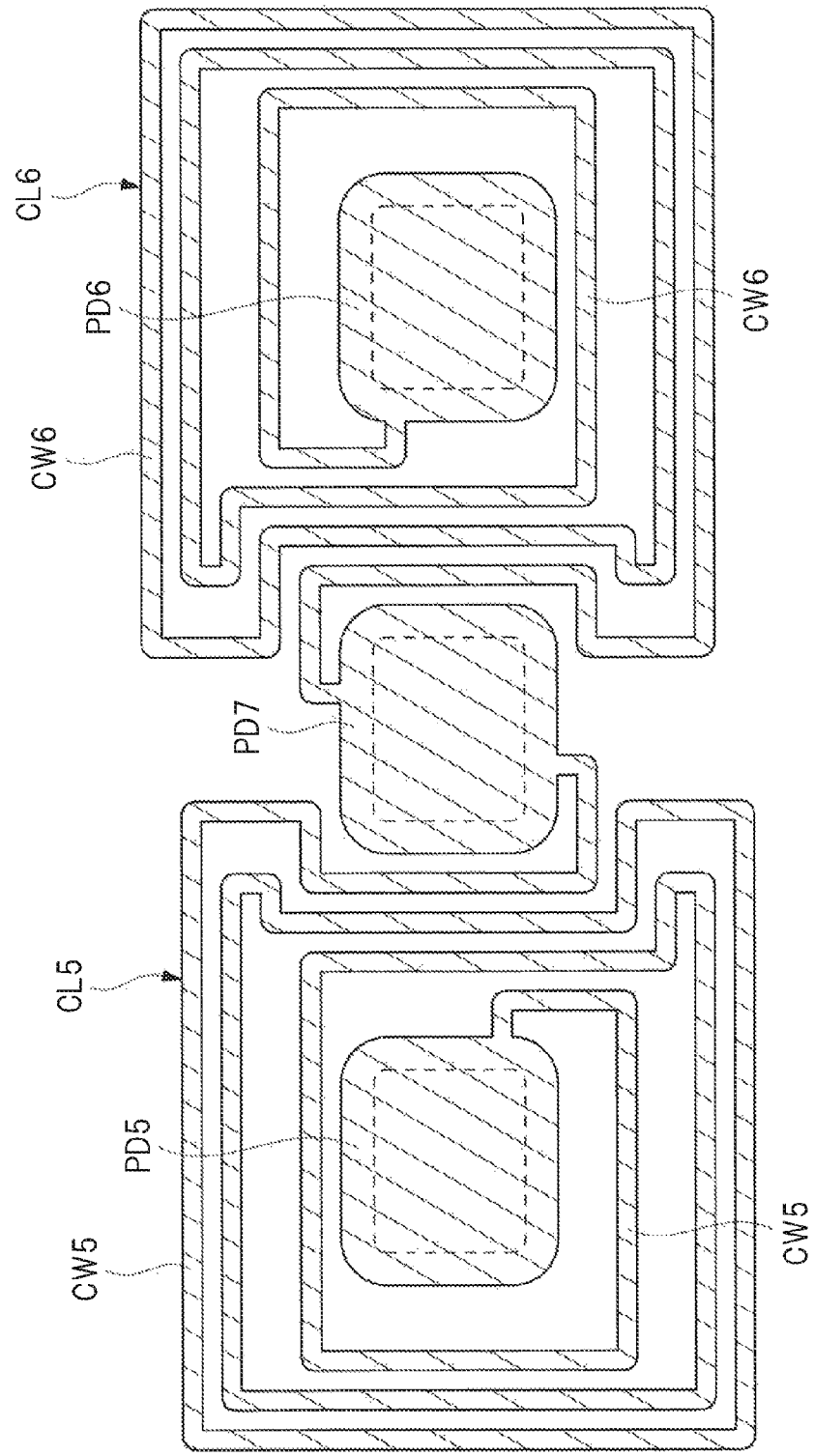
FIG. 30 is a cross-sectional view of a principal part of the semiconductor chip of the second embodiment.

FIG. 30 schematically illustrates a case that each shape (winding shape) of the coils CL5 and CL6 (the coil wirings CW5 and CW6) is a shape other than the octagon in the above-described FIG. 14 (the first modified embodiment). As also shown in FIG. 30, as long as the coil CL5 (the coil wiring CW5) and the coil CL6 (the coil wiring CW6) can maintain so as to be symmetric with each other, a circle, a rectangle, an octagon, a shape other than them, or others can be used.

Figure 31:
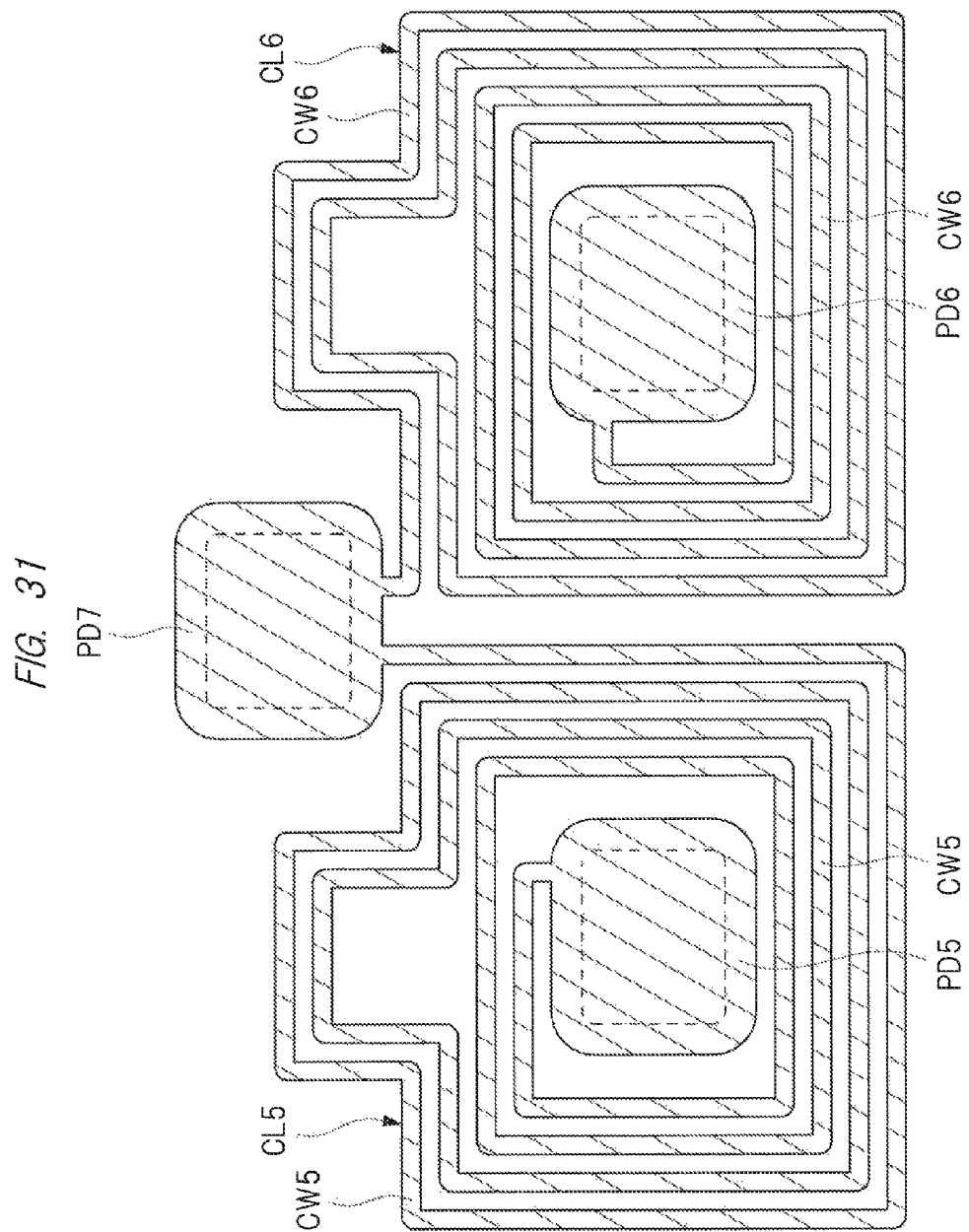
FIG. 31 is a cross-sectional view of a principal part of the semiconductor chip of the second embodiment.

FIG. 31 schematically illustrates a case that each shape (winding shape) of the coils CL5 and CL6 (the coil wirings CW5 and CW6) is a shape other than the octagon in the above-described FIG. 5. As also shown in FIG. 31, as long as the coil CL5 (the coil wiring CW5) and the coil CL6 (the coil wiring CW6) can maintain so as to be symmetric with each other, a circle, a rectangle, an octagon, a shape other than them, or others can be used.

Note that it is preferable that self-inductances of the coil CL5 and the coil CL6 connected in series are the same as each other. Therefore, it is preferable that the coil CL5 (the coil wiring CW5) and the coil CL6 (the coil wiring CW6) have a pattern (shape) of a point symmetry (a point symmetry with respect to a central point between the coil CL5 and the coil CL6) in a plan view. Further, it is preferable that self-inductances of the coil CL7 and the coil CL8 connected in series are the same as each other. Therefore, it is preferable that the coil CL7 (the coil wiring CW7) and the coil CL8 (the coil wiring CW8) have a pattern (shape) of a point symmetry (a point symmetry with respect to a central point between the coil CL7 and the coil CL8) in a plan view. Further, it is preferable that the above-described coil CL7 (the coil wiring CW7) just below the coil CL5 has the same pattern as that of the coil CL5 (the coil wiring CW5), and it is preferable that the above-described coil CL8 (the coil wiring CW8) just below the coil CL6 has the same pattern as that of the coil CL6 (the coil wiring CW6). It is preferable that the pad PD7 is electrically connected at a central portion between the coil CL5 and the coil CL6 connected in series.

Third Embodiment

The third embodiment relates to a devising one about internal wirings in a semiconductor chip formed with coils for signal transmission (coils corresponding to the CL5, CL6, CL7 and CL8) using electromagnetic induction as described above.

As described in the first embodiment, a signal can be transmitted through the coils CL5, CL6, CL7 and CL8 by magnetically coupling the coils CL5 and CL6 and the coils CL7 and CL8 in the above-described FIGS. 5 to 9, respectively, and utilizing the flow of the induction current caused by the electromotive forces generated in the coils CL5 and CL6 on the secondary side in accordance with charges of the current when a current is flowed in the coils CL7 and CL8 on the primary side. That is, a signal can be transmitted through the coils CL5, CL6, CL7 and CL8 by utilizing the electromagnetic induction. Therefore, it is preferable that an internal wiring of a semiconductor chip is designed in consideration of occurrence of a magnetic flux (a magnetic field) caused by a coil.

Regarding a semiconductor chip embedding the coils CL5, CL6, CL7 and CL8 therein, when a layout of internal wirings (wirings corresponding to the above-described wirings M1 to M5) of the semiconductor chip CP1 is designed, it is desirable on characteristics that the internal wirings are not arranged at a position overlapping with the coil CL5, CL6, CL7 or CL8 in a plan view. This is because, while the magnetic fluxes are generated so as to penetrate through the coils CL5, C16, CL7 and CL8 when a current flows in the coils CL7 and CL8 on the primary side or induction currents flow in the coils CL5 and CL6 on the secondary side, the internal wiring is adversely influenced by the magnetic flux when there is the internal wiring at a position overlapping with the coil CL5, C16, CL7 or CL8 in a plan view. Specifically, an eddy current is generated in the internal wiring by the influence of the magnetic flux, and the eddy current interrupts normal flow of the current in the internal wiring, which results in increase of a wiring resistance or others.

Therefore, when the designing of the semiconductor chip is tried so that the internal wiring is not arranged at the position overlapping with the coil CL5, CL6, CL7 or CL8 in a plan view, the region overlapping with the coil CL5, CL6, CL7 or CL8 in a plan view becomes an arrangement inhabitation region of the internal wiring, and therefore, it is difficult to perform the layout of the internal wiring, and the area of the semiconductor chip is increased. Therefore, it is desired to arrange the internal wiring at the position overlapping with the coil CL5, CL6, CL7 or CL8 in a plan view in some cases based on the design. In such a case, a technique as reducing the influence of the magnetic flux caused from the coil CL5, CL6, CL7 or CL8 as much as possible has been studied.

As a result, when the internal wiring is arranged at the position overlapping with the coil CL5, CL6, CL7 or CL8 in a plan view in the semiconductor chip, it has been found that it is effective to provide a slit in the internal wiring. By providing the slits, a wire width of a portion sandwiched by the slits is reduced without changing a total wire width, so that it becomes difficult to generate the eddy current due to the magnetic flux caused by the coil CL5, CL6, CL7 or CL8. This is because the generation of the eddy current is more difficult as the wiring width is smaller (narrower) since the eddy current is generated in a wiring when the magnetic flux penetrates through the wiring, and the eddy current is easily generated in a wiring with a large (wide) width.

Hereinafter, detailed explanation will be made with reference to the drawings.

Figure 32:
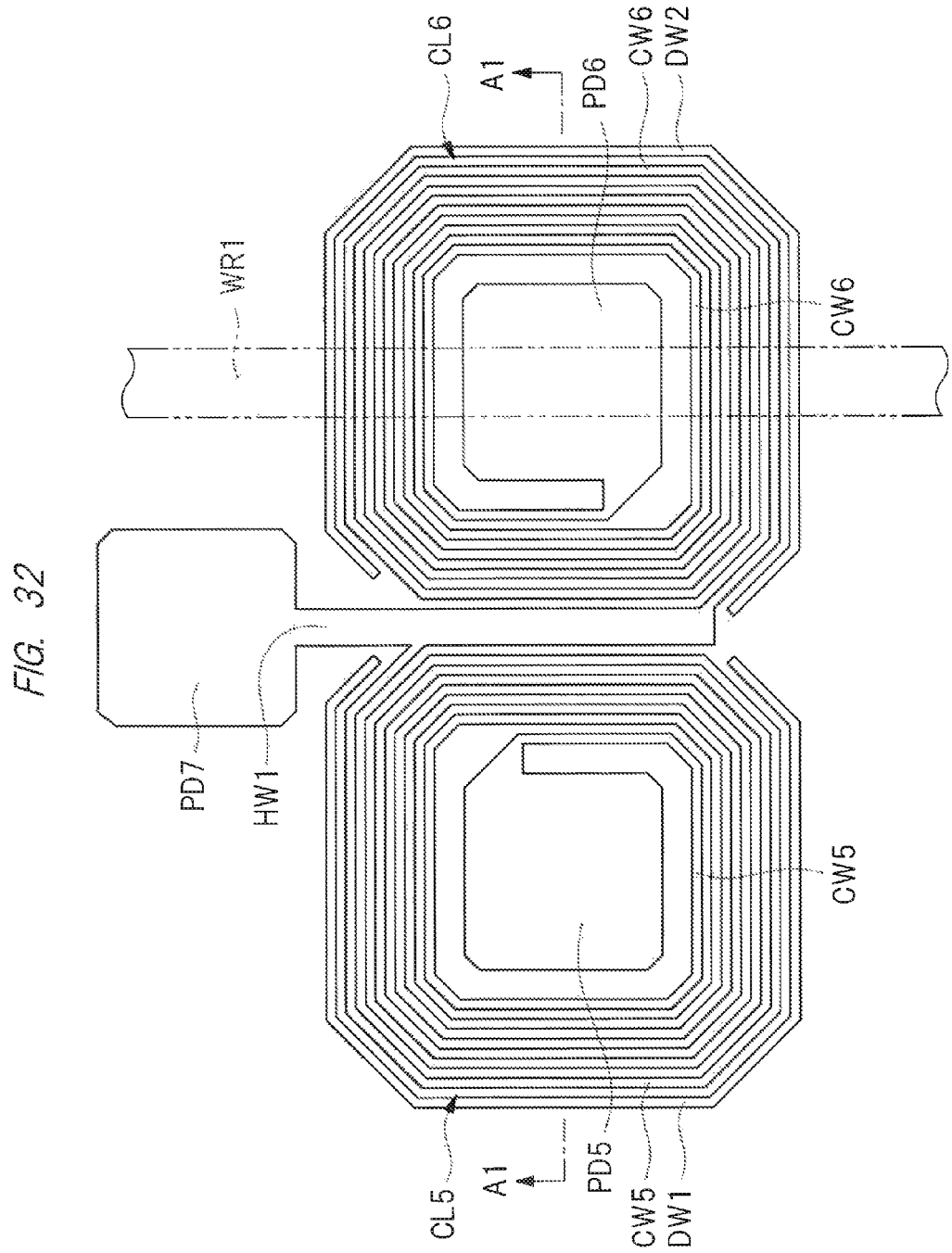
FIG. 32 is a plan view of a principal part of a semiconductor chip of a third embodiment.
Figure 33:
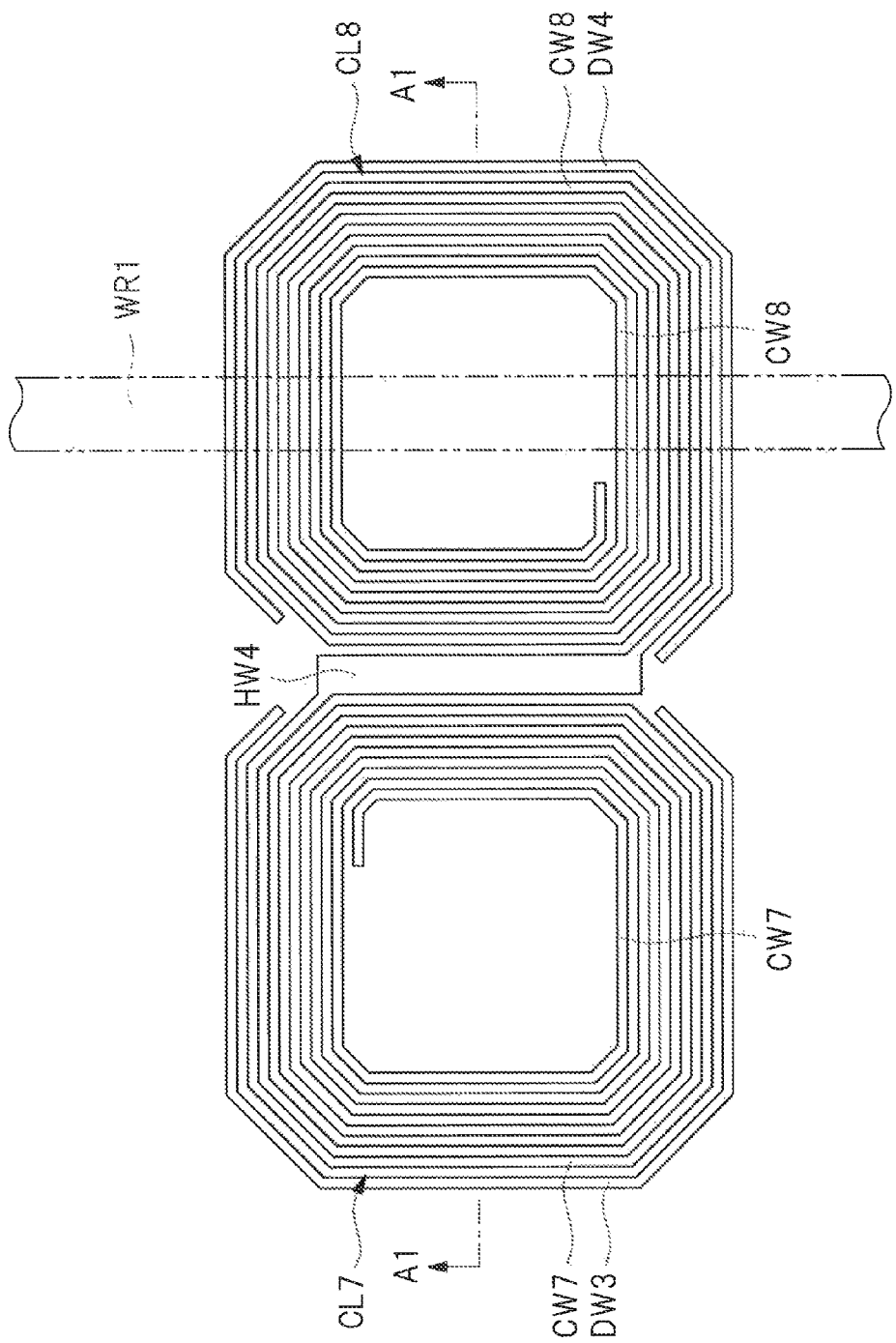
FIG. 33 is a plan view of a principal part of the semiconductor chip of the third embodiment.
Figure 34:
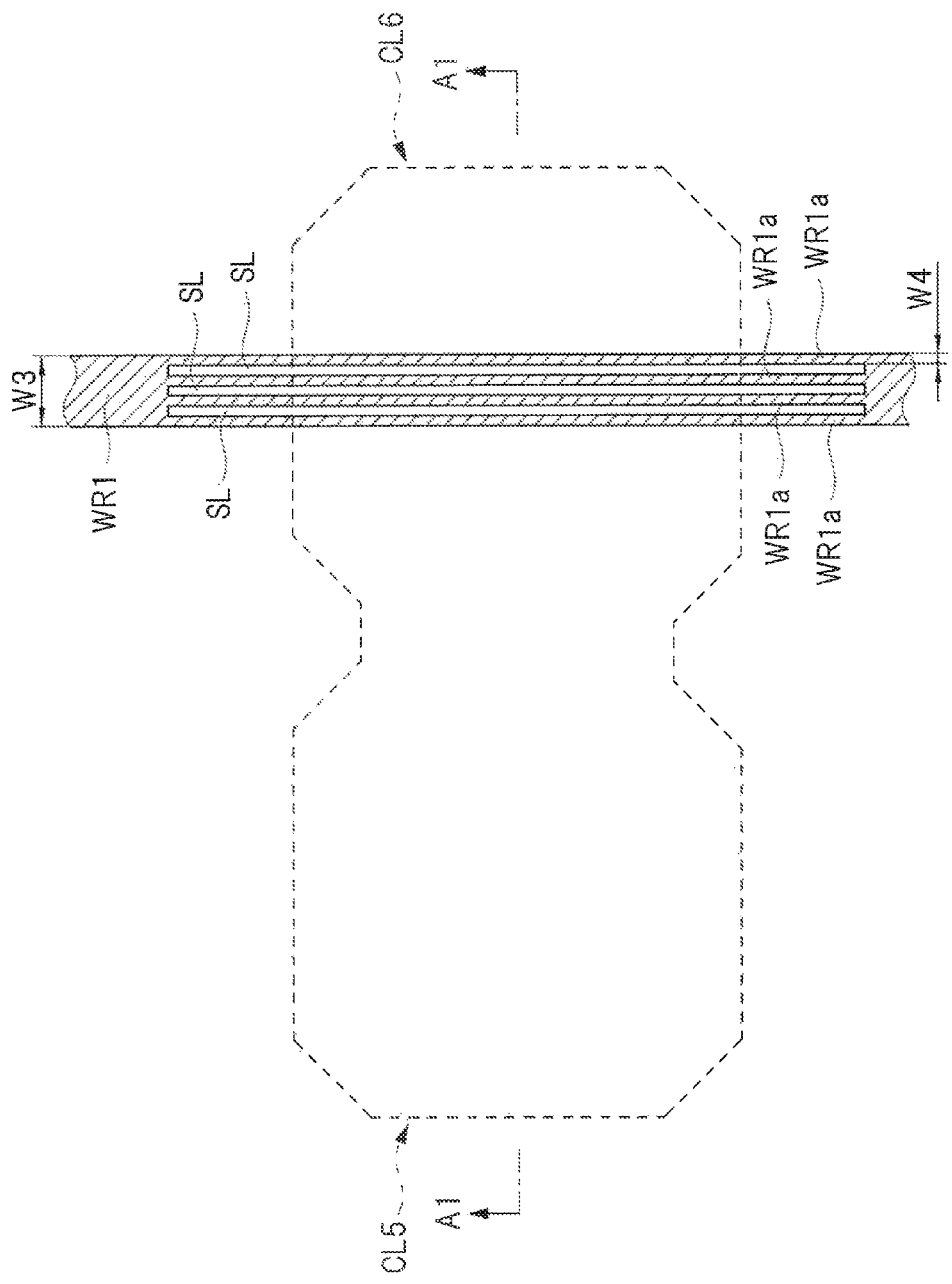
FIG. 34 is a plan view of a principal part of the semiconductor chip of the third embodiment.
Figure 35:
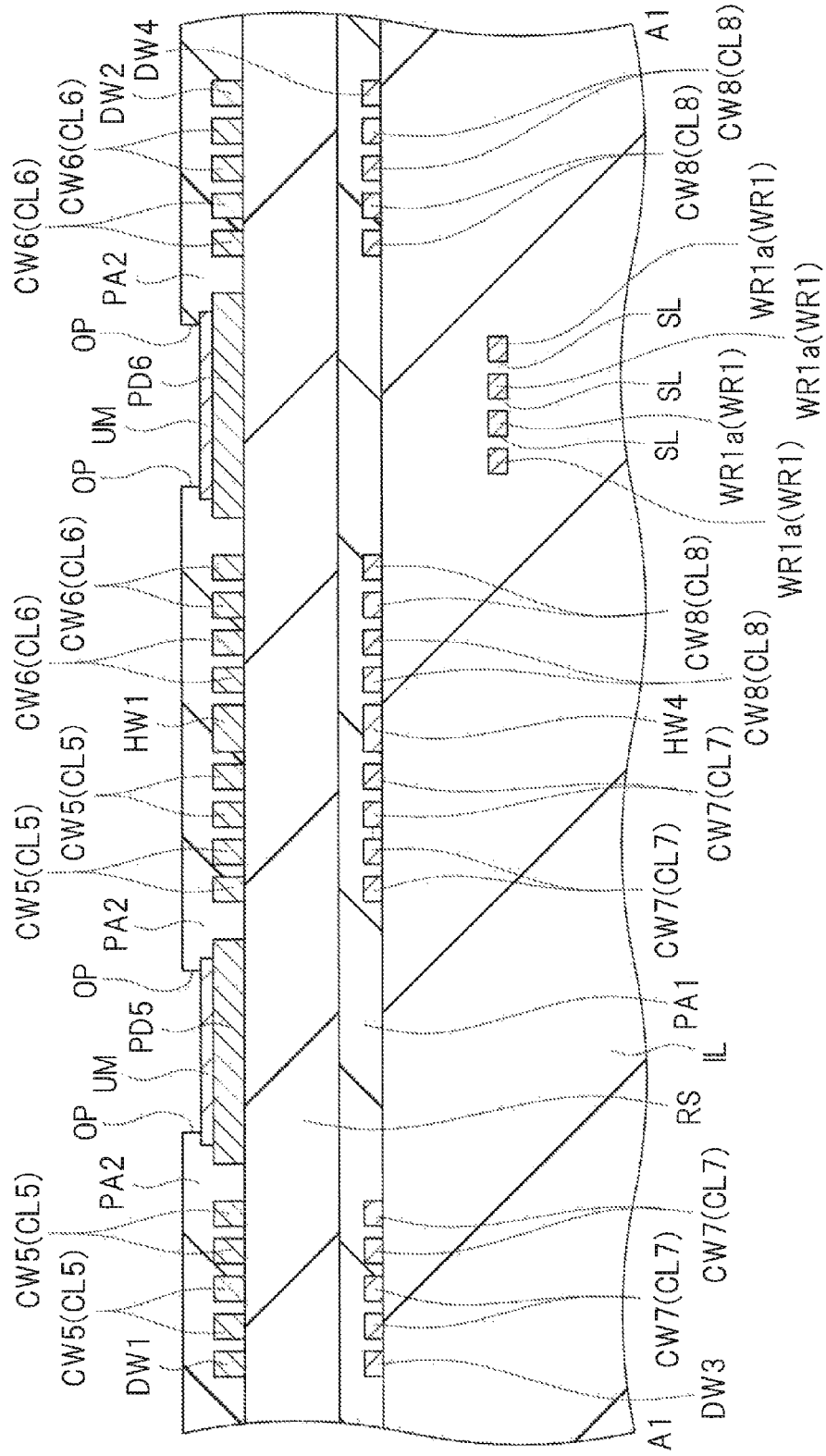
FIG. 35 is a cross-sectional view of a principal part of the semiconductor chip of the third embodiment.
Figure 36:
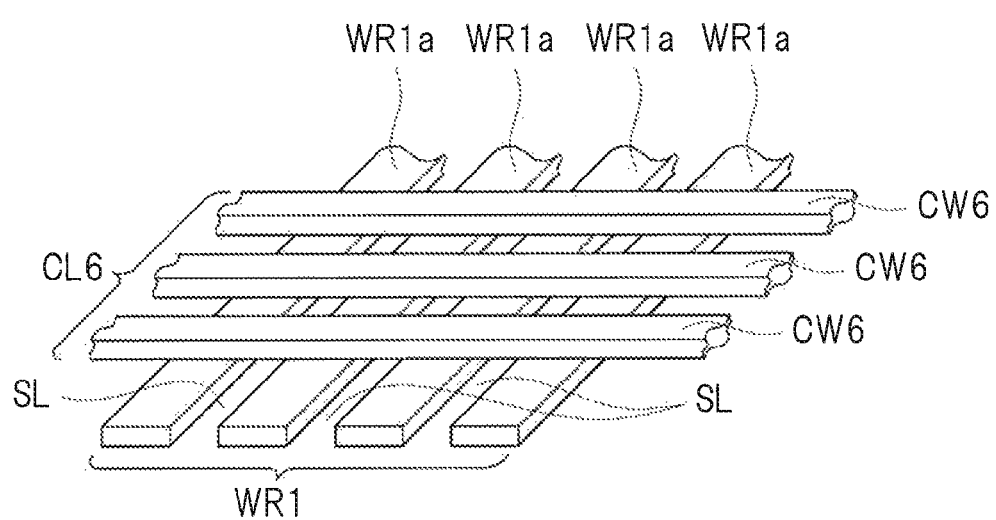
FIG. 36 is a perspective view of a principal part of the semiconductor chip of the third embodiment.

Each of FIG. 32 to FIG. 34 is a plan view of a principal part of a semiconductor chip (a semiconductor device) of the third embodiment, FIG. 35 is a cross-sectional view of the principal part thereof, and FIG. 36 is a perspective view of the principal part thereof. FIG. 32 of these drawings corresponds to the above-described FIG. 5 of the first embodiment, and FIG. 33 thereof corresponds to the above-described FIG. 6 of the first embodiment (however, hatchings are omitted in FIG. 32 and FIG. 33).

Note that FIG. 32, FIG. 33 and FIG. 34 show the same plane region in a semiconductor chip but show different layers, and FIG. 3 shows a lower layer than that of FIG. 32, and FIG. 34 shows a lower layer than that of FIG. 33. Specifically, FIG. 32 shows the secondary-side coils (the coils CL5 and CL6) of the above-described transformer TR1 formed in the semiconductor chip, FIG. 33 shows the primary-side coils (the coils CL7 and CL8) of the above-described transformer TR1 formed in the semiconductor chip, and FIG. 34 shows the wiring WR1 extending so as to overlap with a coil for the above-described transformer TR1 formed in the semiconductor chip CP1 in a plan view. Further, cross-sectional views of FIG. 32 to FIG. 34 taken along a line A1-A1 correspond to FIG. 35. Further, FIG. 36 shows an intersection region between the coil wiring CW6 and the wiring WR1.

Further, FIG. 32 and FIG. 33 show a position of an external form (an outer circumference) of the wiring WR1 by a two-dot chain line for easy understanding the position of the wiring WR1. Further, FIG. 34 shows a position of an external form (an outer circumference) of the coil CL5 and CL6 shown in FIG. 32 by a dotted line for easy understanding the positions of the coils. In a plan view, since the position of the external forms (the outer circumferences) of the coil CL5 and CL6 and a position of external forms (outer circumferences) of the coil CL7 and CL8 substantially coincide with each other, the dotted line shown in FIG. 34 can also be regarded as the position of the external form (the outer circumference) of the coils CL7 and CL8. Further, in FIG. 33, illustration of the above-described lead wirings HW2 and HW3 is omitted.

Since the coil CL5 (coil wiring CW5), the coil CL6 (coil wiring CW6), the coil CL7 (coil wiring CW7), the coil CL8 (coil wiring CW8), the pads PD5, PD6 and PD7, the lead wiring HW1, and the connection wiring HW4 shown in FIG. 32 to FIG. 36 have been described in the first embodiment, repetitive explanation thereof is omitted here. That is, since a difference of the structure shown in FIG. 32 to FIG. 36 from the structure shown in the above-described FIG. 5 to FIG. 10 lies in the formation of the wiring WR1, the wiring WR1 is described mainly below.

As shown in FIG. 32 to FIG. 36, the wiring WR1 is formed at a position overlapping with the coil CL6 in a plan view. The wiring WR1 is formed in a layer different from the coils CL5 and CL6 and also different from the coils CL7 and CL8. That is, the wiring WR1 extends in a layer different from both the coils CL5 and CL6 and the coils CL7 and CL8, and a portion of the wiring WR1 overlaps with the coil CL6 in a plan view.

The wiring WR1 is formed in a layer different from both the coils CL5 and CL6 and the coils CL7 and CL8, and therefore, the coils CL5, CL6, CL7 and CL8 can be formed without the interruption of the wiring WR1. Further, when the structure shown in the above-described FIG. 3 or the above-described FIG. 4 is adopted, the wiring WR1 is formed in a layer different from the coil CL1a and the coil CL2a, and can be formed of any one of the above-described wirings M1 to M5.

Since the primary coil is formed just below the secondary coil, when a wiring overlaps with the secondary coil in a plan view, note that the wiring also overlaps with the primary coil in a plan view. Specifically, since the coil CL7 is formed just below the coil CL5, when the wiring WR1 overlaps with the coil CL5 in a plan view, the wiring WR1 also overlaps with the coil CL7 in a plan view. Further, since the coil CL8 is formed just below the coil CL6, when the wiring WR1 overlaps with the coil CL6 in a plan view, the wiring WR1 also overlaps with the coil CL8 in a plan view. Therefore, the wiring WR1 overlapping with the coil CL6 in a plan view overlaps with the coil CL8 in a plan view necessarily.

Note that the position or the region overlapping with a coil in a plan view includes not only a position or a region overlapping with a region where a coil wiring configuring the coil winds in a plan view but also a position or a region overlapping with an inner region of a spiral of the coil in a plan view. Therefore, for example, the position or the region overlapping with the coil CL6 includes not only a position or a region overlapping with a region where the coil wiring CW6 winds in a plan view but also a position or a region overlapping with an inner region of a spiral of the coil CL6 (namely, a region where the pad PD6 is arranged) in a plan view.

As shown in FIG. 32 to FIG. 36, the wiring WR1 extends so as to overlap with the coil CL6 in a plan view, and has s lit (opening portion) SL at its position overlapping with the coil CL6 in a plan view. In the wiring WR1, at least one, preferably a plurality of slits SL are formed, and each slit SL is formed along an extension direction of the wiring WR1.

That is, the extension direction of the slit SL in the wiring WR1 is coincident with the extension direction of the wiring WR1. A size of the slit SL in a direction extending along the extension direction of the wiring WR1 is larger than a size thereof in a direction extending along a wiring width direction of the wiring WR1. The slit SL is an opening portion penetrating from an upper surface of the wiring WR1 to a lower surface thereof.

While a whole wiring width (width) of the wiring WR1 is W3, a width W4 of a wiring portion WR1a sectioned (divided) by the slits SL is made smaller than the wiring width (width) W3 by forming the slits SL (namely, W4<W3). That is, in the region overlapping with the coil CL6 in a plan view, a plurality of wiring portions WR1a with the width W4 extending in the extension direction of the wiring WR1 are arranged so as to interpose the slit SL therebetween. Since the wiring portions WR1a are connected to each other at a portion where the slit SL in the wiring WR1 is not formed, they are electrically connected to each other.

If the slit SL is not formed in the wiring WR1 as different from the present embodiment, the eddy current is easily generated by the influence of the magnetic flux generated by the coils CL6 and CL8 since the wiring WR1 overlaps with the coil CL6 in a plan view. When the eddy current is generated in the wiring WR1, there is a risk of interruption of normal current flow in the extension direction of the wiring WR1.

On the other hand, in the third embodiment, the wiring WR1 extending so as to overlap with the coil CL6 in a plan view has the slit SL at a position overlapping with the coil CL6 in a plan view. Therefore, the wiring WR1 is sectioned by the slit SL into the wiring portions WR1a each having the width W2 smaller than the whole wiring width W1. Individual eddy current is not generated over a plurality of wiring portions WR1a sandwiching the slit SL. Therefore, if the eddy current is generated, it must be generated within a single wiring portion WR1a. However, the width of the wiring portion WR1a is made small (narrow) by providing the slit SL in the wiring WR1, and therefore, even if the magnetic flux penetrating through the wiring portion WR1a is generated, the generation of the eddy current becomes difficult. That is, in the region overlapping the coil CL6 in a plan view in the wiring WR1 extending so as to overlap with the coil CL6 in a plan view, the wiring WR1 is sectioned (divided) by the slit SL into a plurality of wiring portions WR1a by providing the slit SL in the wring WR1, so that the generation of the eddy current is made difficult by the wiring portion WR1a with a reduced width.

Note that the case of the overlap of the wiring WR1 with the coil CL6 in a plan view has been illustrated and explained here. However, the same goes for a case that the wiring WR1 overlaps with the coil CL5 in a plan view and a case that the wiring WR1 overlaps with both the coil CL5 and CL6 in a plan view.

That is, when the wiring WR1 extends so as to overlap with the coil CL5 in a plan view, the wiring WR1 has the slit SL at a position (a region) overlapping with the coil CL5 in a plan view. Further, when the wiring WR1 extends so as to overlap with the coil CL6 in a plan view, the wiring WR1 has the slit SL at a position (a region) overlapping with the coil CL6 in a plan view. Further, when the wiring WR1 (corresponding to a wiring WR1 of FIG. 37 described later) extends so as to overlap with both the coil CL5 and the coil CL6 in a plan view, the wiring WR1 has the slit SL at a position (a region) overlapping with the coil CL5 in a plan view and at a position (a region) overlapping with the coil CL6 in a plan view. That is, in the semiconductor chip, when the wiring WR1 extending so as to overlap with one or both of the coils CL5 and CL6 in a plan view is provided, the slit SL is provided in the overlapping region of the wiring WR1 with the coils CL5 and CL6. Note that the coils CL7 and CL8 are arranged just below the coils CL5 and CL6, and therefore, a region (a position) overlapping with the coils CL5 and CL6 in a plan view and a region (a position) overlapping with the coils CL7 and CL8 in a plan view coincide with each other in the wiring WR1.

Therefore, in the semiconductor chip in the third embodiment, the slit SL is provided in a region (a position) overlapping with any one of the coils CL5, CL6, CL7 and CL8 in a plan view in an internal wiring extending so as to overlap with any one of the coils CL5, CL6, CL7 and CL8 in a plan view (however, an internal wiring in a layer different from the coils CL5, CL6, CL7 and CL8).

Therefore, in the third embodiment, even if the wiring WR1 extends so as to overlap with one or both of the coils CL5 and CL6 in a plan view and the wiring WR1 is influenced by the magnetic flux generated by the coils CL5, CL6, CL7 and CL8, the generation of the eddy current in the wiring WR1 can be suppressed or prevented by providing the slit SL at the position overlapping with the coils CL5 and CL6 in a plan view. In this manner, the interruption of the normal current flow in the wiring WR1 by the eddy current due to the magnetic flux generated by the coils CL5, CL6, CL7 and CL8 can be suppressed or prevented. Therefore, increase of a wiring resistance or others can be suppressed or prevented. Therefore, the performance of the semiconductor chip can be improved.

Further, in the semiconductor chip, when the magnetically-coupled coils CL5 and CL7 are provided. However, when the coils CL6 and CL8 are not provided, slits SL may be formed in a region (a position) overlapping with the coils CL5 and CL7 in a plan view in a wiring overlapping with the coils CL5 and CL7 in a plan view (although the wiring is a wiring in a layer different from the coils CL5 and CL7).

Further, as different from the third embodiment, it is considered that an entire width of the wiring WR1 (a width equivalent to the wiring width W3) is reduced instead of the formation of the slits SL in the region overlapping with the coils in a plan view. However, this case results in increase in a wiring resistance (an impedance) due to the reduction of the entire width.

On the other hand, in the third embodiment, by providing the slits SL in the wiring WR1 instead of reducing the entire width of the wiring WR1 (the width equivalent to the wiring width W3) in the region overlapping with the coils in a plan view, the widths W4 of the wiring portions WR1a sectioned by the slits SL are made smaller than the wiring width W3 of the whole wring WR1 (namely, W4<W3). Since the width W4 of the wiring portion WR1a sectioned by the slits SL is small, the eddy current is difficult to be generated even if a magnetic flux penetrates through the wiring portion WR1a. Further, even if the width W4 of the wiring portion WR1a sectioned by the slits SL is small, the plurality of wiring portions WR1a are provided, and the plurality of wiring portions WR1a are connected to each other in a region where the slits SL are not formed, and therefore, the increase of the wiring resistance (the impedance) can be suppressed even if the width W4 of the wiring portion WR1a is small.

Further, in the third embodiment, since an internal wiring can be arranged even in a region overlapping with the coil CL5, CL6, CL7 or CL8 in a plan view in the semiconductor chip, a layout of internal wirings is easily designed. Further, the semiconductor chip can be downsized (an area thereof can be reduced).

Further, in the third embodiment, in the wiring WR1 extending so as to overlap with the coils CL5 and CL6 in a plan view, the slits SL are formed in the region (the position) overlapping with the coils CL5 and CL6 in a plan view. This is because a portion which is most influenced by the magnetic fluxes (magnetic fields) generated by the coils CL5, CL6, CL7 and CL8 is the region overlapping with the coils CL5 and CL6 in a plan view. However, it is preferable that the slits SL are extended to a region influenced by the magnetic fluxes (magnetic fields) generated by the coils CL5, CL6, CL7 and CL8 in the wiring WR1 even in a region spaced away from the region overlapping with the coils CL5, CL6, CL7 and CL8 in a plan view. In this manner, generation of the eddy current in the wiring WR1 due to the magnetic fluxes (magnetic fields) generated by the coils CL5, CL6, CL7 and CL8 can be more properly suppressed or prevented. On the other hand, it is preferable that the slits SL are not formed in a region of the wiring WR1 which is not influenced by the magnetic fluxes (magnetic fields) generated by the coils CL5, CL6, CL7 and CL8, so that the wiring resistance (the impedance) of the wiring WR1 can be reduced. Therefore, it is preferable that the slits SL extend to the region of the wiring WR1 overlapping with the coil CL5, CL6, CL7 or CL8 in a plan view so that the slits SL terminate in a region slightly spaced away from the region overlapping with the coils CL5, CL6, CL7 or CL8 in a plan view. That is, in the wiring WR1, it is preferable that end portions of the slits SL (end portions thereof in an extension direction of the slits) are positioned in a region which does not overlap with the coil CL5, CL6, CL7 or CL8 in a plan view.

Further, the wiring WR1 is formed in a layer different from those of both the primary coil (the coils CL7 and CL8) and the secondary coil (the coils CL5 and CL6). This case can include: a case that the wiring WR1 is formed in a layer positioned between the primary coil (the coils CL7 and CL8) and the secondary coil (the coils CL5 and CL6), a case that the wiring WR1 is formed in a lower layer than those of both the primary coil (the coils CL7 and CL8) and the secondary coil (the coils CL5 and CL6), and a case that the wiring WR1 is formed in an upper layer than those of both the primary coil (the coils CL7 and CL8) and the secondary coil (the coils CL5 and CL6). Any one of the three cases can be adopted. However, among these cases, the case that the wiring WR1 is formed in a lower layer than those of both the primary coil (the coils CL7 and CL8) and the secondary coil (the coils CL5 and CL6) is most preferable.

In the case that the wiring WR1 is formed in an upper layer than those of both the primary coil (the coils CL7 and CL8) and the secondary coil (the coils CL5 and CL6), the secondary coil (the coils CL5 and CL6) is formed in a lower layer than the wiring WR1, and therefore, it becomes difficult to connect the secondary coil (the coils CL5 and CL6) to the pads (PD5, PD6 and PD7). Further, in the case that the wiring WR1 is formed in a layer positioned between the primary coil (the coils CL7 and CL8) and the secondary coil (the coils CL5 and CL6), a breakdown voltage between the secondary coil (the coils CL5 and CL6) and the wiring WR1 becomes smaller than a breakdown voltage between the primary coil (the coils CL7 and CL8) and the secondary coil (the coils CL5 and CL6), and therefore, there is concern about reduction of the breakdown voltage. On the other hand, the case that the wiring WR1 is formed in a lower layer than those of both the primary coil (the coils CL7 and CL8) and the secondary coil (the coils CL5 and CL6) makes it easy to connect the secondary coil (the coils CL5 and CL6) to the pads (PD5, PD6 and PD7), makes it easy to layout the wiring WR1, and is advantageous in such a point as improvement of the breakdown voltage.

Figure 37:
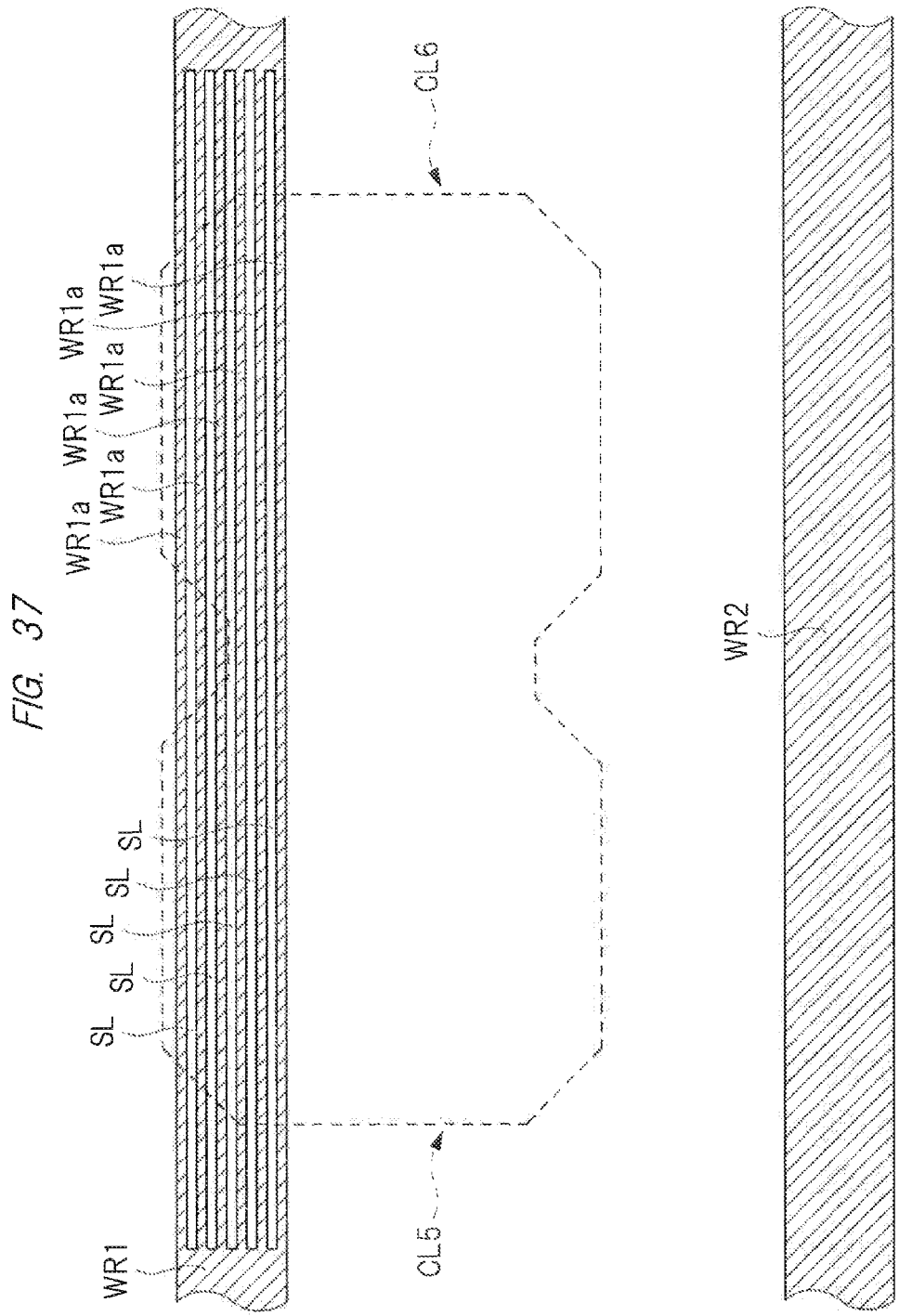
FIG. 37 is a plan view of a principal part showing another example of an internal wiring in the semiconductor chip of the third embodiment.

FIG. 37 is a plan view of a principal part showing another example of internal wirings in the semiconductor chip CP1, and it corresponds to the above-described FIG. 34. FIG. 37 shows a wiring WR1 and a wiring WR2 which are internal wirings arranged in the vicinity of a region where the coils CL5, CL6, CL7 and CL8 are formed, and shows a position of an external form (an outer circumference) of the coils CL5 and CL6 of the above-described FIG. 32 by a dotted line for easily understanding the position of the coils.

The wiring WR1 and WR2 are formed in a layer different from the coils CL5 and CL6 and also different from the coils CL7 and CL8. While the wiring WR1 extends so as to overlap with the coils CL5 and CL6 in a plan view, the wiring WR2 does not overlap with either of the coils CL5 and CL6 in a plan view.

In the third embodiment, in the semiconductor chip, a region overlapping with the coils CL5, CL6, CL7 or CL8 in a plan view is not set as an arrangement inhabitation region of the internal wirings. Therefore, in the semiconductor chip including the coils CL5, CL6, CL7 and CL8, the wiring WR1 extending so as to overlap with any one of the coil CL5, CL6, CL7 and CL8 in a plan view and the wiring WR2 which does not overlap with any one the coils CL5, CL6, CL7 and CL8 in a plan view are provided as shown in FIG. 37. For the wiring WR1 extending so as to overlap with any one of the coils CL5, CL6, CL7 and CL8 in a plan view among these wirings WR1 and WR2, the slits SL are provided at a position (a region) overlapping with the coil in a plan view. On the other hand, for the wiring WR2 which does not overlap with any one of the coils CL5, CL6, CL7 and CL8 in a plan view, such slits SL are not formed.

In this manner, for the wiring WR1 which is easy to be influenced by a magnetic flux (a magnetic field) generated by the coil due to overlapping with the coil, generation of the eddy current can be prevented by providing the slits. Meanwhile, for the wiring WR2 which is difficult to be influenced by a magnetic flux (a magnetic field) of the coil due to non-overlapping with the coil, a wiring resistance can be reduced by providing no slits SL. Further, by making no setting of the region overlapping with the coils CL5, CL6, CL7 or CL8 in a plan view as the arrangement inhabitation region of the internal wiring, the semiconductor chip can be downsized (an area thereof can be reduced). Therefore, both performance improvement of the semiconductor chip and downsizing (area reduction) of the semiconductor chip can be achieved.

A concept of the third embodiment can also be applied to the above-described lead wirings HW2 and HW3, which will be described with reference to FIG. 38.

Figure 38:
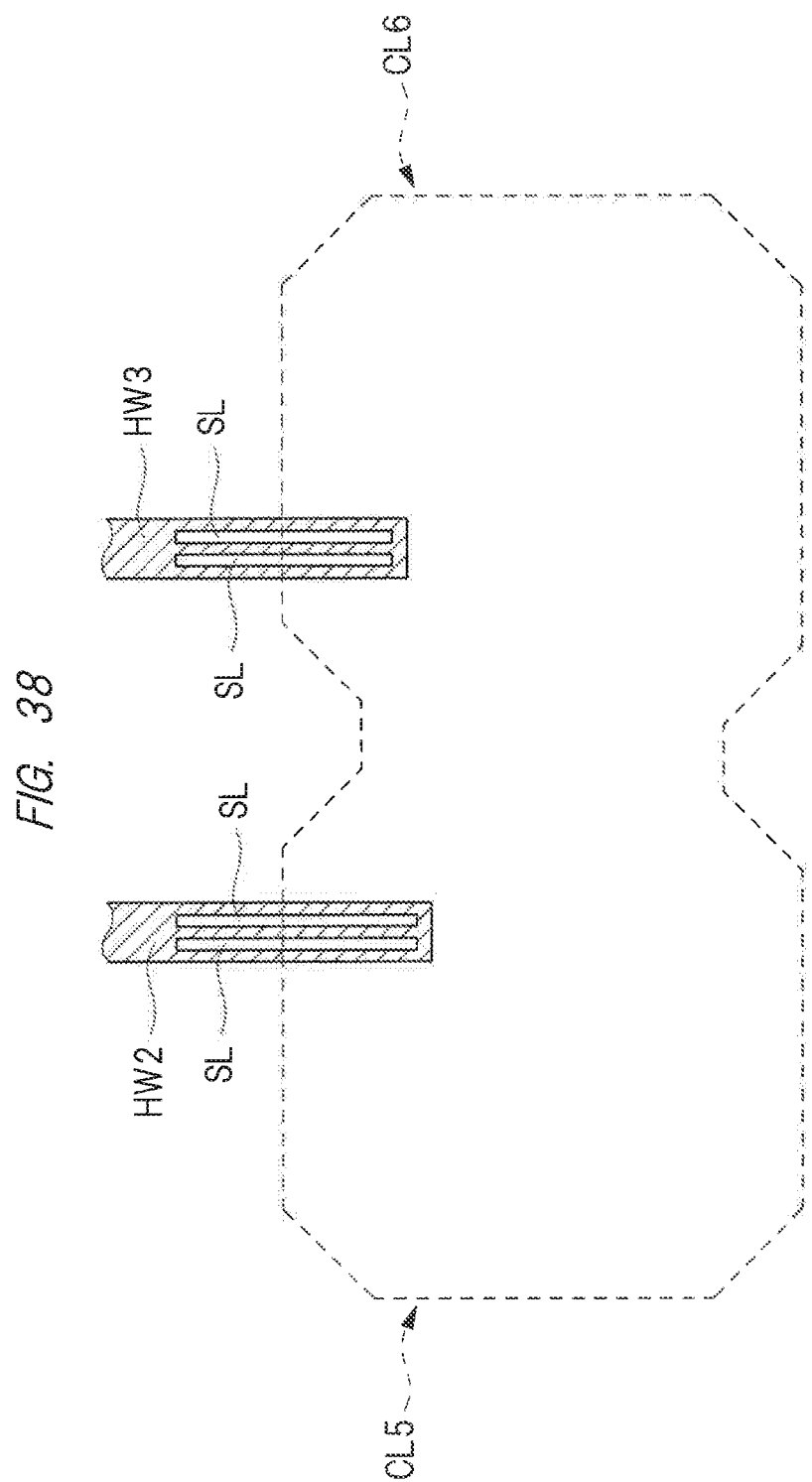
FIG. 38 is a plan view of a principal part of the semiconductor chip of the third embodiment.

FIG. 38 is a plan view of a principal part of a semiconductor chip, shows the lead wires HW2 and HW3, and shows a position of an external form (an outer circumference) of the coils CL5 and CL6 by a dotted line as similar to FIG. 34 and FIG. 37 for easily understanding the position of the coils.

The lead wiring HW2 is a wiring for leading an inner end portion (inside the spiral) of the coil CL7 to the outside further than the outer circumference of the coil CL7. Therefore, the lead wiring HW2 extends so as to overlap with the coil CL7 in a plan view and therefore extends so as to overlap with the coil CL5 in a plan view. Further, the lead wiring HW3 is a wiring for leading an inner end portion (inside the spiral) of the coil CL8 to the outside further than the outer circumference of the coil CL8. Therefore, the lead wiring HW3 extends so as to overlap with the coil CL8 in a plan view and therefore extends so as to overlap with the coil CL6 in a plan view. Therefore, the lead wiring HW2 is easily influenced by a magnetic flux (magnetic field) generated by the coils CL5 and CL7, while the lead wiring HW3 is easily influenced by a magnetic flux (magnetic field) generated by the coils CL6 and CL8.

Accordingly, in the third embodiment, slits SL are provided in the lead wirings HW2 and HW3 as shown in FIG. 38. That is, the slits SL are provided at a position overlapping with the coil CL5 in a plan view (therefore, a position overlapping with the coil CL8 in a plan view) in the wiring HW2, and the slits SL are provided at a position overlapping with the coil CL6 in a plan view (therefore, a position overlapping with the coil CL8 in a plan view) in the wiring HW3. In this manner, even if magnetic fluxes generated by the coils CL5, CL6, CL7 and CL8 influence the lead wirings HW2 and HW3, generation of the eddy current in the lead wirings HW2 and HW3 can be suppressed or prevented. At least one slit SL, preferably a plurality of slits SL can be formed in each of the lead wiring HW2 and HW3, and each slit SL can be formed along the extending direction of each of the lead wiring HW2 and HW3.

Further, the third embodiment can be applied to any one of the coils explained above. That is, the third embodiment can be applied to all of the case shown in FIG. 5 to FIG. 10, the case shown in FIG. 12 and FIG. 13, the case shown in FIG. 14 and FIG. 15, the case shown in FIG. 21, the case shown in FIG. 22, the case shown in FIG. 23, the case shown in FIG. 24, the case shown in FIG. 25, the case shown in FIG. 26, the case shown in FIG. 27, the case shown in FIG. 28, the case shown in FIG. 29, the case shown in FIG. 30, the case shown in FIG. 31, the case shown in FIG. 32 to FIG. 35, the case shown in FIG. 37, the case shown in FIG. 38 and others. That is, in each of these cases, while a wiring extending so as to overlap with a coil in a plan view can be provided, a slit is provided at a position overlapping with the coil in a plan view in the wiring. As one example, the case that a technical concept of the third embodiment has been applied to the first study example shown in the above-described FIG. 12 and FIG. 13 will be described with reference to FIG. 39 to FIG. 41.

Figure 39:
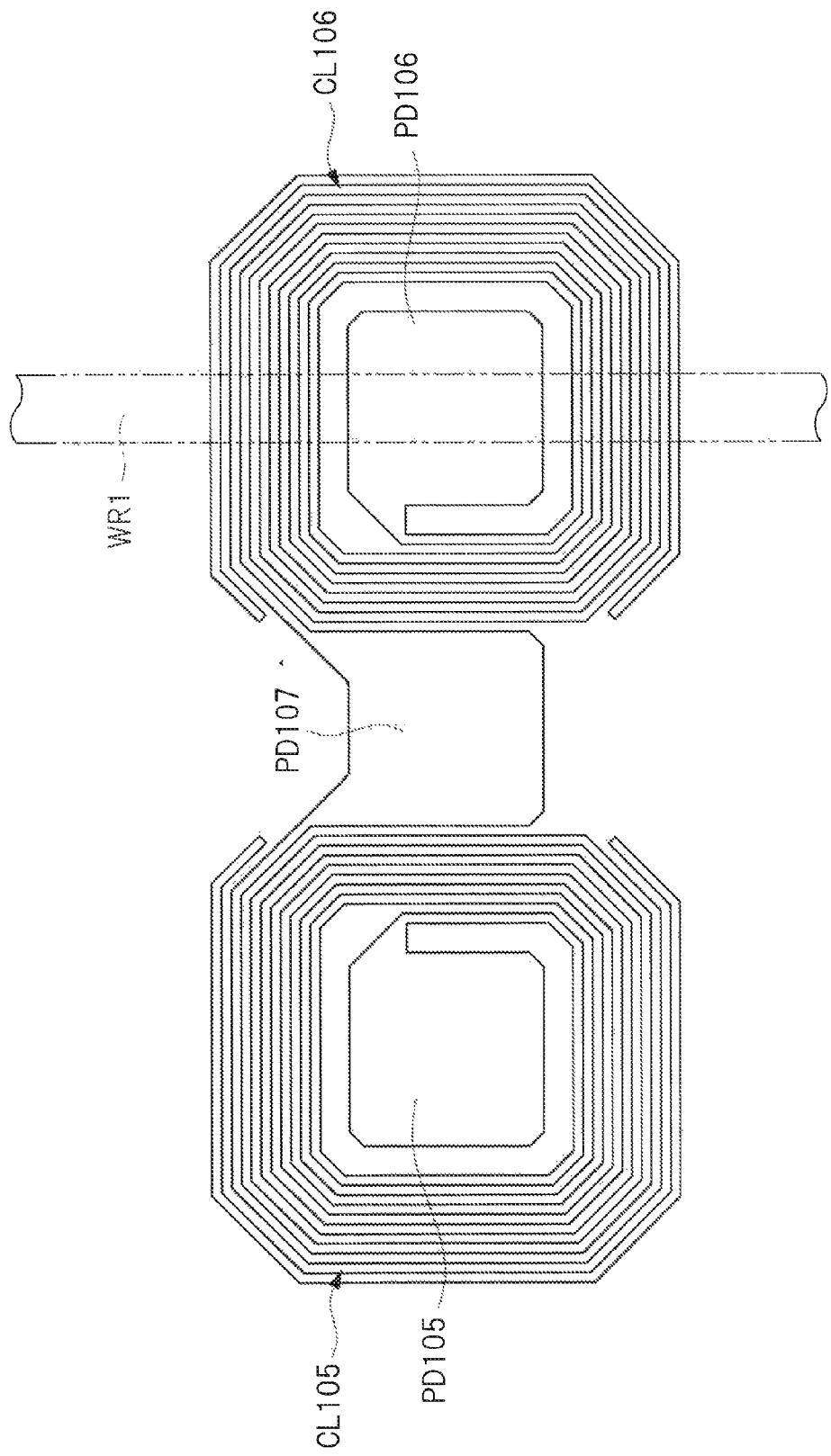
FIG. 39 is a plan view in a case of application of a technical concept of the third embodiment to the first study example.
Figure 40:
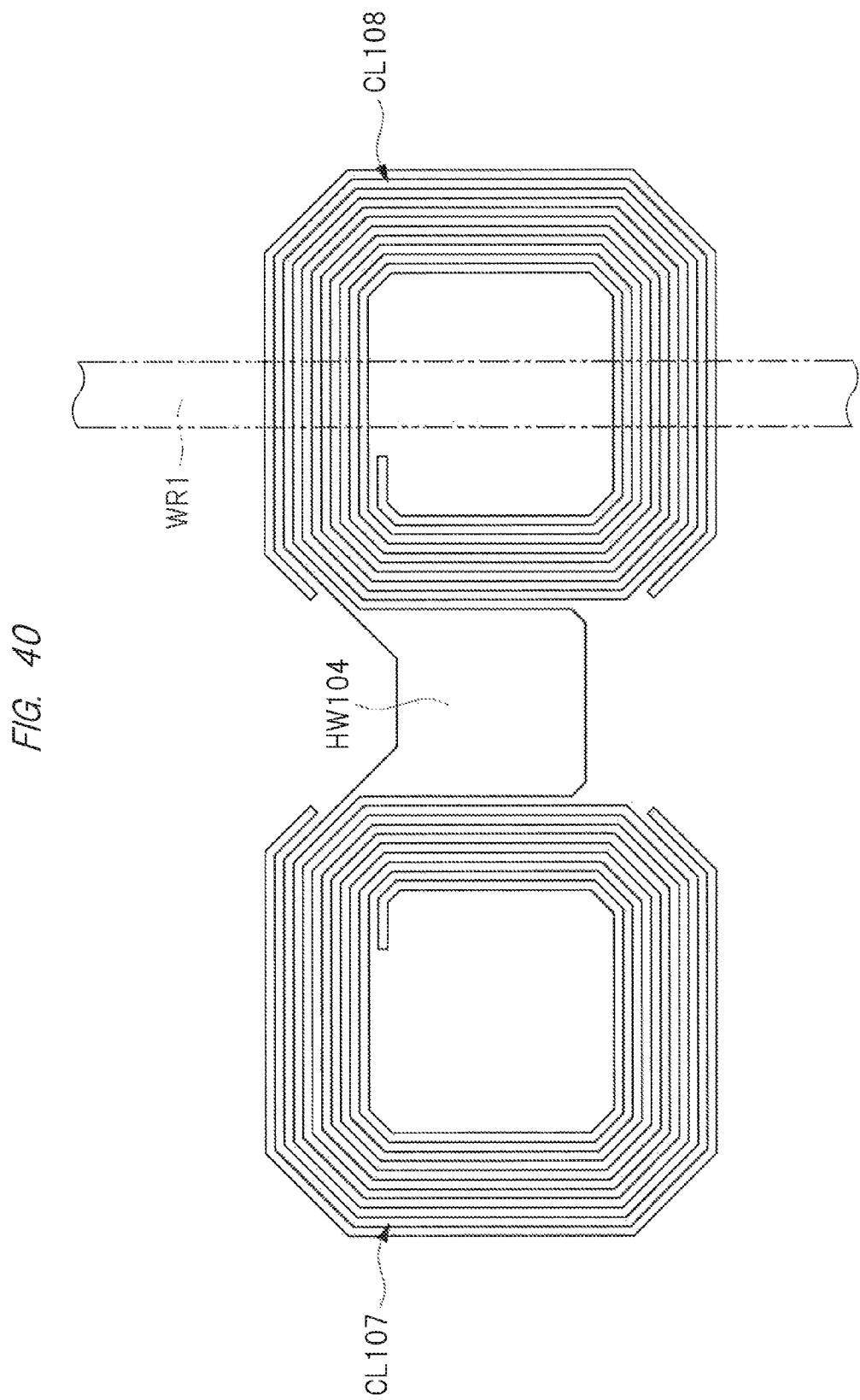
FIG. 40 is a plan view in a case of application of the technical concept of the third embodiment to the first study example.
Figure 41:
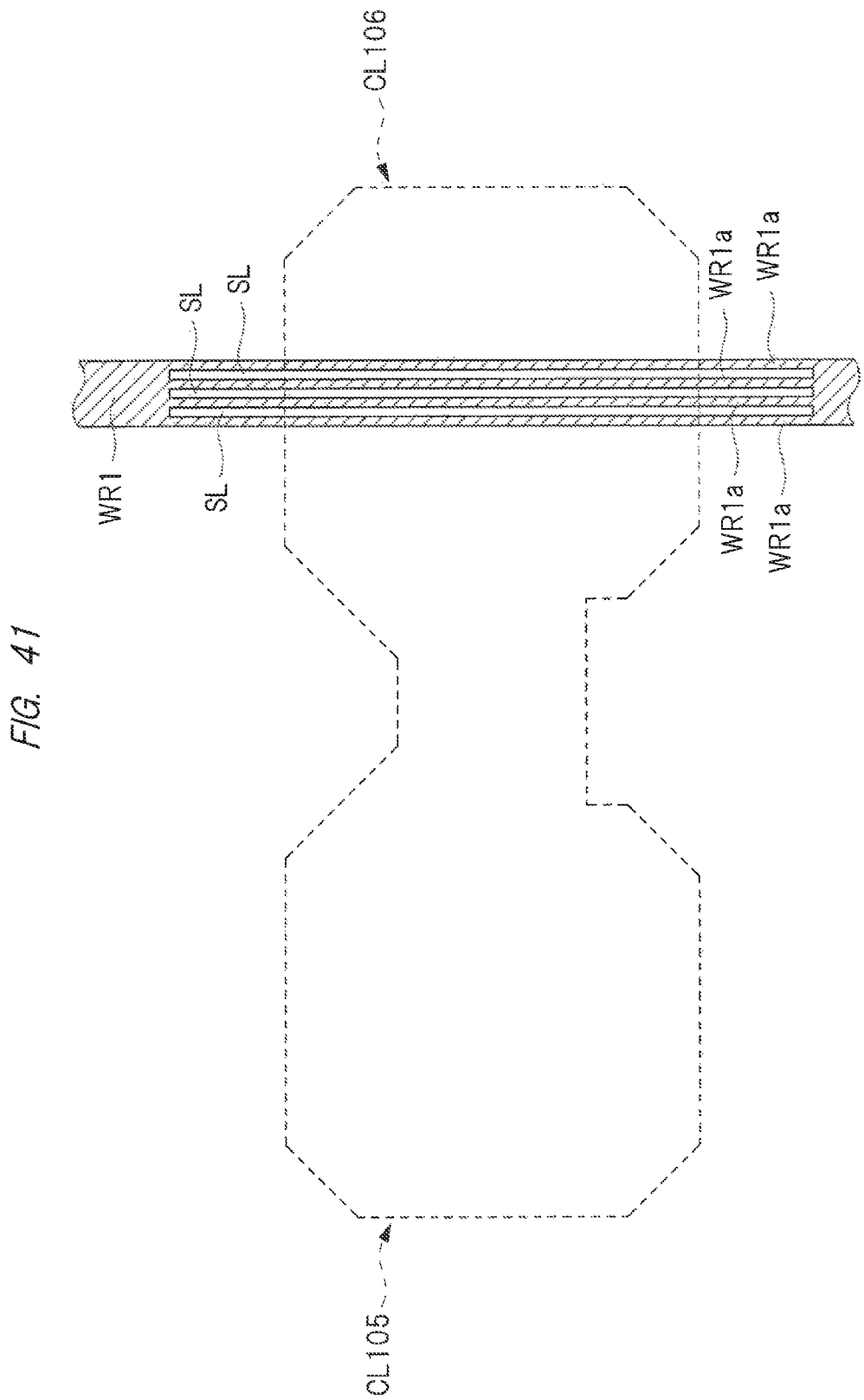
FIG. 41 is a plan view in a case of application of the technical concept of the third embodiment to the first study example.

FIG. 39 to FIG. 41 are plan views of the case that the technical concept of the third embodiment has been applied to the first study example shown in FIG. 12 and FIG. 13. FIG. 39 of these drawings corresponds to a drawing showing the position of the wiring WR1 in a pattern similar to that shown in the above-described FIG. 12 by a two-dot chain line, and FIG. 40 corresponds to a drawing showing the position of the wiring WR1 in a pattern similar to that shown in the above-described FIG. 13 by a two-dot chain line. Further, FIG. 41 shows the wiring WR1, and FIG. 41 shows a position of an external form (an outer circumference) of the coils CL105 and CL106 shown in the above-described FIG. 12 or FIG. 39 by a dotted line for easily understanding the position of the coils.

Since the coils CL105, CL106, CL107 and CL108, the pads PD105, PD106 and PD107, and the connection wiring HW104 shown in FIGS. 39 to 41 have been described with reference to the above-described FIG. 12 and FIG. 13, repetitive explanation thereof is omitted here. That is, the structures shown in FIG. 39 to FIG. 41 are different from the structures shown in the above-described FIG. 12 and FIG. 13 in that the wiring WR1 is formed.

By applying the third embodiment to the first study example shown in FIG. 12 and FIG. 13 and providing the wiring WR1 extending so as to overlap with either one or both of the coils CL105 and CL106 in a plan view, the layout of the internal wirings is easily designed, and the semiconductor chip can be downsized (an area thereof can be reduced). By providing the slits SL at a position overlapping with the coils CL105 and CL106 in a plan view in the wiring WR1 extending so as to overlap with either one or both of the coils CL105 and CL106 in a plan view, the generation of the eddy current in the wiring WR1 can be suppressed or prevented even if magnetic fluxes generated by the coils CL105, CL106, CL107 and CL108 influence the wiring WR1. In this manner, failure due to the eddy current can be prevented, and the performance of the semiconductor device can be improved.

In the foregoing, the invention made by the present inventors has been concretely described based on the embodiments. However, it is needless to say that the present invention is not limited to the foregoing embodiments and various modifications and alterations can be made within the scope of the present invention.

EXPLANATION OF REFERENCE SYMBOL

BW, BW8, BW9: bonding wire
CC: control circuit
CL1a, CL1b, CL2a, CL2b: coil
CL5, CL5c, CL5d, CL6, CL6c, CL6d, CL7, CL8: coil
CL105, CL106, CL107, CL108: coil
CL205, CL206, CL305, CL306: coil
CP1, CP2: semiconductor chip
CW5, CW6, CW7, CW8: coil wiring
DB: die bonding material
DP1, DP2: die pad
DR: driving circuit
DW1, DW2, DW3, DW4: dummy wiring
GE1, GE2: gate electrode
GI: gate insulation film
HW1, HW1c, HW1d, HW1e, HW2, HW3: drawn wiring
HW4, HW104: connection wiring
HW102, HW103: lead wiring
IL: interlayer insulation film
L1: length
L2, L3, L201, L301: distance
LD: lead
LOD: load
M1, M2, M3, M4, M5: wiring
MR: sealing resin portion
NR: n-type semiconductor region NR
NW: n-type well
OP: opening portion
PA1, PA2: protection film
PD, PD5, PD5a, PD5b, PD5c, PD5d: pad
PD6, PD6a, PD6b, PD6c, PD6d: pad
PD7, PD7a, PD7b, PD7c, PD7d, PD7e: pad
PD8, PD9, PD105, PD106, PD107: pad
PD205, PD206, PD305, PD306: pad pattern
PKG: semiconductor package
PR: p-type semiconductor region
PW: p-type well
RS: resin film
RX1, RX2: reception circuit
SB1, SB2: semiconductor substrate
SC1: corner portion
SD1: n-type semiconductor region
SD2: p-type semiconductor region
SG1, SG2, SG3, SG4: signal
SH1, SH2: side
SL: slit
TR1, TR2: transformer
TX1, TX2: transmission circuit
UM: underlying metal film
V1: plug
V2, V3, V4, V5: via portion
W1, W3: wiring width
W2, W4: width
WR1, WR2: wiring
WR1a: wiring portion

The invention claimed is:

1. A semiconductor device comprising:
a semiconductor substrate;
a first coil, a second coil, a third coil, a fourth coil, a first pad, a second pad, and a third pad formed on the semiconductor substrate through an insulation film; and
a lead wiring for connecting the first coil and the third coil to the third pad, the lead wiring extending from a portion between the first coil and the third coil to the third pad, and a width of the lead wiring being greater than a wiring width of the first coil and the third coil,
wherein the first coil and the third coil are electrically connected in series between the first pad and the second pad,
the third pad is electrically connected between the first coil and the third coil,
the second coil and the fourth coil are electrically connected in series,
the first coil is arranged above the second coil,
the third coil is arranged above the fourth coil,
the first coil and the second coil are not connected by a conductor but are magnetically coupled to each other,
the third coil and the fourth coil are not connected by a conductor but are magnetically coupled to each other, and,
when a current is flowed in the second coil and the fourth coil connected in series, directions of induction currents flowing in the first coil and the third coil are opposed to each other in the first coil and the third coil.

2. The semiconductor device according to claim 1,
wherein, when a current is flowed in the second coil and the fourth coil connected in series, directions of the current flowing in the second coil and the fourth coil are opposed to each other.

3. The semiconductor device according to claim 2,
wherein the first pad is arranged inside the first coil, and the second pad is arranged inside the third coil.

4. The semiconductor device according to claim 3,
wherein the third pad is arranged in a region except for a portion between the first coil and the third coil.

5. The semiconductor device according to claim 4,
wherein a distance between the first coil and the third coil is smaller than a side of the third pad.

6. The semiconductor device according to claim 5,
wherein a winding direction of the first coil and a winding direction of the third coil are the same as each other.

7. The semiconductor device according to claim 6,
wherein a winding direction of the second coil and a winding direction of the fourth coil are the same as each other.

8. The semiconductor device according to claim 1,
wherein the first coil and the third coil are formed in the same layer as each other, and
the second coil and the fourth coil are formed in the same layer as each other.

9. The semiconductor device according to claim 1,
wherein a first wiring extending so as to overlap with either one or both of the first coil and the third coil in a plan view is formed in a layer different from the first coil, the second coil, the third coil and the fourth coil, and the first wiring has a slit at a position overlapping with either one or both of the first coil and the third coil in a plan view.

10. The semiconductor device according to claim 9,
wherein the first wiring is formed in a lower layer than the second coil and the fourth coil.

11. A semiconductor device including a first semiconductor chip and a second semiconductor chip,
wherein the first semiconductor chip comprises:
a first coil, a second coil, a third coil, a fourth coil, a first pad, a second pad, and a third pad; and
a lead wiring for connecting the first coil and the third coil to the third pad, the lead wiring extending from a portion between the first coil and the third coil to the third pad, and a width of the lead wiring being greater than a wiring width of the first coil and the third coil,
the second semiconductor chip has a plurality of fourth pads,
the first coil and the third coil are electrically connected in series between the first pad and the second pad,
the third pad is electrically connected between the first coil and the third coil,
the second coil and the fourth coil are electrically connected in series,
within the first semiconductor chip, the first coil is arranged above the second coil, and the third coil is arranged above the fourth coil,
the first coil and the second coil are not connected by a conductor but are magnetically coupled to each other,
the third coil and the fourth coil are not connected by a conductor but are magnetically coupled to each other,
the first pad, the second pad and the third pad of the first semiconductor chip are electrically connected to the plurality of fourth pads of the second semiconductor chip through conductive connection members, respectively,
when a current is flowed in the second coil and the fourth coil connected in series, directions of induction currents flowing in the first coil and the third coil are opposed to each other in the first coil and the third coil.

12. The semiconductor device according to claim 11,
wherein the first semiconductor chip has a transmission circuit,
the second semiconductor chip has a reception circuit,
a signal transmitted form the transmission circuit of the first semiconductor chip is transmitted to the reception circuit of the second semiconductor chip through the first coil, the second coil, the third coil and the fourth coil.

13. The semiconductor device according to claim 12,
wherein, when a current is flowed in the second coil and the fourth coil connected in series, directions of currents flowing in the second coil and the fourth coil are opposed to each other.

14. The semiconductor device according to claim 13,
wherein the first pad is arranged inside the first coil, and the second pad is arranged inside the third coil.

15. The semiconductor device according to claim 14,
wherein the third pad is arranged in a region except for a portion between the first coil and the third coil.

16. A semiconductor device comprising:
a semiconductor substrate; and
a first coil, a second coil, a third coil and a pad formed on the semiconductor substrate through an insulation layer; and
a lead wiring for connecting the first coil and the third coil to the pad, the lead wiring extending from a portion between the first coil and the third coil to the pad, and a width of the lead wiring being greater than a wiring width of the first coil and the third coil,
wherein the first coil is arranged above the second coil,
the first coil and the second coil are not connected by a conductor but are magnetically coupled to each other, and
a first wiring extending so as to overlap with the first coil in a plan view is formed in a layer different from the first coil and the second coil, and
the first wiring has a slit at a position overlapping with the first coil in a plan view.

17. The semiconductor device according to claim 16,
wherein a second wiring extending so as not to overlap with the first coil in a plan view is formed in a layer different from the first coil and the second coil, and
a slit is not formed in the second wiring.

18. The semiconductor device according to claim 16,
wherein the first wiring is formed in a lower layer than the second coil.

19. The semiconductor device according to claim 1,
wherein the first coil and the third coil are adjacent in a first direction, and the lead wiring extends in a second direction perpendicular to the first direction.

20. The semiconductor device according to claim 1,
wherein the first coil, the third coil, the lead wiring and the third pad comprise the same wiring layer.

21. The semiconductor device according to claim 1, further comprising:
a first insulation film formed on the semiconductor substrate, the second and fourth coils being formed on a surface of the first insulation film;
a protection film formed on the second and fourth coils; and
a second insulation film formed on the protection film, the first coil, the third coil, the lead wiring and the third pad being formed on a surface of the second insulation film.

* * * * *